United States Patent
Choi et al.

(10) Patent No.: US 12,550,372 B2
(45) Date of Patent: Feb. 10, 2026

(54) SEMICONDUCTOR DEVICE INCLUDING SEMICONDUCTOR PATTERNS HAVING VARIED THICKNESSES

(71) Applicant: SAMSUNG ELECTRONICS CO., LTD., Suwon-si (KR)

(72) Inventors: Doyoung Choi, Hwaseong-si (KR); Daewon Ha, Seoul (KR); Kyungho Kim, Suwon-si (KR); Mingyu Kim, Hwaseong-si (KR); Kyuman Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 960 days.

(21) Appl. No.: 17/694,011

(22) Filed: Mar. 14, 2022

(65) Prior Publication Data

US 2023/0039722 A1   Feb. 9, 2023

(30) Foreign Application Priority Data

Aug. 5, 2021   (KR) .......................... 10-2021-0103295

(51) Int. Cl.
  *H10D 30/67*   (2025.01)
(52) U.S. Cl.
  CPC ..... *H10D 30/6735* (2025.01); *H10D 30/6713* (2025.01); *H10D 30/6757* (2025.01)
(58) Field of Classification Search
  CPC ............. H10D 62/121; H10D 84/0181; H10D 30/6735
  See application file for complete search history.

(56) References Cited

U.S. PATENT DOCUMENTS

| | | | |
|---|---|---|---|
| 10,002,939 B1 | 6/2018 | Cheng et al. | |
| 10,141,403 B1 | 11/2018 | Cheng et al. | |
| 10,515,859 B2 | 12/2019 | Doris et al. | |
| 10,615,258 B2 | 4/2020 | Miao et al. | |
| 10,700,064 B1* | 6/2020 | Zhang | B82Y 10/00 |
| 10,832,960 B2 | 11/2020 | Zhang et al. | |

(Continued)

FOREIGN PATENT DOCUMENTS

| KR | 10-2019-0140564 A | 12/2019 |
|---|---|---|
| KR | 10-2020-0084532 A | 7/2020 |

(Continued)

*Primary Examiner* — William B Partridge
*Assistant Examiner* — Mehek Ahmed
(74) *Attorney, Agent, or Firm* — Sughrue Mion, PLLC

(57) ABSTRACT

A semiconductor device includes: a substrate including first and second regions, first and second active patterns in the first and second regions, respectively; first source/drain patterns and a first channel pattern including first semiconductor patterns; second source/drain patterns and a second channel pattern including second semiconductor patterns; first and second gate electrodes on the first and second channel patterns, respectively; and a first gate dielectric layer and a second gate dielectric layer. The first gate dielectric layer includes a first interface layer between the first channel pattern and the first gate electrode, and a first high-k dielectric layer. The second gate dielectric layer includes a second interface layer and a second high-k dielectric layer between the second channel pattern and the second gate electrode. A thickness of the first high-k dielectric layer is greater than that of the second high-k dielectric layer.

20 Claims, 61 Drawing Sheets

(56) References Cited

U.S. PATENT DOCUMENTS

| | | | |
|---|---|---|---|
| 11,282,939 B2 | 3/2022 | Lee et al. | |
| 12,170,231 B2 * | 12/2024 | Hsu | H10D 84/0167 |
| 2021/0083054 A1 | 3/2021 | Liaw | |
| 2021/0083055 A1 | 3/2021 | Liaw | |
| 2021/0183857 A1 | 6/2021 | Hafez et al. | |
| 2022/0052203 A1 * | 2/2022 | More | H01L 21/26513 |
| 2022/0310456 A1 * | 9/2022 | Hall | H10D 30/6735 |

FOREIGN PATENT DOCUMENTS

| | | |
|---|---|---|
| KR | 10-2021-0050027 A | 5/2021 |
| KR | 10-2021-0075840 A | 6/2021 |

* cited by examiner

SEMICONDUCTOR DEVICE INCLUDING SEMICONDUCTOR PATTERNS HAVING VARIED THICKNESSES

CROSS-REFERENCE TO RELATED APPLICATION

This application is based on and claims priority from Korean Patent Application No. 10-2021-0103295 filed on Aug. 5, 2021 in the Korean Intellectual Property Office, the disclosure of which is incorporated herein in its entirety by reference.

BACKGROUND

The disclosure relate to a semiconductor device, and more particularly, to a semiconductor device including a field effect transistor.

A semiconductor device includes an integrated circuit including metal oxide semiconductor field effect transistors (MOSFETs). As demands for semiconductor devices having higher device density increase, sizes of the MOSFETs have been scaled down. The scale down of MOSFETs may deteriorate operating characteristics of the semiconductor device. Accordingly, various research has been conducted to develop methods of manufacturing semiconductor devices having superior performance while overcoming issues associated with the higher density of the semiconductor devices.

SUMMARY

Various embodiments provide a semiconductor device with improved electrical properties and increased reliability.

According to embodiments, a semiconductor device may include: a substrate that includes a first region and a second region; a first active pattern in the first region, and a second active pattern in the second region; first source/drain patterns on the first active pattern, and a first channel pattern between the first source/drain patterns, the first channel pattern including a plurality of first semiconductor patterns that are stacked and spaced apart from each other; second source/drain patterns on the second active pattern, and a second channel pattern between the second source/drain patterns, the second channel pattern including a plurality of second semiconductor patterns that are stacked and spaced apart from each other; a first gate electrode on the first channel pattern, and a second gate electrode on the second channel pattern; and a first gate dielectric layer between the first channel pattern and the first gate electrode, and a second gate dielectric layer between the second channel pattern and the second gate electrode, wherein the first gate dielectric layer includes a first interface layer and a first high-k dielectric layer, wherein the second gate dielectric layer includes a second interface layer and a second high-k dielectric layer, and wherein a thickness of the first high-k dielectric layer is greater than a thickness of the second high-k dielectric layer. A thickness of each of the first semiconductor patterns may be less than a thickness of each of the second semiconductor patterns.

According to embodiments, a semiconductor device may include: a substrate that includes a first region and a second region; a first active pattern in the first region, and a second active pattern in the second region; first source/drain patterns on the first active pattern, and a first channel pattern between the first source/drain patterns, the first channel pattern including a plurality of first semiconductor patterns that are stacked and spaced apart from each other; a pair of second source/drain patterns on the second active pattern, and a second channel pattern between the pair of second source/drain patterns, the second channel pattern including a plurality of second semiconductor patterns that are stacked and spaced apart from each other; and a first gate electrode on the first channel pattern, and a second gate electrode on the second channel pattern. A width of the first gate electrode may be greater than a width of the second gate electrode in a channel length direction. A thickness of each of the first semiconductor patterns may be less than a thickness of each of the second semiconductor patterns. The first gate electrode may include a plurality of first parts between the first semiconductor patterns that are vertically adjacent to each other. The second gate electrode may include a plurality of second parts between the second semiconductor patterns that are vertically adjacent to each other. A ratio of a thickness of each of the second parts to a thickness of each of the first parts may be in a range of about 0.9 to about 1.1.

According to embodiments, a semiconductor device may include: a substrate that includes a first region and a second region; a first active pattern in the first region, and a second active pattern in the second region; first source/drain patterns on the first active pattern, and a first channel pattern between the first source/drain patterns, the first channel pattern including a plurality of first semiconductor patterns that are stacked and spaced apart from each other; second source/drain patterns on the second active pattern, and a second channel pattern between the second source/drain patterns, the second channel pattern including a plurality of second semiconductor patterns that are stacked and spaced apart from each other; a first gate electrode on the first channel pattern, and a second gate electrode on the second channel pattern, a width of the first gate electrode being greater than a width of the second gate electrode in a channel length direction; and a first gate dielectric layer between the first channel pattern and the first gate electrode, and a second gate dielectric layer between the second channel pattern and the second gate electrode. The first gate dielectric layer may surround each of the first semiconductor patterns of the first channel pattern, and the second gate dielectric layer may surround each of the second semiconductor patterns of the second channel pattern. A plurality of gate spacers on opposite sides of each of the first and second gate electrodes; a gate capping pattern on each of the first and second gate electrodes; an active contact coupled to one of the first and second source/drain patterns; a gate contact coupled to one of the first and second gate electrodes; a first metal layer on the active contact and the gate contact, the first metal layer including a plurality of first lines that are electrically connected to the active contact and the gate contact; and a second metal layer on the first metal layer. The first gate dielectric layer may include a first interface layer and a first high-k dielectric layer. The second gate dielectric layer may include a second interface layer and a second high-k dielectric layer. A thickness of the first high-k dielectric layer may be greater than a thickness of the second high-k dielectric layer, and a thickness of each of the first semiconductor patterns may be less than a thickness of each of the second semiconductor patterns.

DETAILED DESCRIPTION OF EMBODIMENTS

All of the embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
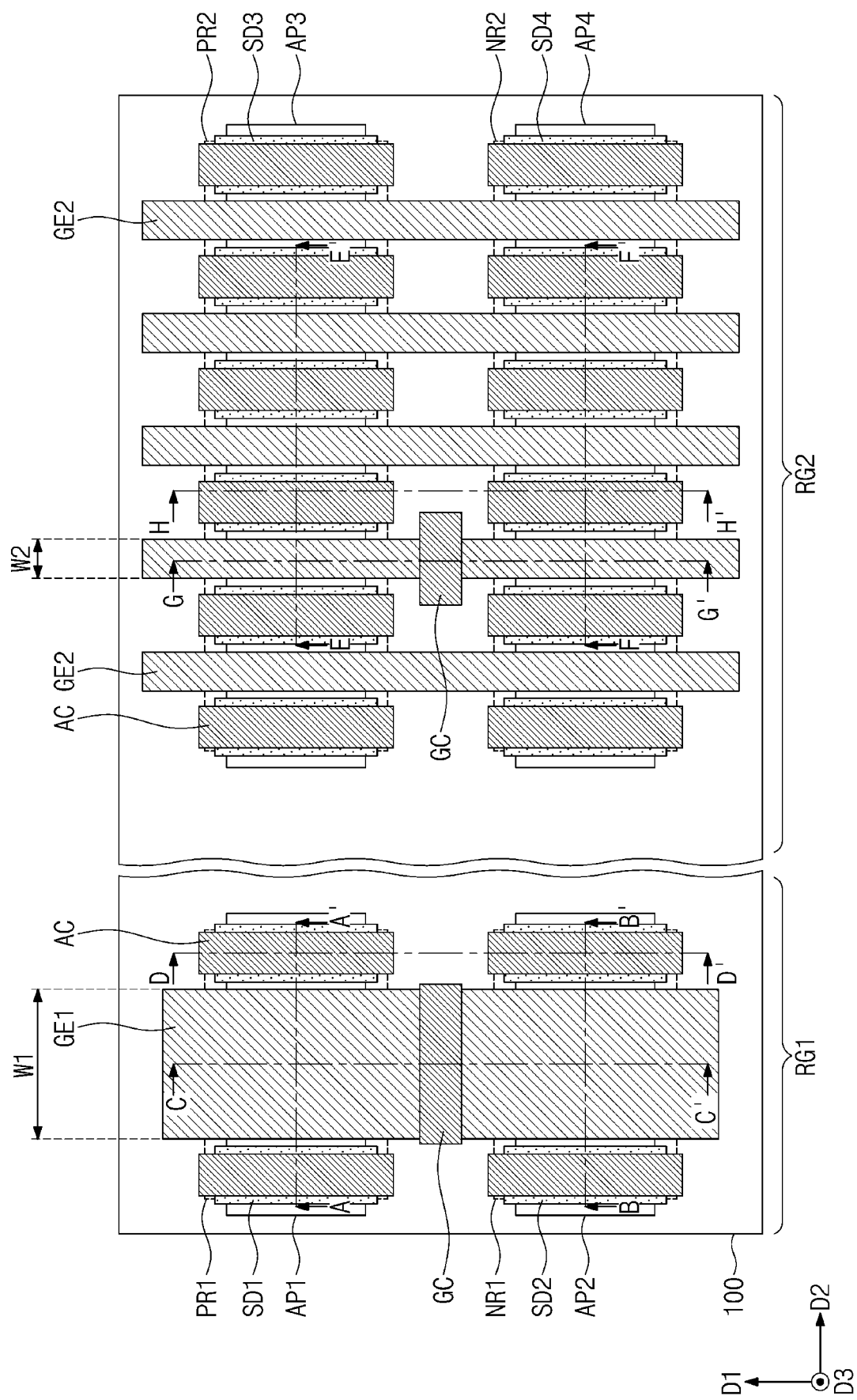
FIG. 1 illustrates a plan view showing a semiconductor device according to embodiments.

FIG. 1 illustrates a plan view showing a semiconductor device, according to embodiments. FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.

Referring to FIG. 1, a substrate 100 may be provided which includes a first region RG1 and a second region RG2. The substrate 100 may be a compound semiconductor substrate or a semiconductor substrate including silicon, germanium, or silicon-germanium. For example, the substrate 100 may be a silicon substrate. Each of the first and second regions RG1 and RG2 may be a cell region for a standard cell that includes a logic circuit. Alternatively, the first region RG1 may be a peripheral area for transistors that constitute a process core or an I/O terminal. For example, the first region RG1 may be a core/peripheral area included in a logic die. The first region RG1 may include a long gate transistor (or, long channel transistor) whose gate length (or channel length) is relatively large. A transistor on the first region RG1 may operate at higher powers than those of a transistor on the second region RG2. A transistor on the first region RG1 may be referred to as an extra gate (EG) device. A transistor on the second region RG2 may be referred to as a single gate (SG) device. A gate insulating layer of the EG device may have a thicker or an extra oxide layer to better prevent gate oxide breakdown than the SG device, according to embodiments. A transistor on the first region RG1 will be first discussed below in detail with reference to FIGS. 1 and 2A to 2D.

The first region RG1 may include a first PMOS region PR1 and a first NMOS region NR1. The first PMOS region PR1 and the first NMOS region NR1 may be defined by a trench TR formed on an upper portion of the substrate 100. For example, the trench TR of FIGS. 2C and 2D may be positioned between the first PMOS region PR1 and the first NMOS region NR1. The first PMOS region PR1 and the first NMOS region NR1 may be spaced apart from each other in a first direction D1 across the trench TR.

Figure 2A:
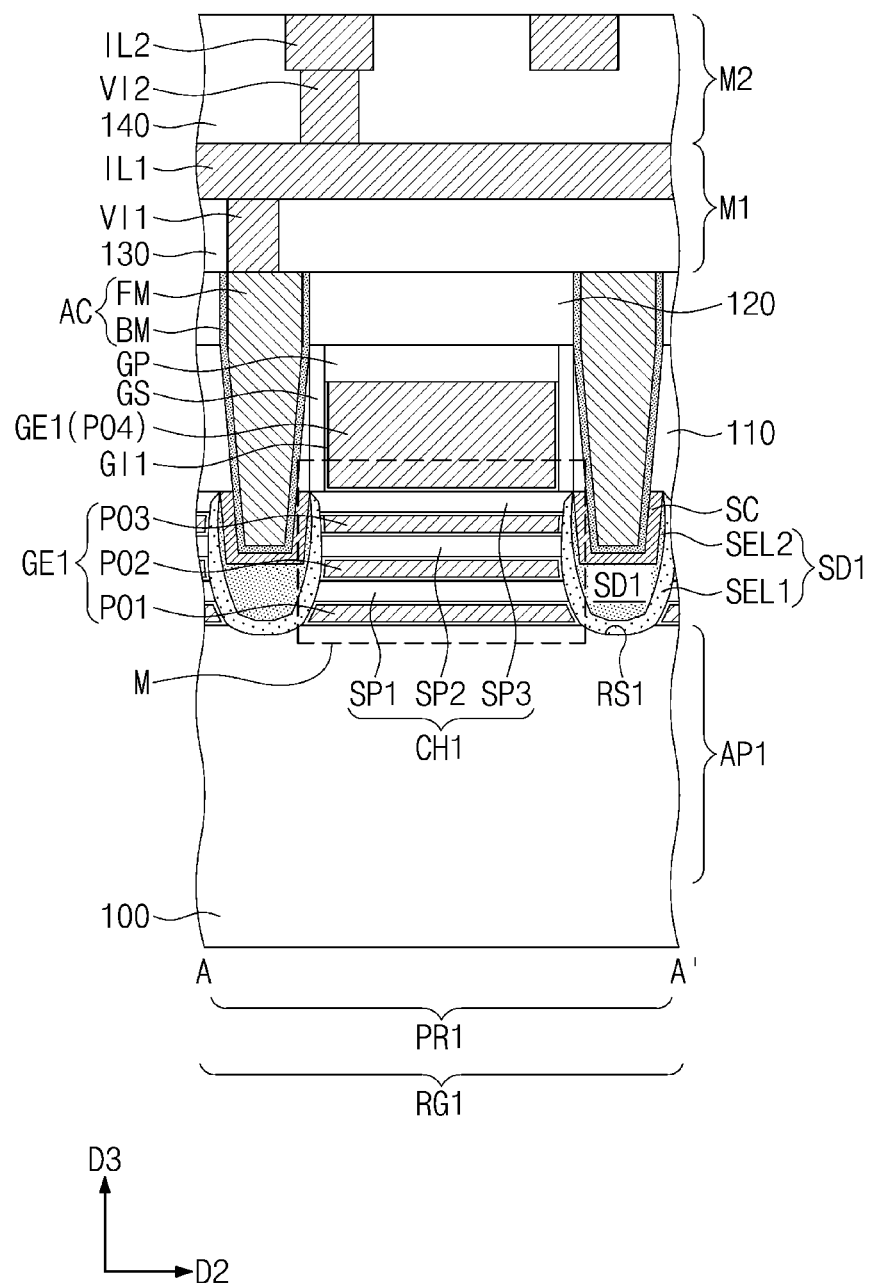
FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.
Figure 2B:
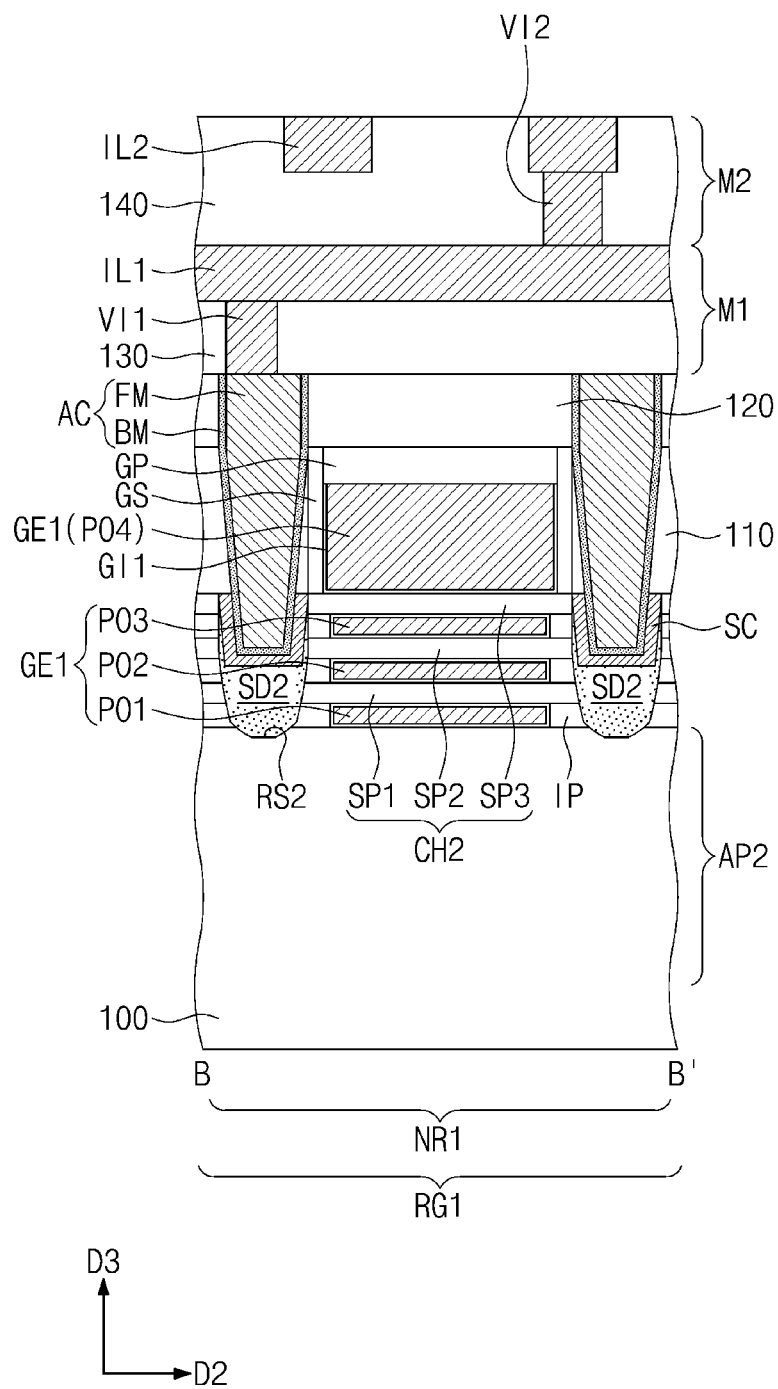
Figure 2C:
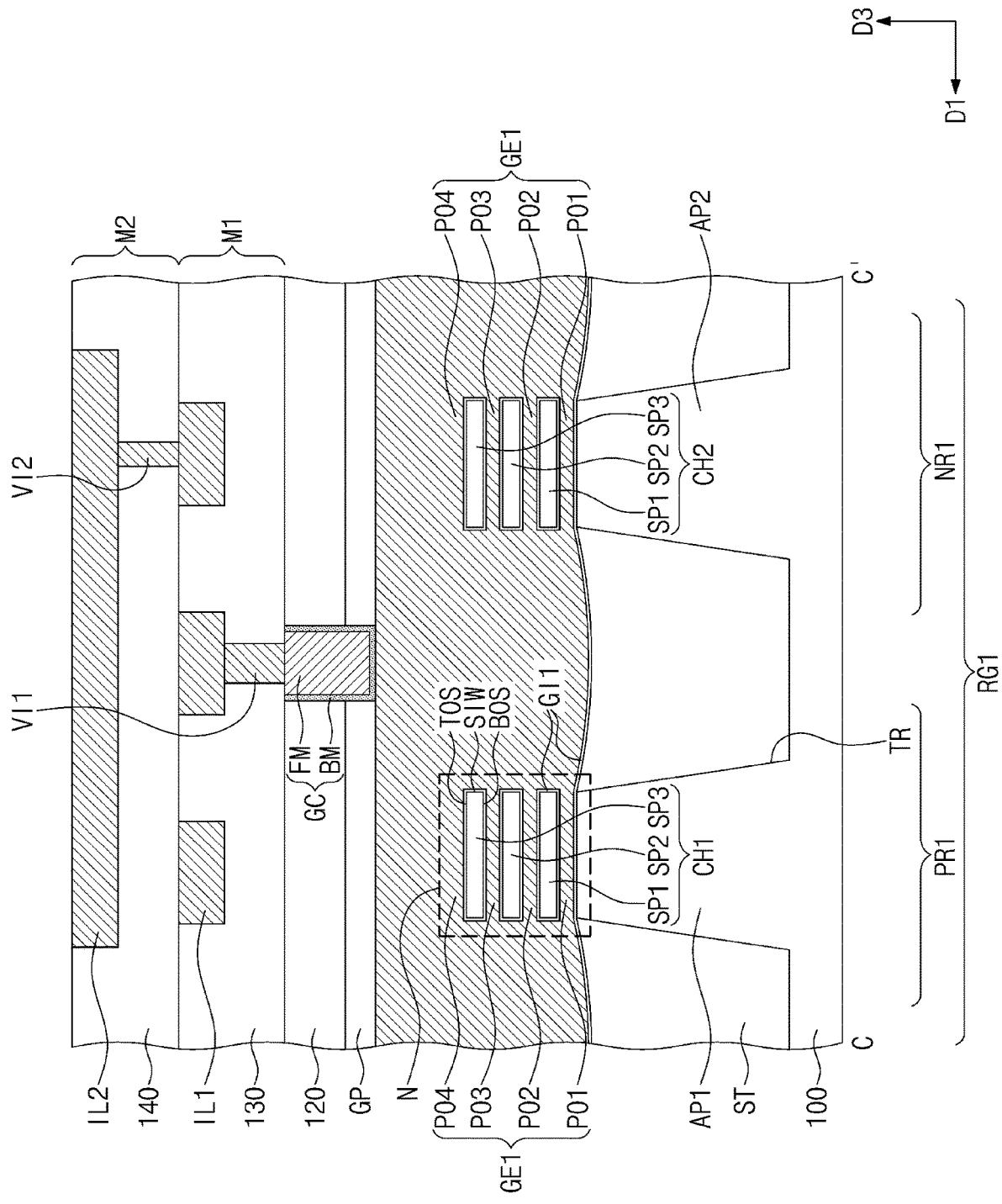
Figure 2D:
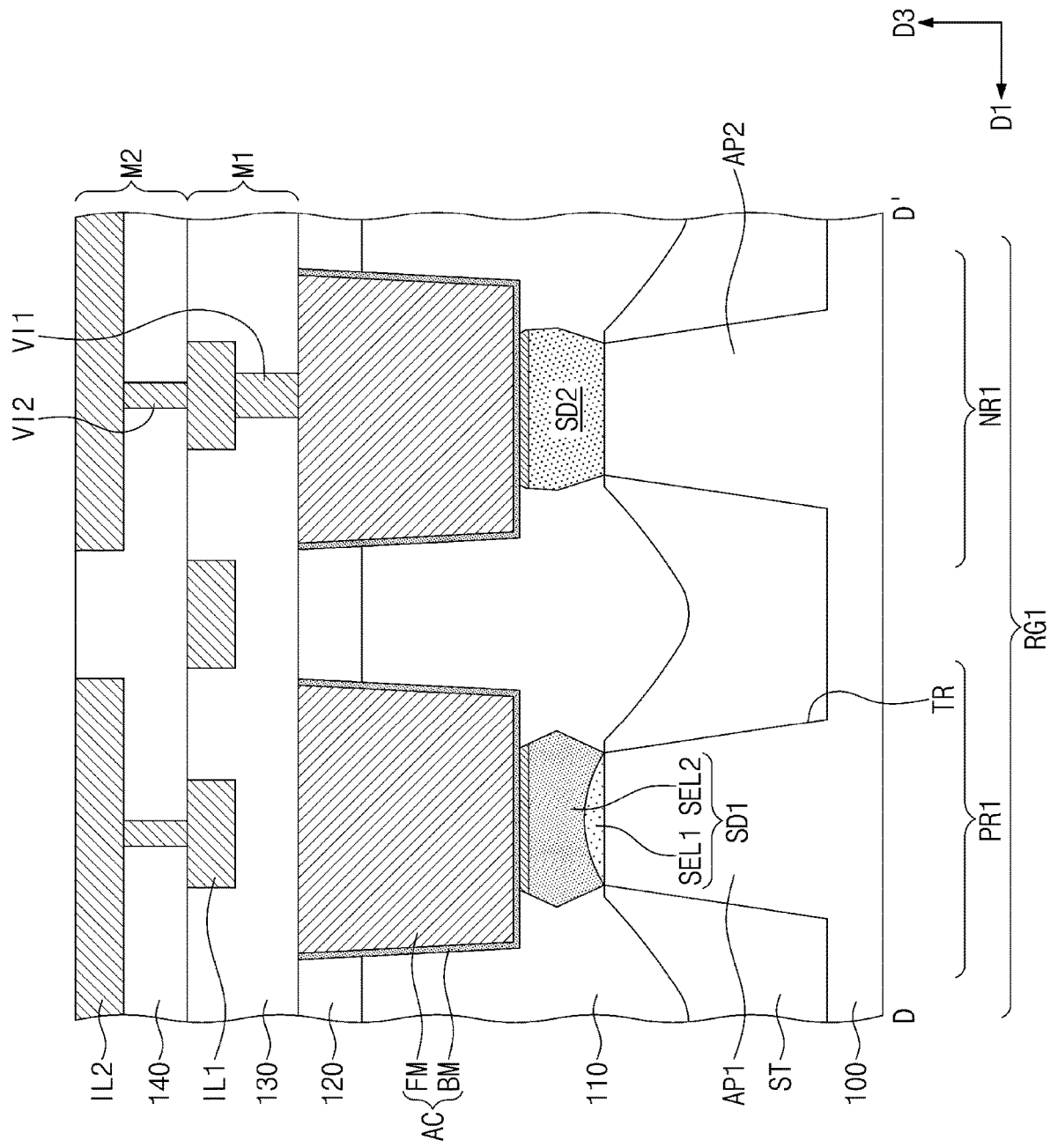
Figure 2E:
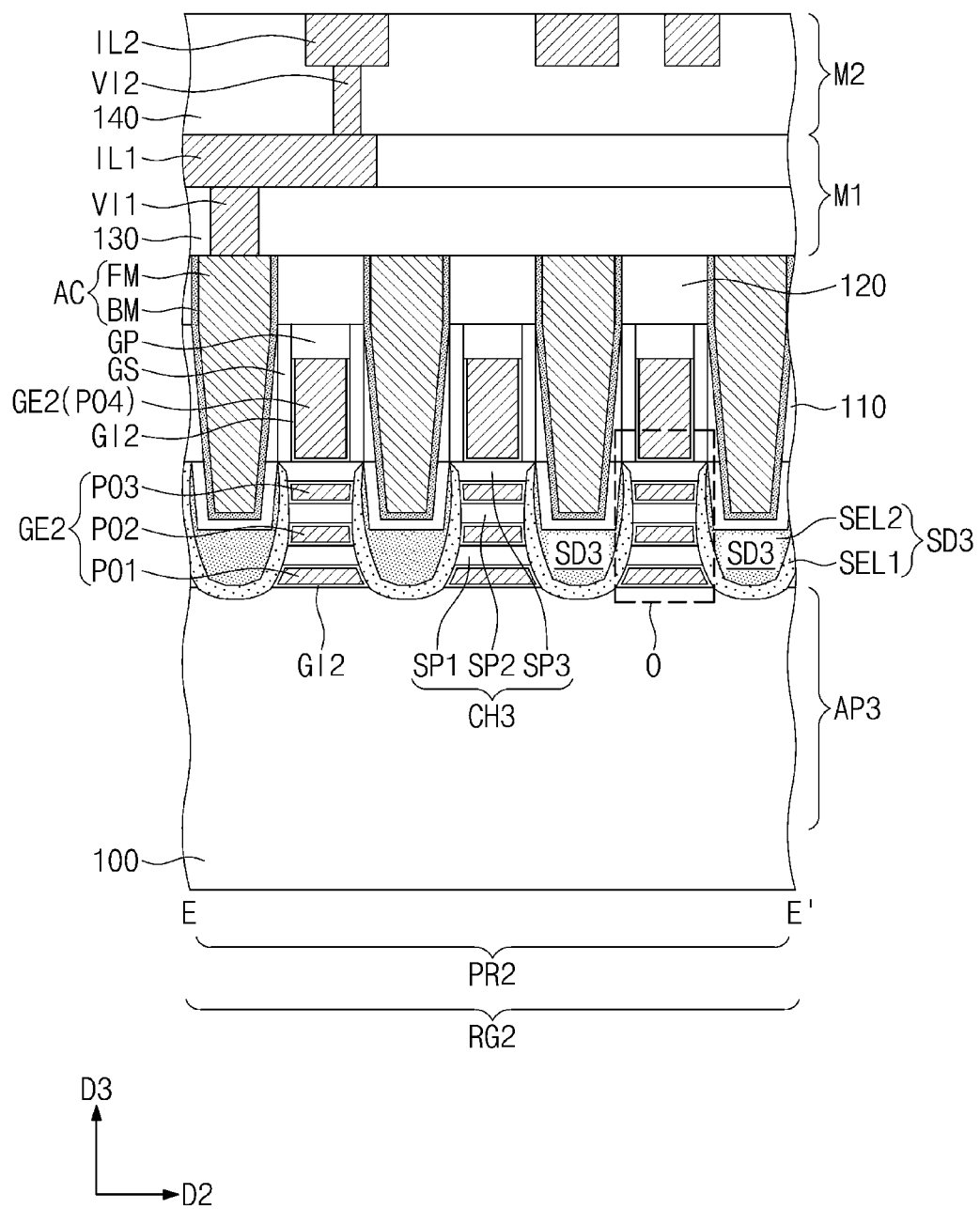
Figure 2F:
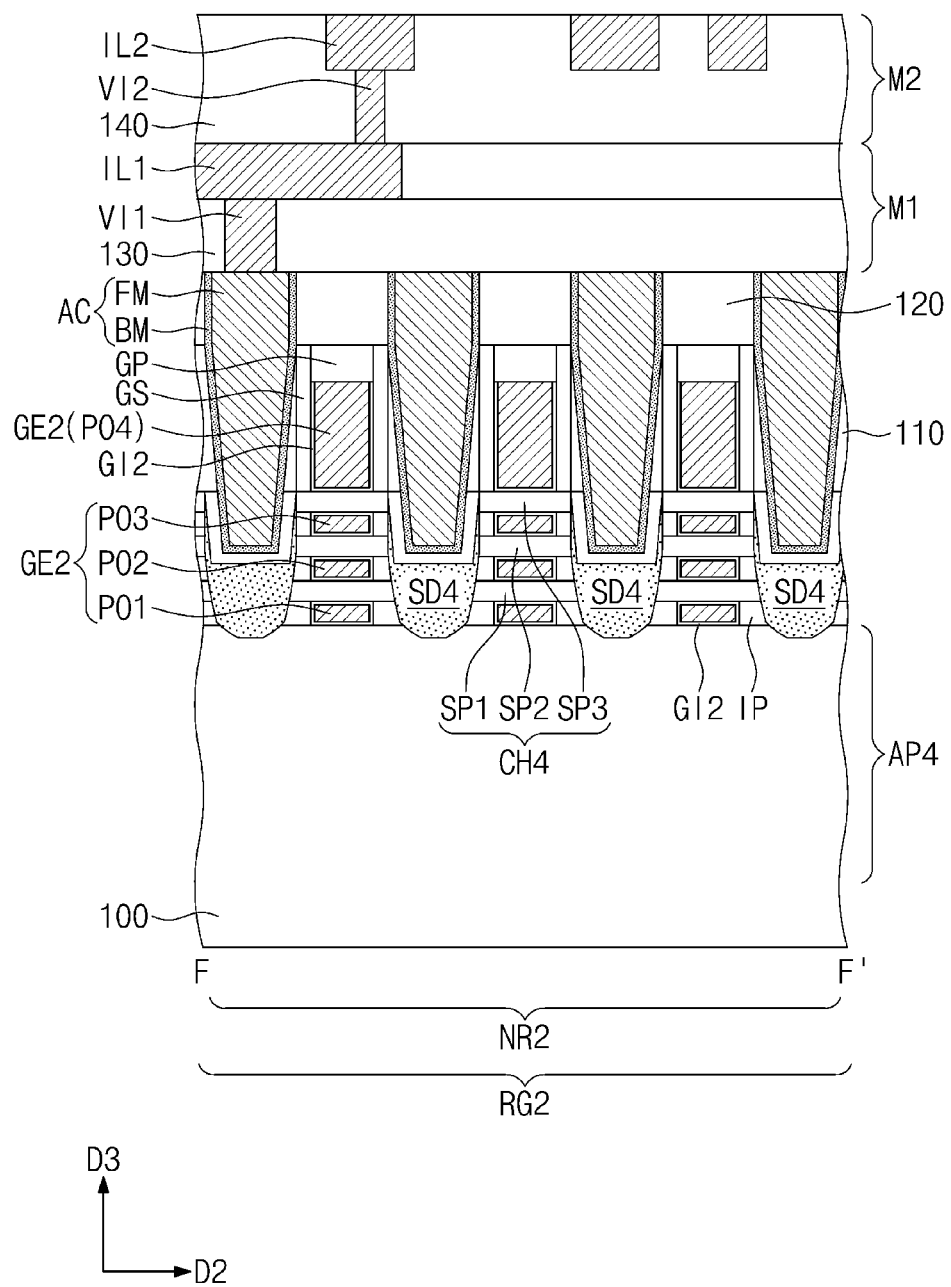
Figure 2G:
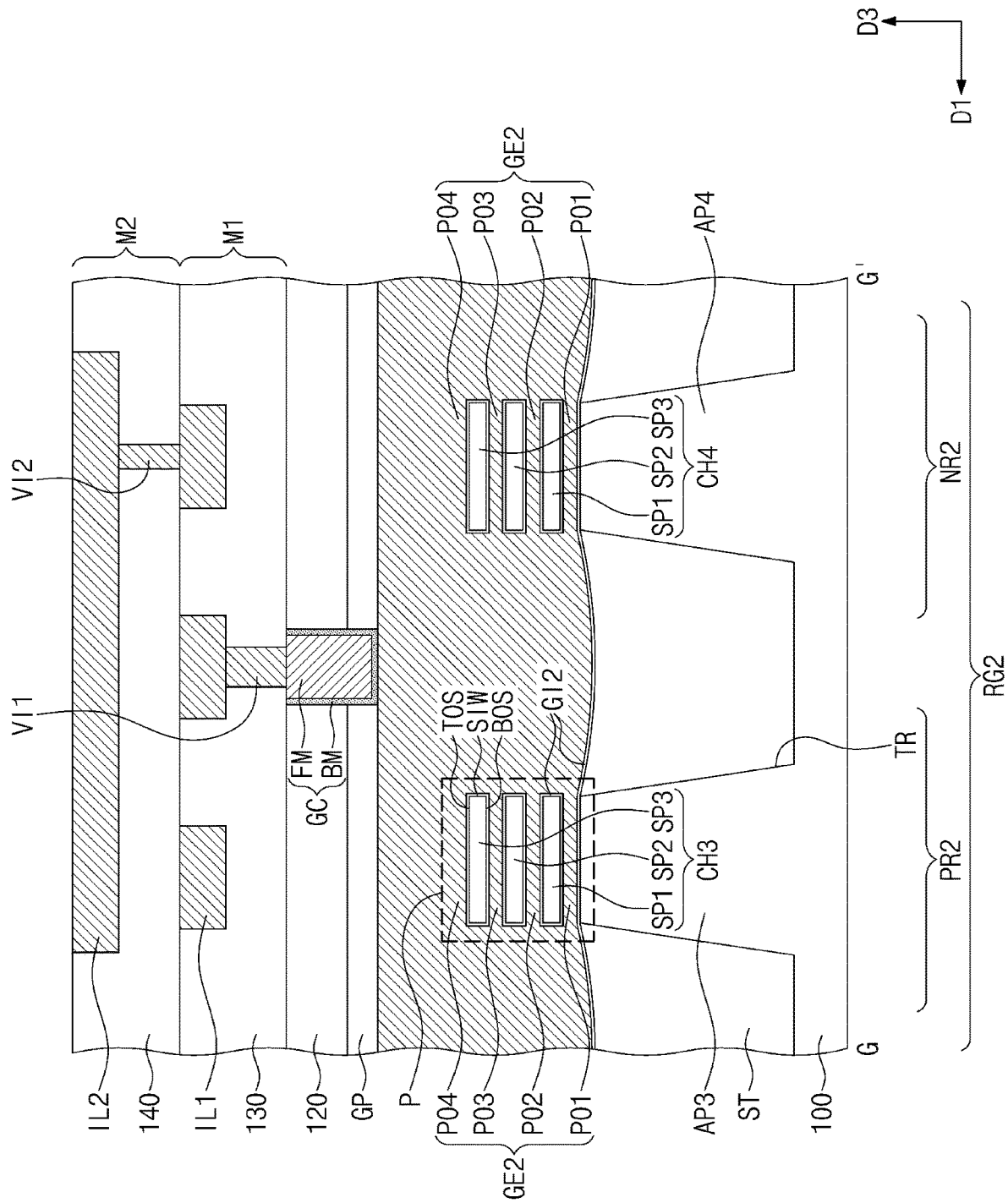
Figure 2H:
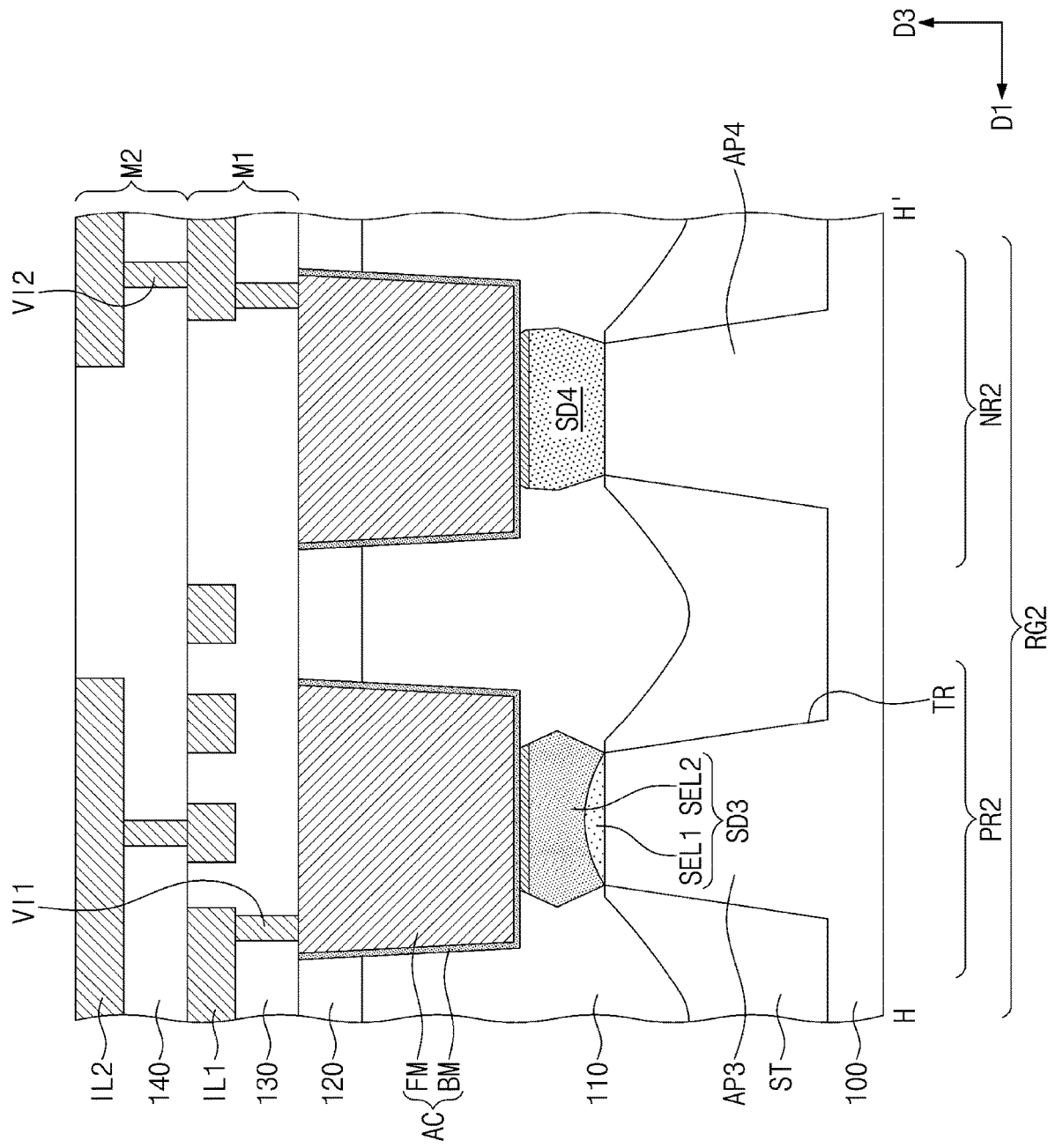

A first active pattern AP1 and a second active pattern AP2 of FIGS. 2C and 2D may be respectively provided on the first PMOS region PR1 and the first NMOS region NR1. In a plan view, the first and second active patterns AP1 and AP2 may extend in a second direction D2. The first and second active patterns AP1 and AP2 may be vertically protruding portions of the substrate 100. It is understood herein that the first and second directions D1 and D2 represent channel width and length directions, respectively.

As shown in FIGS. 2C and 2D, a device isolation layer ST may fill the trench TR. The device isolation layer ST may define the first PMOS region PR1 and the first NMOS region NR1 of the substrate 100. The device isolation layer ST may cover sidewalls of the first and second active patterns AP1 and AP2. The device isolation layer ST may include a silicon oxide layer.

As shown in FIGS. 2A to 2C, a first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second and third semiconductor patterns SP1, SP2 and SP3 may be spaced apart from each other in a vertical direction or a third direction D3. The third semiconductor pattern SP3 may be an uppermost one of the first, second and third semiconductor patterns SP1, SP2 and SP3, and the first semiconductor pattern SP1 may be a lowermost one of the first, second and third semiconductor patterns SP1, SP2 and SP3.

Each of the first, second and third semiconductor patterns SP1, SP2, and SP3 may include silicon (Si), germanium (Ge), or silicon-germanium (SiGe). For example, each of the first, second and third semiconductor patterns SP1, SP2 and SP3 may include crystalline silicon.

As shown in FIGS. 2A and 2D, a pair of first source/drain patterns SD1 may be provided on the first active pattern AP1. The first source/drain patterns SD1 may be impurity regions having a first conductivity type (e.g., p-type). The first, second and third semiconductor patterns SP1, SP2 and SP3 of the first channel pattern CH1 may be interposed between the first source/drain patterns SD1. For example, the first, second and third semiconductor patterns SP1, SP2 and SP3 of the first channel pattern CH1 may connect the first source/drain patterns SD1 to each other.

As shown in FIGS. 2A and 2D, a pair of second source/drain patterns SD2 may be provided on the second active pattern AP2. The second source/drain patterns SD2 may be impurity regions having a second conductivity type (e.g., n-type). The first, second and third semiconductor patterns SP1, SP2 and SP3 of the second channel pattern CH2 may be interposed between the second source/drain patterns SD2. For example, the first, second and third semiconductor patterns SP1, SP2 and SP3 of the second channel pattern CH2 may connect the second source/drain patterns SD2 to each other.

The first and second source/drain patterns SD1 and SD2 may be epitaxial patterns formed by a selective epitaxial growth process. For example, each of the first and second source/drain patterns SD1 and SD2 may have a top surface located at a level substantially the same as that of a top surface of the third semiconductor pattern SP3. For another example, at least one selected from the first and second source/drain patterns SD1 and SD2 may have a top surface higher than that of the third semiconductor pattern SP3 adjacent thereto.

The first source/drain patterns SD1 may include a semiconductor element (e.g., SiGe) whose lattice constant is greater than that of a semiconductor element of the substrate 100. Therefore, the first source/drain patterns SD1 may provide the first channel pattern CH1 with a compressive stress.

For example, the second source/drain patterns SD2 may include the same semiconductor element (e.g., Si) as that of the substrate 100. For another example, the second source/drain patterns SD2 may include not only silicon (Si), but carbon (C). For example, the second source/drain patterns SD2 may include silicon carbide (SiC). When the second source/drain pattern SD2 includes silicon carbide (SiC), the second source/drain pattern SD2 may have a carbon concentration of about 10 at % to about 30 at %. The second source/drain patterns SD2 including silicon carbide (SiC) may provide a tensile stress to the second channel pattern CH2 therebetween.

Each of the first source/drain patterns SD1 may include a first semiconductor layer SEL1 and a second semiconductor layer SEL2 on the first semiconductor layer SEL1. With reference back to FIG. 2A, the following will describe a cross-sectional shape in the second direction D2 of the first source/drain pattern SD1. The first semiconductor layer SEL1 may have a U shape. The first semiconductor layer SEL1 may have a thickness that decreases in a direction toward an upper portion thereof from a lower portion thereof. The second semiconductor layer SEL2 may be provided on the first semiconductor layer SEL1. The second semiconductor layer SEL2 may have a volume greater than that of the first semiconductor layer SEL1. For example, a volume ratio of the second semiconductor layer SEL2 to the first source/drain pattern SD1 may be greater than that of the first semiconductor layer SEL1 to the first source/drain pattern SD1.

Each of the first and second semiconductor layers SEL1 and SEL2 may include silicon-germanium (SiGe). For example, the first semiconductor layer SEL1 may contain germanium (Ge) whose concentration is relatively low. In embodiments, the first semiconductor layer SEL1 may include only silicon (Si) and may not include germanium (Ge). The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may contain a germanium content of about 30 at % to about 70 at %. The germanium concentration of the second semiconductor layer SEL2 may gradually increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include impurities (e.g., boron) that cause the first source/drain pattern SD1 to have a p-type conductivity type. An impurity concentration (e.g., atomic percent) of the second semiconductor layer SEL2 may be greater than that of the first semiconductor layer SEL1.

The first semiconductor layer SEL1 may prevent stacking faults between the substrate 100 and the second semiconductor layer SEL2 and between the second semiconductor layer SEL2 and the first, second and third semiconductor patterns SP1, SP2 and SP3. The stacking faults may cause an increase in channel resistance, but the first semiconductor layer SEL1 may prevent the stacking faults and increase device electrical properties.

The first semiconductor layer SEL1 may protect the second semiconductor layer SEL2 while sacrificial layers SAL are replaced with first, second and third parts PO1, PO2 and PO3 of a first gate electrode GE1 which will be discussed later. For example, the first semiconductor layer SEL1 may prevent the second semiconductor layer SEL2 from being etched with an etching material that etches the sacrificial layers SAL.

Referring back to FIGS. 1 and 2A to 2D, a first gate electrode GE1 may be provided to extend in the first direction D1 while running across the first and second active patterns AP1 and AP2. The first gate electrode GE1 may extend from the first PMOS region PR1 toward the first NMOS region NR1. The first gate electrode GE1 may vertically overlap the first and second channel patterns CH1 and CH2. The first gate electrode GE1 may have a first width W1 in the second direction D2.

As shown in FIG. 2C, the first gate electrode GE1 may include a first part PO1 between the substrate 100 and the first semiconductor pattern SP1, a second part PO2 between the first semiconductor pattern SP1 and the second semiconductor pattern SP2, a third part PO3 between the second semiconductor pattern SP2 and the third semiconductor pattern SP3, and a fourth part PO4 on the third semiconductor pattern SP3.

The first gate electrode GE1 may be provided to face a top surface TOS, a bottom surface BOS, and opposite sidewalls SIW of each of the first, second and third semiconductor patterns SP1, SP2 and SP3 in the first direction D1. For example, the transistor according to the present embodiment may be a three-dimensional field effect transistor (e.g., multi-bridge channel field effect transistor (MBCFET) or a gate all around field effect transistor (GAAFET)) in which a gate electrode three-dimensionally surrounds a channel.

Referring back to FIGS. 1 and 2A to 2D, a pair of gate spacers GS may be disposed on opposite sidewalls of the first gate electrode GE1 in the second direction D2. The gate spacers GS may extend in the first direction D1 along the first gate electrode GE1. The gate spacers GS may have their top surfaces higher than that of the first gate electrode GE1.

For example, the top surfaces of the gate spacers GS may be coplanar with that of a first interlayer dielectric layer 110 which will be discussed later. For another example, the top surfaces of the gate spacers GS may be lower than that of a first interlayer dielectric layer 110 which will be discussed later. The gate spacers GS may include at least one selected from SiCN, SiCON, and SiN. For example, the gate spacers GS may each include a multi-layer formed of at least two selected from silicon carbonitride (SiCN), silicon carbon oxynitride (SiCON) and silicon nitride (SiN).

A gate capping pattern GP may be provided on the first gate electrode GE1. The gate capping pattern GP may extend in the first direction D1 along the first gate electrode GE1. The gate capping pattern GP may include a material having an etch selectivity with respect to first and second interlayer dielectric layers 110 and 120 which will be discussed later. For example, the gate capping pattern GP may include at least one selected from silicon oxynitride (SiON), SiCN, SiCON, and SiN.

A first gate dielectric layer GI1 may be interposed between the first gate electrode GE1 and the first channel pattern CH1 and between the first gate electrode GE1 and the second channel pattern CH2. The first gate dielectric layer GI1 may be formed directly on the top surface TOS, the bottom surface BOS, and the opposite sidewalls SIW of each of the first, second and third semiconductor patterns SP1, SP2 and SP3 in the first direction D1 (see FIG. 2C). The first gate dielectric layer GI1 may extend along a bottom surface of the first gate electrode GE1 that overlies the first gate dielectric layer GI1. The first gate dielectric layer GI1 may cover a top surface of the device isolation layer ST that underlies the first gate electrode GE1.

The first gate electrode GE1 may include a first metal pattern and a second metal pattern on the first metal pattern. The first gate dielectric layer GI1 may be provided thereon with the first metal pattern adjacent to the first and second channel patterns CH1 and CH2. The first metal pattern may include a work-function metal that controls a threshold voltage of each transistor formed in the first and second regions RG1 and RG2. A thickness and composition of the first metal pattern may be adjusted to achieve a desired threshold voltage of a transistor.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta).

Although not shown, the second metal pattern may not be included in the first, second and third parts PO1, PO2 and PO3 of the first gate electrode GE1, and may be included in the fourth part PO4 of the first gate electrode GE1. For example, the first, second and third parts PO1, PO2 and PO3 of the first gate electrode GE1 may include the first metal pattern, or a work-function metal layer but not the second metal pattern. The fourth part PO4 of the first gate electrode GE1 may include the first metal pattern and the second metal pattern on the first metal pattern.

Referring back to FIG. 2B, inner spacers IP may be provided on the first NMOS region NR1. The inner spacers IP may be correspondingly interposed between the second source/drain pattern SD2 and the first, second and third parts PO1, PO2 and PO3 of the first gate electrode GE1. The inner spacers IP may be in direct contact with the second source/drain pattern SD2. The inner spacer IP may separate the second source/drain pattern SD2 from each of the first, second and third parts PO1, PO2 and PO3 of the first gate electrode GE1.

The inner spacer IP may include a low-k dielectric material. The low-k dielectric material may include silicon oxide or a material whose dielectric constant is less than that of silicon oxide. For example, the low-k dielectric material may include at least one selected from the group of silicon oxide, silicon oxide doped with fluorine or carbon, porous silicon oxide, and organic polymeric dielectrics.

A first interlayer dielectric layer 110 may be provided on the substrate 100. The first interlayer dielectric layer 110 may be formed on the gate spacers GS and the first and second source/drain patterns SD1 and SD2. The first interlayer dielectric layer 110 may have a top surface substantially coplanar with that of the gate capping pattern GP. The first interlayer dielectric layer 110 may be provided thereon with a second interlayer dielectric layer 120 that is formed on the gate capping pattern GP. For example, the first and second interlayer dielectric layers 110 and 120 may include a silicon oxide layer.

Active contacts AC may be provided to penetrate the first and second interlayer dielectric layers 110 and 120 and correspondingly have electrical connection with the first and second source/drain patterns SD1 and SD2. A pair of active contacts AC may be provided on opposite sides of the first gate electrode GE1 in the second direction D2. In a plan view, the active contact AC may have a bar shape that extends in the first direction D1.

The active contact AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may be formed on sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

The active contact AC may be a self-aligned contact. For example, the gate capping pattern GP and the gate spacer GS may be used to form the active contact AC in a self-alignment manner. The active contact AC may be formed on, for example, at least a portion of a sidewall of the gate spacer GS. Although not shown, the active contact AC may be formed on a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP to have electrical connection with the first gate electrode GE1. The gate contact GC may be provided on the device isolation layer ST between the first PMOS region PR1 and the first NMOS region NR1. In a plan view, the gate contact GC may have a bar shape that extends in the second direction D2. Likewise the active contact AC, the gate contact GC may include a conductive pattern FM and a barrier pattern BM that surrounds the conductive pattern FM.

A third interlayer dielectric layer 130 may be provided on the second interlayer dielectric layer 120. A first metal layer M1 may be provided in the third interlayer dielectric layer 130. The first metal layer M1 may include first lines IL1 and first vias VI1. The first vias VI1 may be provided below the first lines IL1. The first lines IL1 may be disposed along the first direction D1. Each of the first lines IL1 may have a linear or bar shape that extends in the second direction D2.

The first vias VI1 may be correspondingly provided below the first lines IL1 of the first metal layer M1. The first vias VI1 may be correspondingly interposed between the active contacts AC and the first lines IL1. The first vias VI1 may be correspondingly interposed between the gate contacts GC and the first lines IL1.

The first line IL1 and its underlying first via VI1 of the first metal layer M1 may be formed by processes separately from each other. For example, each of the first line IL1 and the first via VI1 may be formed by a single damascene process. A sub-20 nm process may be employed to fabricate a semiconductor device according to the present embodiment.

A fourth interlayer dielectric layer 140 may be provided on the third interlayer dielectric layer 130. A second metal layer M2 may be provided in the fourth interlayer dielectric layer 140. The second metal layer M2 may include second lines IL2. Each of the second lines IL2 may have a linear or bar shape that extends in the first direction D1. For example, the second lines IL2 may parallel extend in the first direction D1.

The second metal layer M2 may further include second vias VI2. The second vias VI2 may be correspondingly provided below the second lines IL2. The second vias VI2 may be correspondingly interposed between the first lines IL1 and the second lines IL2.

The second line IL2 and its underlying second via VI2 may be formed as a single piece in the same process. For example, a dual damascene process may be employed to simultaneously form the second line IL2 and the second via VI2 of the second metal layer M2.

The first lines IL1 of the first metal layer M1 may include a conductive material the same as or different from that of the second lines IL2 of the second metal layer M2. For example, the first and second lines IL1 and IL2 may include at least one metal selected from copper (Cu), ruthenium (Ru), cobalt (Co), tungsten (W), aluminum (Al), and molybdenum (Mo).

In embodiments, although not shown, metal layers (e.g., M3, M4, M5, etc.) may be additionally stacked on the fourth interlayer dielectric layer 140. Each of the stacked metal layers may include routing lines.

With reference to FIGS. 1 and 2E to 2H, the following will discuss in detail a transistor on the second region RG2. Omission will be made to avoid repetitive technical features in view of those of the transistor on the first region RG1 discussed with reference to FIGS. 1 and 2A to 2D, and a difference thereof will be described in detail.

The second region RG2 may include a second PMOS region PR2 and a second NMOS region NR2. The second PMOS region PR2 and the second NMOS region NR2 may be defined by a trench TR formed on an upper portion of the substrate 100. The device isolation layer ST that fills the trench TR may define a third active pattern AP3 and a fourth active pattern AP4. The third active pattern AP3 and the fourth active pattern AP4 may be provided respectively on the second PMOS region PR2 and the second NMOS region NR2. The trench TR, the device isolation layer ST, and the third and fourth active patterns AP3 and AP4 formed in the second region RG2 may be extended from, or separate from the trench TR, the device isolation layer ST, and the first and second active patterns AP1 and AP2 formed in the first region RG1, according to embodiments A third channel pattern CH3 may be provided on the third active pattern AP3, and a fourth channel pattern CH4 may be provided on the fourth active pattern AP4. Each of the third and fourth channel patterns CH3 and CH4 may include first, second and third semiconductor patterns SP1, SP2 and SP3 that are sequentially stacked.

The first, second and third semiconductor patterns SP1, SP2 and SP3 of the third and fourth channel patterns CH3 and CH4 may be shorter than the first, second and third semiconductor patterns SP1, SP2 and SP3 of the first and second channel patterns CH1 and CH2 discussed above. For example, each of the first, second and third semiconductor patterns SP1, SP2 and SP3 of the third and fourth channel patterns CH3 and CH4 may have a length in the second direction D2 less than a length in the second direction D2 of each of the first, second and third semiconductor patterns SP1, SP2 and SP3 of the first and second channel patterns CH1 and CH2. The second region RG2 may include a short gate transistor (or short channel transistor) of whose a gate length (or channel length) in the second direction D2 is relatively small.

A pair of third source/drain patterns SD3 may be provided on an upper portion of the third active pattern AP3. A pair of fourth source/drain patterns SD4 may be provided on an upper portion of the fourth active pattern AP4. The first, second and third semiconductor patterns SP1, SP2 and SP3 of the third channel pattern CH3 may be interposed between the third source/drain patterns SD3. The first, second and third semiconductor patterns SP1, SP2 and SP3 of the fourth channel pattern CH4 may be interposed between the fourth source/drain patterns SD4.

Each of the third source/drain patterns SD3 may be an epitaxial pattern that contains impurities having the first conductivity type (e.g., p-type). Each of the fourth source/drain patterns SD4 may be an epitaxial pattern that contains impurities having the second conductivity type (e.g., n-type). The third and fourth source/drain patterns SD3 and SD4 may respectively be substantially the same as the first and second source/drain patterns SD1 and SD2 discussed above.

Second gate electrodes GE2 may be provided to extend in the first direction D1 while running across the third and fourth channel patterns CH3 and CH4. The second gate electrode GE2 may extend from the second PMOS region PR2 toward the second NMOS region NR2. The second gate electrode GE2 may vertically overlap the third and fourth channel patterns CH3 and CH4. The second gate electrode GE2 may have a second width W2 in the second direction D2. The second width W2 may be less than the first width W1 of the first gate electrode GE1. A pair of gate spacers GS may be disposed on opposite sidewalls of the second gate electrode GE2 in the second direction D2. A gate capping pattern GP may be provided on the second gate electrode GE2.

Similar to the first gate electrode GE1, the second gate electrode GE2 may include first, second, third and fourth parts PO1, PO2, PO3 and PO4. The second gate electrode GE2 may be provided to face a top surface TOS, a bottom surface BOS, and opposite sidewalls SIW of each of the first, second and third semiconductor patterns SP1, SP2 and SP3 in the first direction D1. For example, the transistor on the second region RG2 may also be a three-dimensional field effect transistor (e.g., multi-bridge channel field effect transistor (MBCFET) or a gate all around field effect transistor (GAAFET)).

Referring back to FIGS. 1 and 2E to 2H, a second gate dielectric layer GI2 may be interposed between the second gate electrode GE2 and the third channel pattern CH3 and between the second gate electrode GE2 and the fourth channel pattern CH4. The second gate dielectric layer GI2 may be formed directly on the top surface TOS, the bottom surface BOS, and the opposite sidewalls SIW of each of the first, second and third semiconductor patterns SP1, SP2 and SP3 (see FIG. 2G) in the first direction D1. As will be discussed later in conjunction with FIGS. 3A to 3D, the second gate dielectric layer GI2 on the second region RG2 may have a thickness less than that of the first gate dielectric layer GI1 on the first region RG1.

The second NMOS region NR2 may be provided thereon with inner spacers IP. The inner spacers IP may be correspondingly interposed between the fourth source/drain pattern SD4 and first, second and third parts PO1, PO2 and PO3 of the second gate electrode GE2. In contrast, the inner spacers IP may not be included in the second PMOS region PR2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the third and fourth source/drain patterns SD3 and SD4. A gate contact GC may be provided to penetrate the second interlayer dielectric layer 120 and the gate capping pattern GP to have electrical connection with the second gate electrode GE2. A first metal layer M1 and a second metal layer M2 may be provided on the second interlayer dielectric layer 120. The detailed descriptions of the active contacts AC, the gate contact GC, the first metal layer M1, and the second metal layer M2 may be substantially the same as those discussed with reference to FIGS. 1 and 2A to 2D. The first and second interlayer dielectric layers 110 and 120 formed in the second region RG2 may be extended from and later separated from, for example, in a fin-cut operation, the first and second interlayer dielectric layers 110 and 120 formed in the first region RG1, according to embodiments.

Figure 3A:
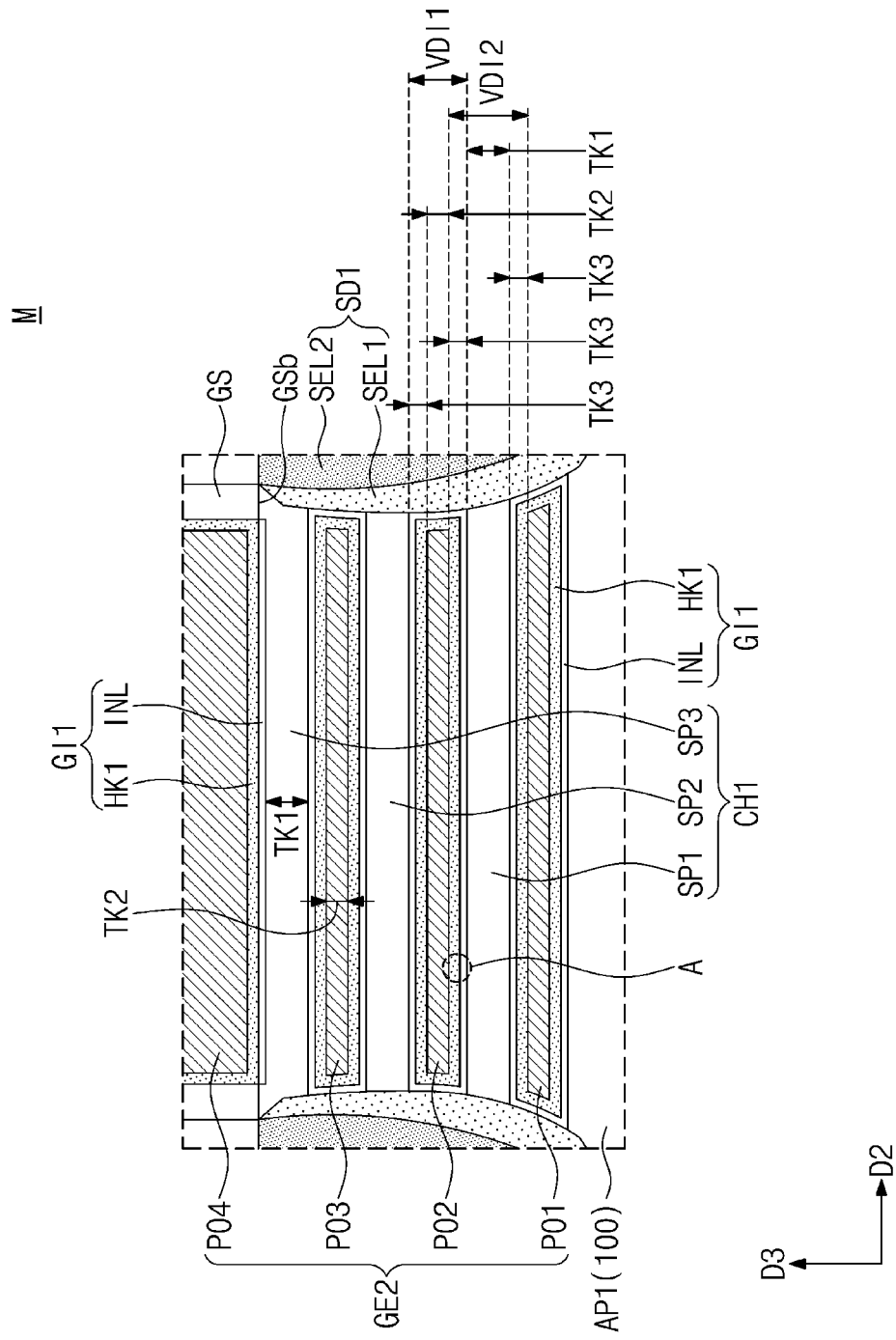
FIG. 3A illustrates an enlarged cross-sectional view showing section M of FIG. 2A.
Figure 3B:
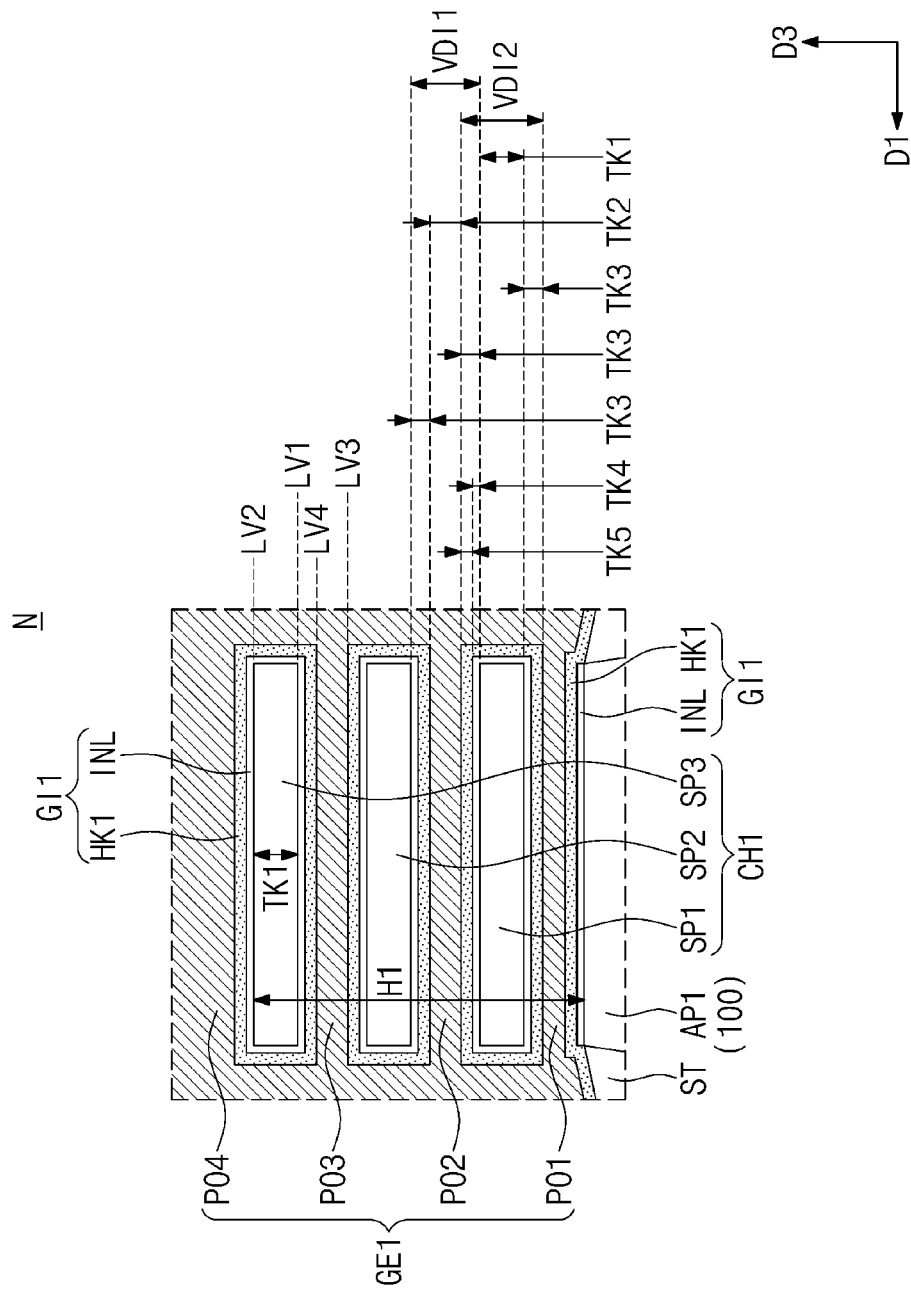
FIG. 3B illustrates an enlarged cross-sectional view showing section N of FIG. 2C.

The following description will focus on the first channel pattern CH1 and the first gate dielectric layer GI1 in the first region RG1. FIG. 3A illustrates an enlarged cross-sectional view showing section M of FIG. 2A. FIG. 3B illustrates an enlarged cross-sectional view showing section N of FIG. 2C.

Referring to FIGS. 3A and 3B, the first gate dielectric layer GI1 may surround each of the first, second and third semiconductor patterns SP1, SP2 and SP3 of the first channel pattern CH1. The first gate dielectric layer GI1 may include an interface layer INL and a first high-k dielectric layer HK1 that are sequentially stacked on a surface of each of the first, second and third semiconductor patterns SP1, SP2 and SP3.

The first high-k dielectric layer HK1 may be in a direct contact with the interface layer INL. The interface layer INL may include one or more oxide materials such as silicon oxide, not being limited thereto. The first high-k dielectric layer HK1 may include a high-k dielectric material of which a dielectric constant is high. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. For example, the first high-k dielectric layer HK1 may also include an oxide material such as hafnium oxide.

The first gate dielectric layer GI1 and the first gate electrode GE1 may fill a space between neighboring semiconductor patterns SP1, SP2 and SP3. A first vertical distance VDI1 may be defined to refer to a size of the space between neighboring semiconductor patterns SP1, SP2 and SP3 on the first region RG1, or as a distance in the third direction D3 between neighboring semiconductor patterns SP1, SP2 and SP3.

The first, second and third semiconductor patterns SP1, SP2 and SP3 of the first channel pattern CH1 may each have a first thickness TK1. The first gate dielectric layer GI1 may have a third thickness TK3. The third thickness TK3 may be a sum of thicknesses of the interface layer INL and the first high-k dielectric layer HK1. The thickness of the interface layer INL may be a fourth thickness TK4. The thickness of the first high-k dielectric layer HK1 may be a fifth thickness TK5. For example, the third thickness TK3 may be a sum of the fourth thickness TK4 and the fifth thickness TK5.

Each of the first, second and third parts PO1, PO2 and PO3 of the first gate electrode GE1 may fill an unoccupied portion of the space that is not fully filled with the first gate dielectric layer GI1. Each of the first, second and third parts PO1, PO2 and PO3 of the first gate electrode GE1 may have a second thickness TK2 in the third direction D3. The first vertical distance VDI1 may be given by an expression of 2×TK3+TK2. A second vertical distance VDI2 may be defined to refer to a distance in the third direction D3 between neighboring parts PO1, PO2, PO3 and PO4 of the first gate electrode GE1. The second vertical distance VDI2 may be given by an expression of 2×TK3+TK1.

The interface layer INL of the first gate dielectric layer GI1 that surrounds the fourth part PO4 of the first gate electrode GE1 may have a bottom surface located at a level lower than that of a bottom surface GSb of the gate spacer GS.

The third semiconductor pattern SP3 of the first channel pattern CH1 may have a bottom surface located at a first level LV1. The third semiconductor pattern SP3 of the first channel pattern CH1 may have a top surface located at a second level LV2. The third part PO3 of the first gate electrode GE1 may have a bottom surface located at a third level LV3. The fourth part PO4 of the first gate electrode GE1 may have a top surface located at a fourth level LV4. A first distance H1 may be given as a distance between the first active pattern AP1 and the top surface of the third semiconductor pattern SP3 included in the first channel pattern CH1. The first distance H1 may be defined to refer to a height of the first channel pattern CH1.

Figure 4:
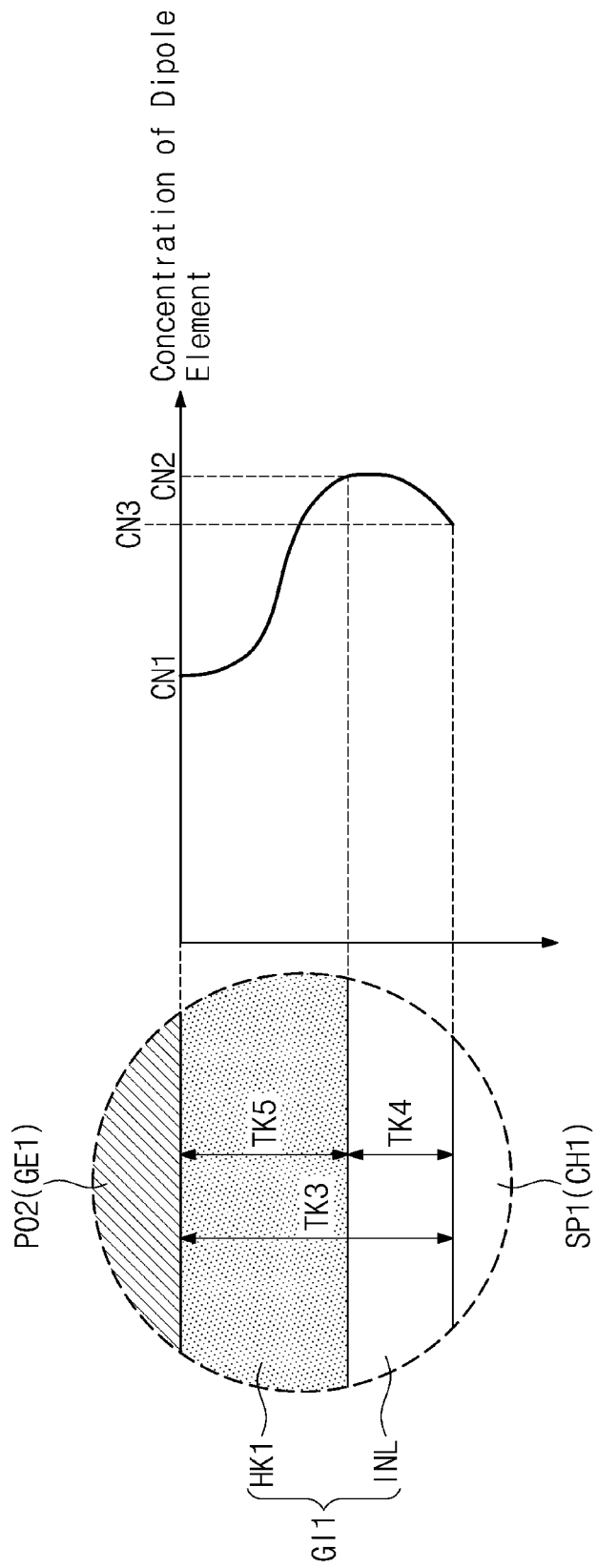
FIG. 4 illustrates an enlarged cross-sectional view showing section A of FIG. 3A.
Figure 5:
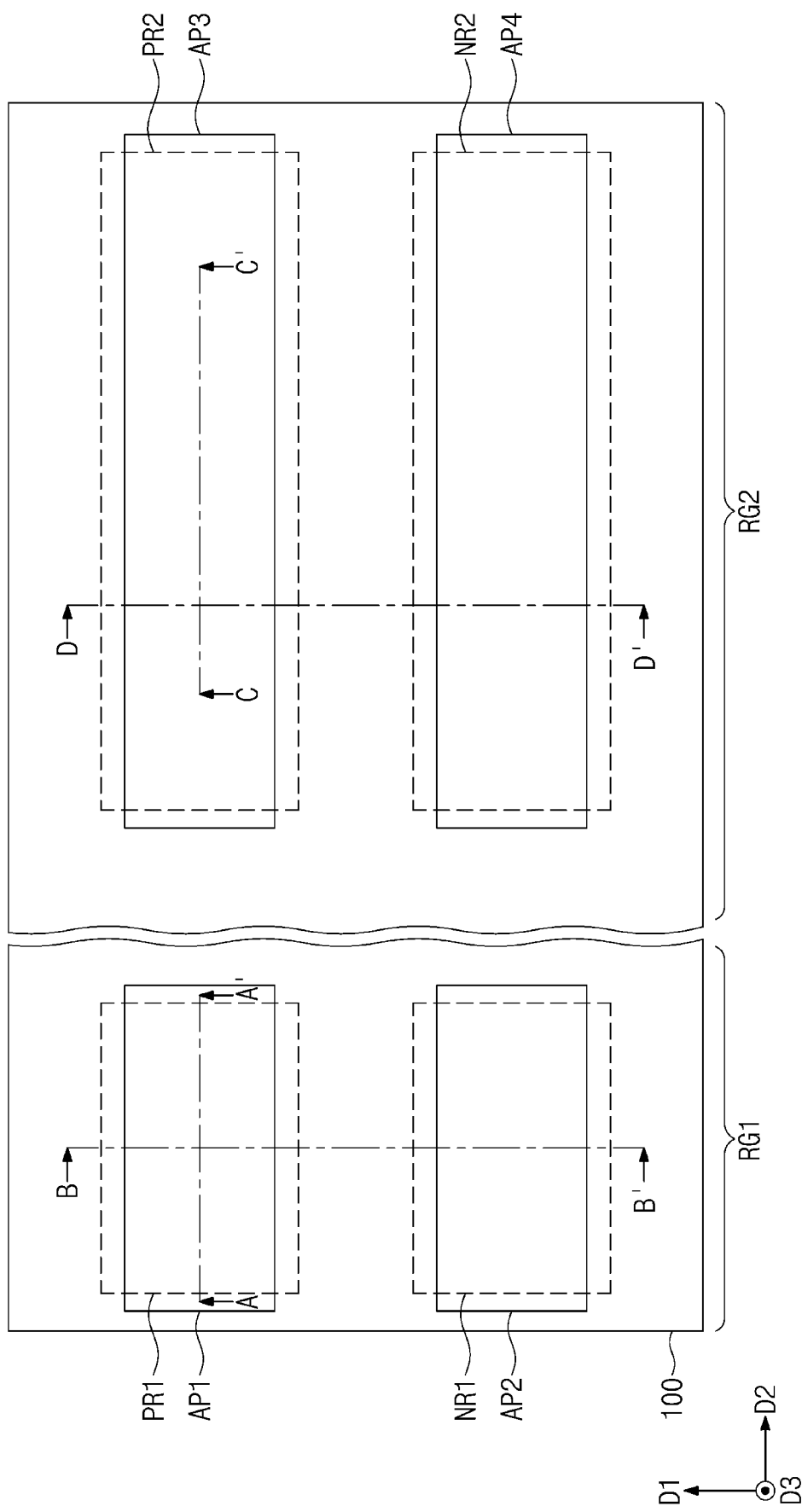
FIGS. 5, 7, 9, 11, and 14 illustrate plan views showing a method of fabricating a semiconductor device according to embodiments.
Figure 6A:
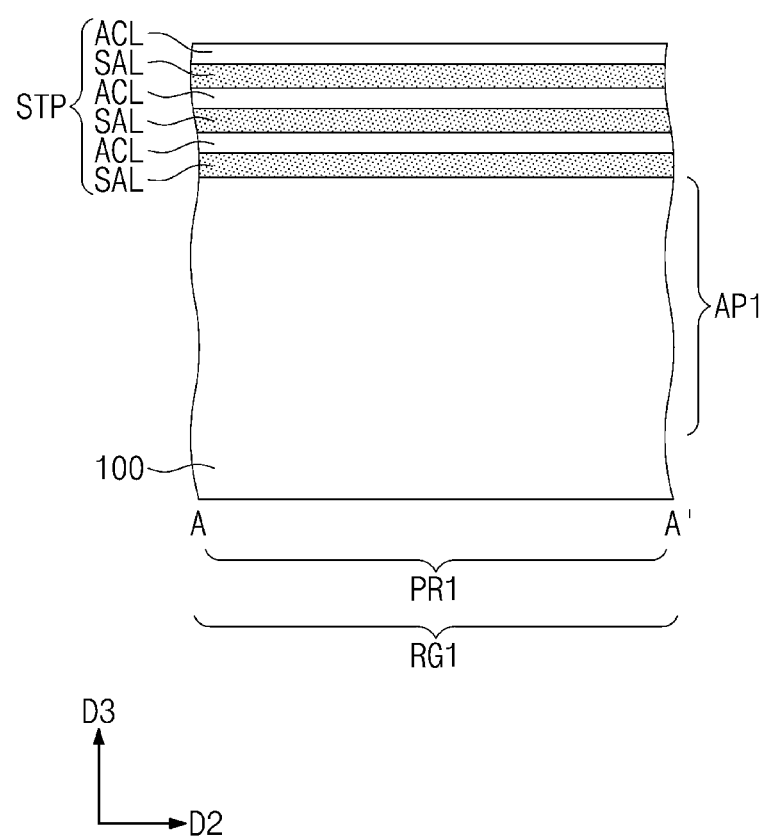
FIGS. 6A, 8A, 10A, 12A, and 15A illustrate cross-sectional views taken along line A-A' of FIGS. 5, 7, 9, 11, and 14, respectively.
Figure 6B:
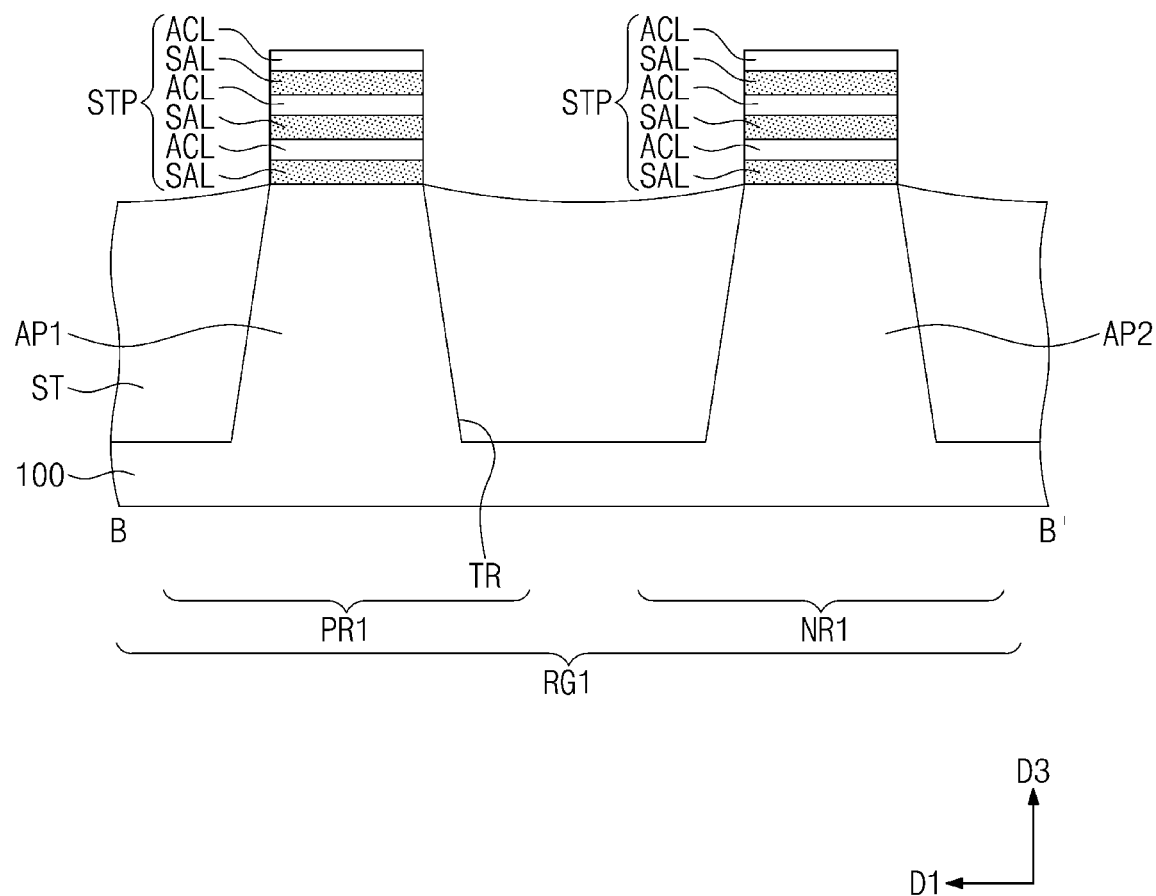
FIGS. 6B, 8B, 10B, 12B, and 15B illustrate cross-sectional views taken along line B-B' of FIGS. 5, 7, 9, 11, and 14, respectively.
Figure 6C:
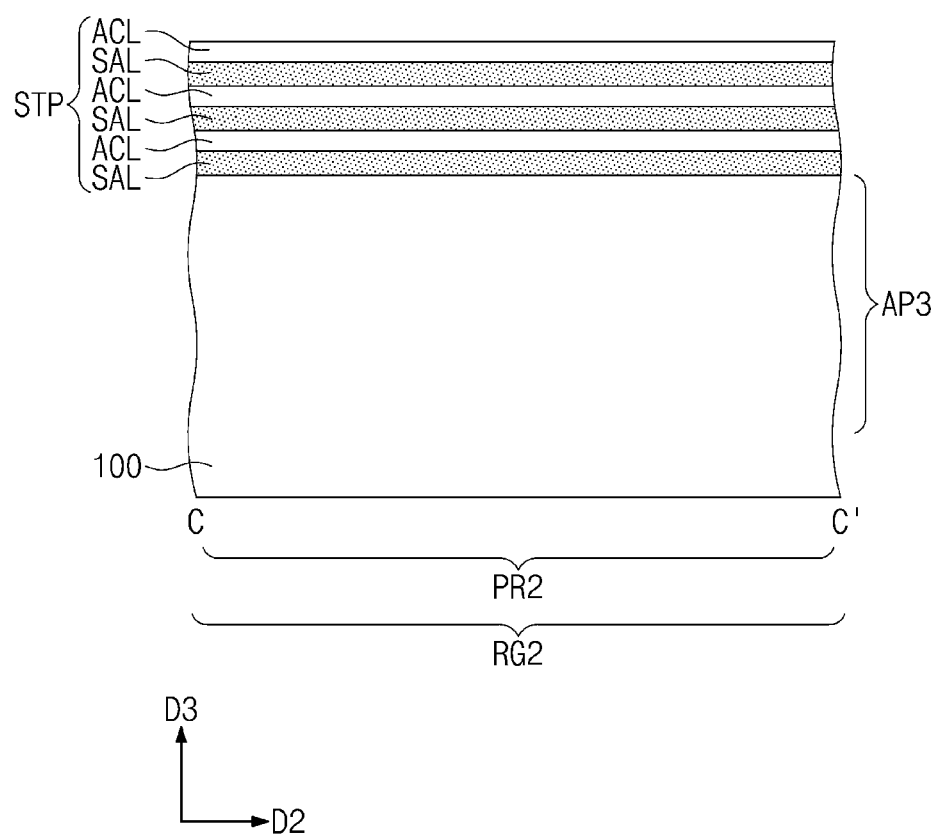
FIGS. 6C, 8C, 10C, 12C, and 15C illustrate cross-sectional views taken along line C-C' of FIGS. 5, 7, 9, 11, and 14, respectively.
Figure 6D:
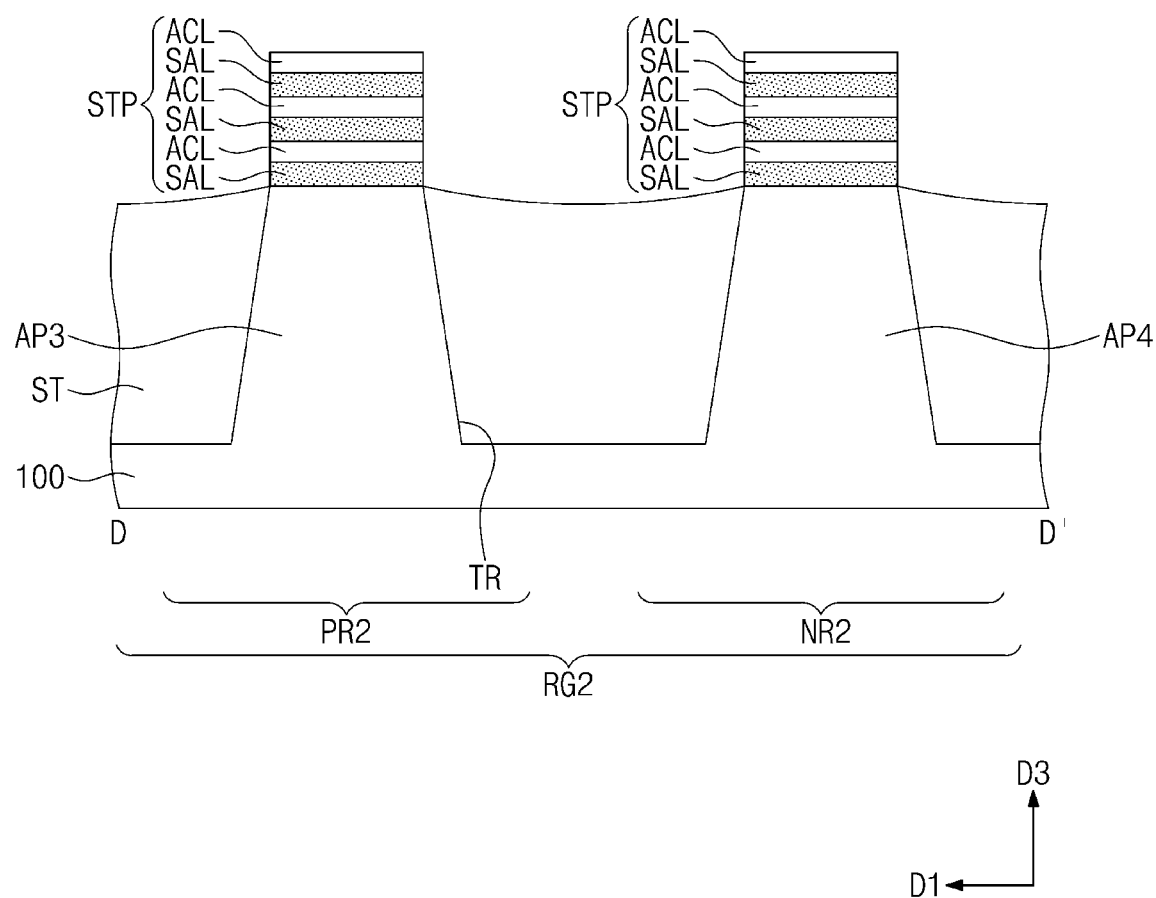
FIGS. 6D, 8D, 10D, 12D, and 15D illustrate cross-sectional views taken along line D-D' of FIGS. 5, 7, 9, 11, and 14, respectively.
Figure 7:
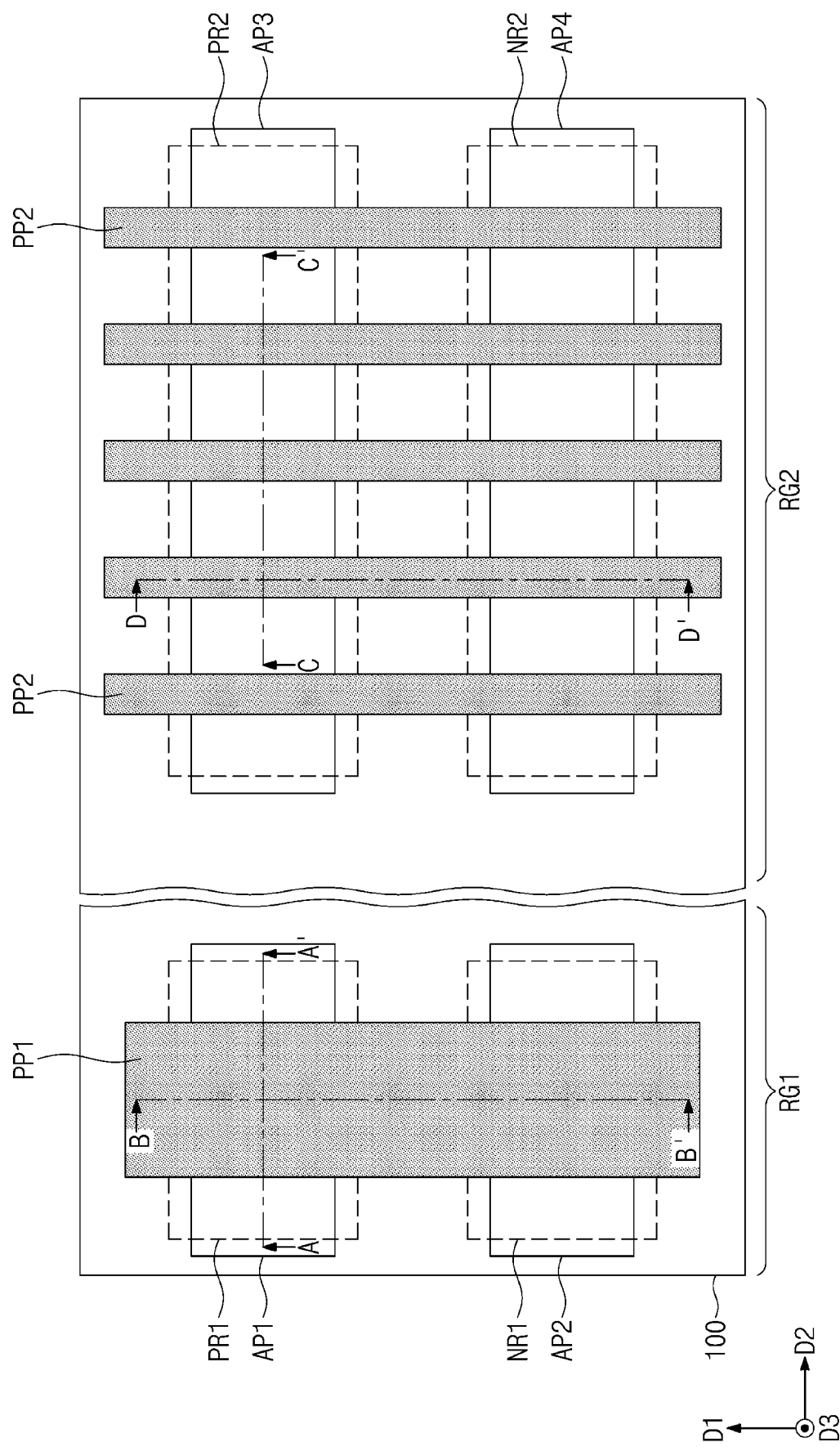
Figure 8A:
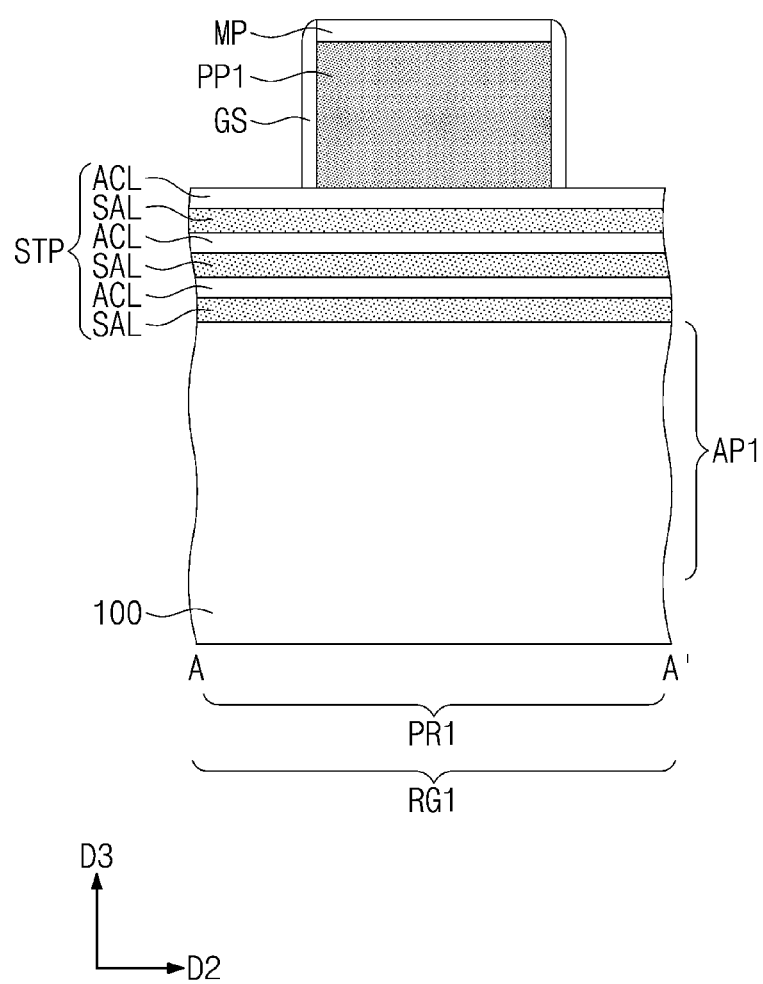
Figure 8B:
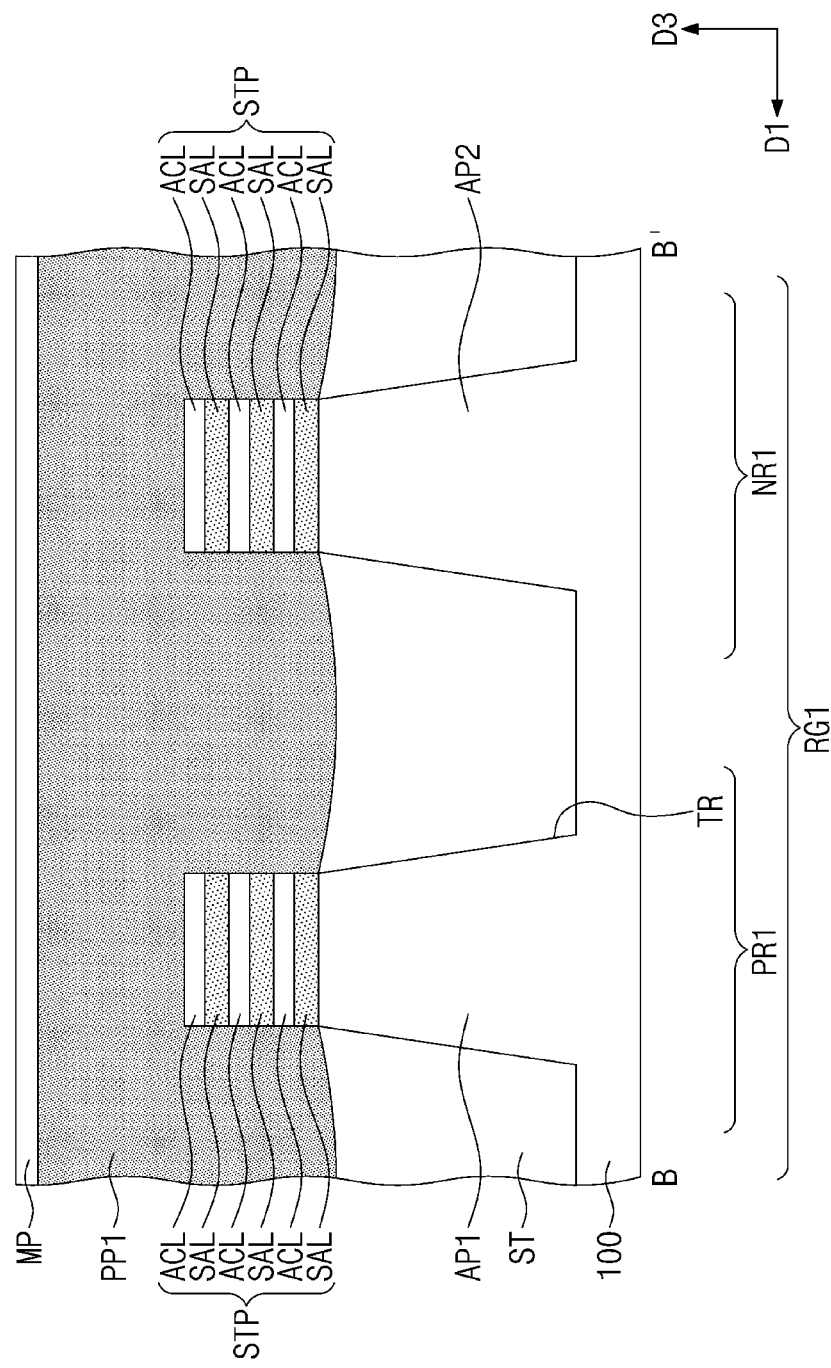
Figure 8C:
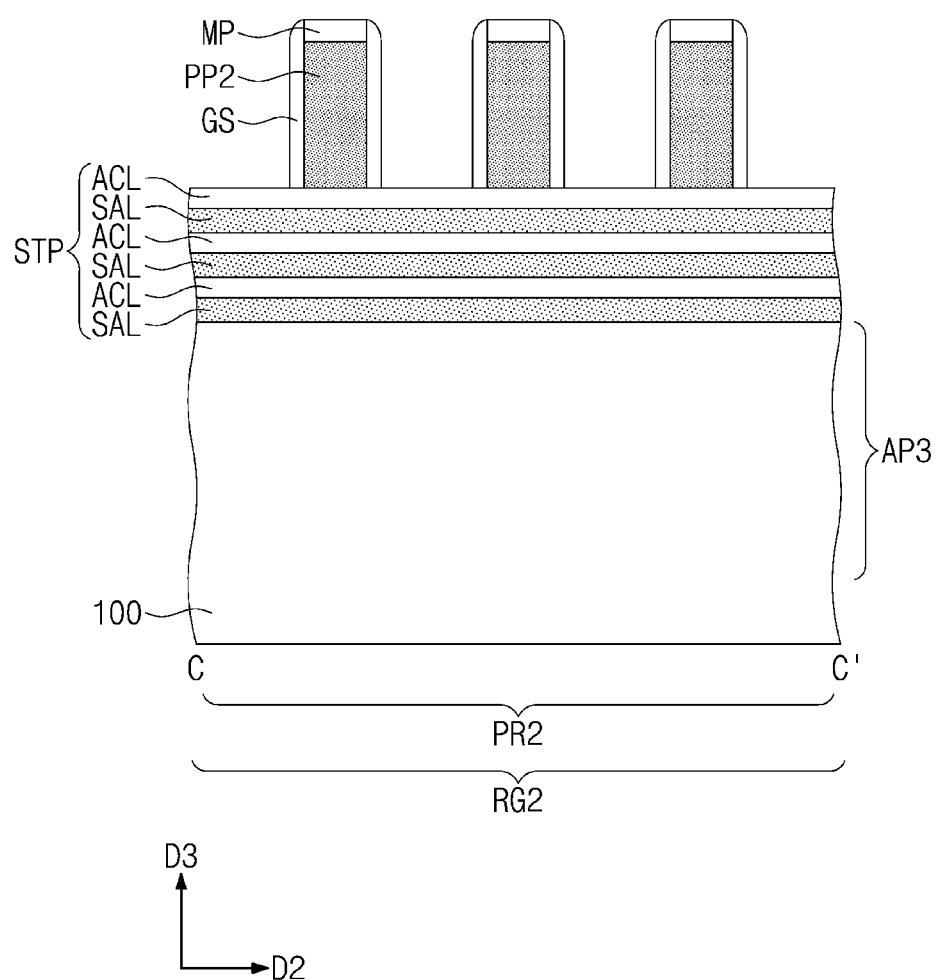
Figure 8D:
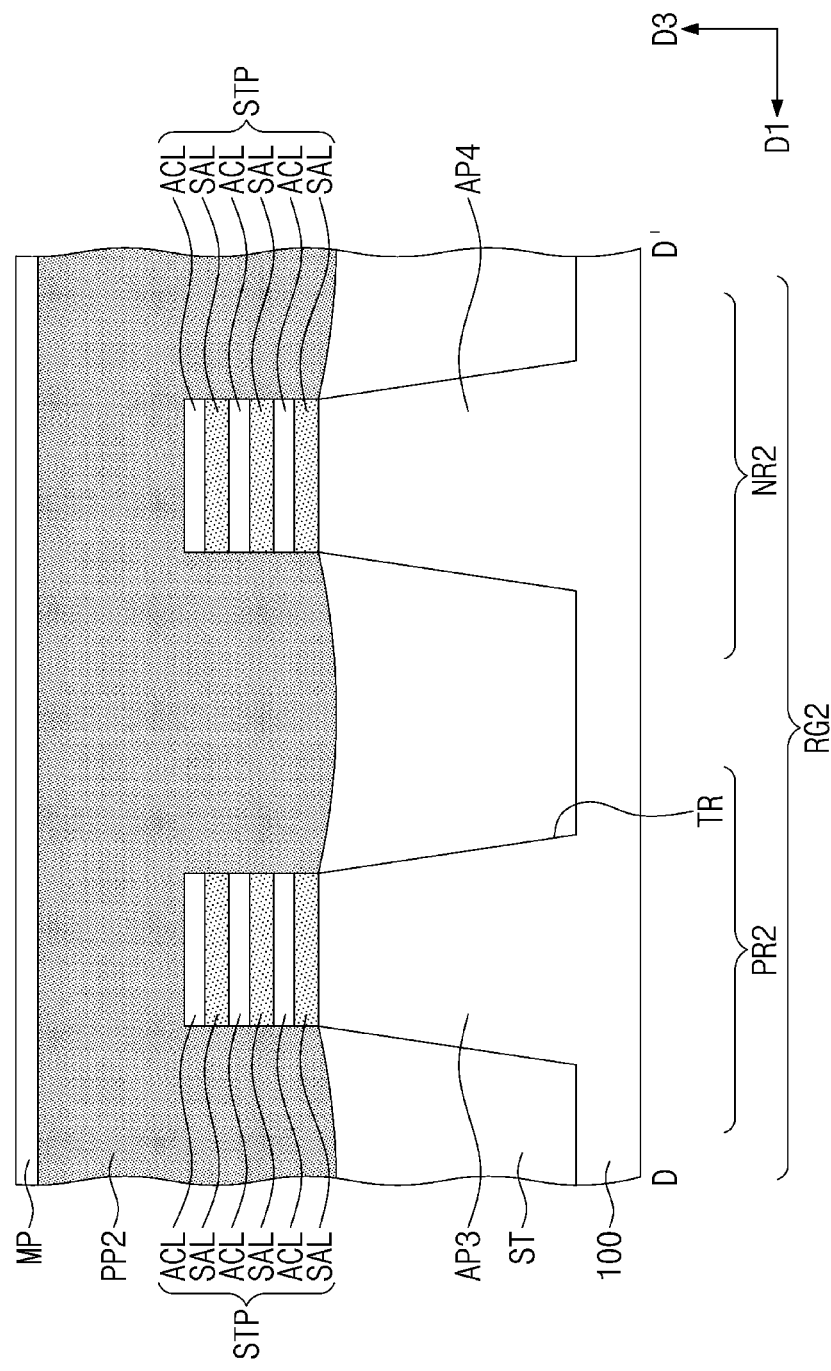
Figure 9:
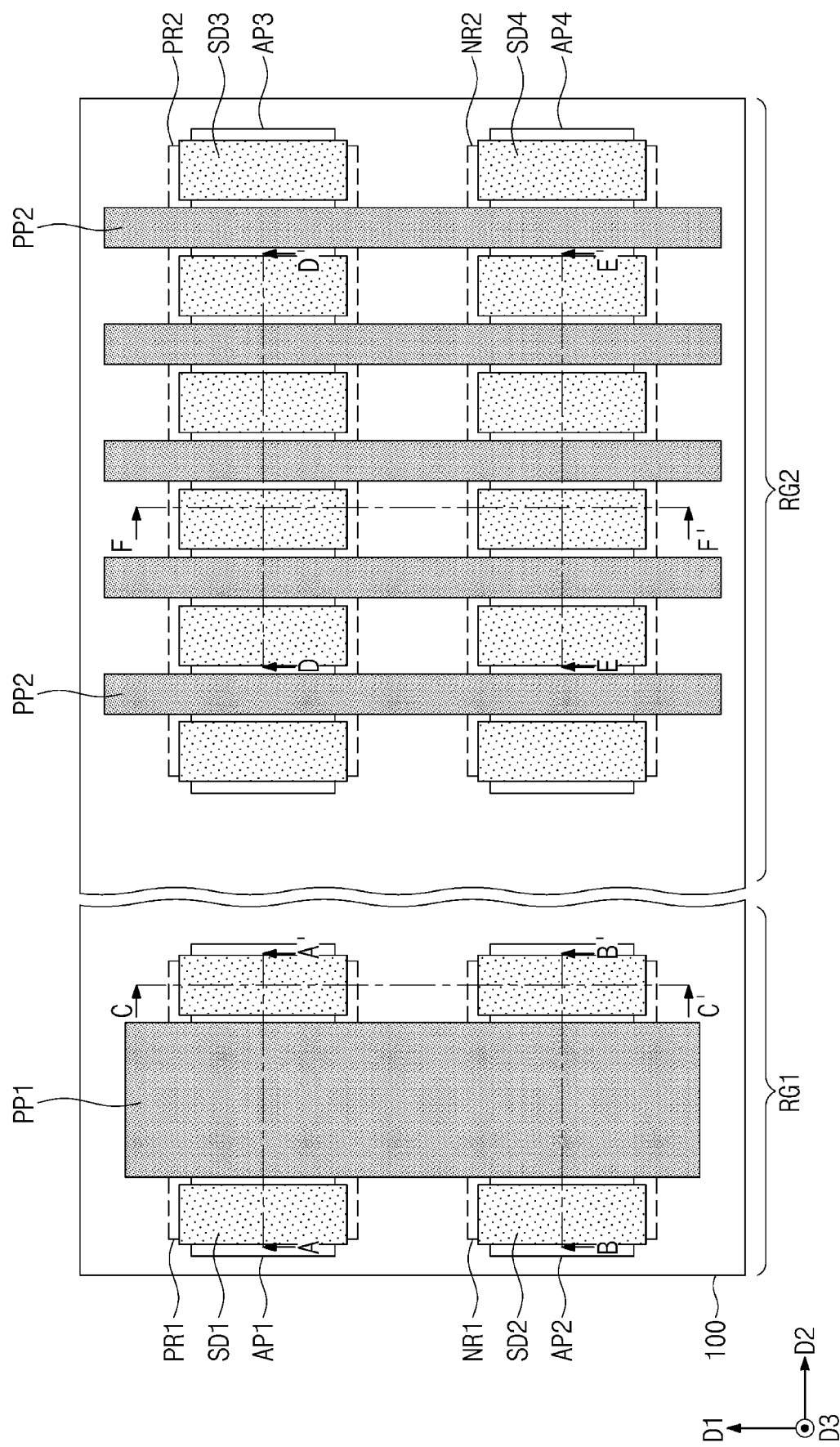

FIG. 4 illustrates an enlarged cross-sectional view showing section A of FIG. 3A. Referring to FIG. 4, the first gate dielectric layer GI1 may include a dipole element. The dipole element may be called a dipole inducing material. The dipole element may include lanthanum (La), aluminum (Al), or a combination thereof. For example, lanthanum (La), aluminum (Al), or a combination thereof may be contained as impurities in the first gate dielectric layer GI1. The first gate dielectric layer GI1 may contain, for example, lanthanum (La) as the dipole element.

The dipole element may cause the first gate dielectric layer GI1 to include a dipole-interface formed in the vicinity of the first high-k dielectric layer HK1 or the interface layer INL. When the first gate dielectric layer GI1 contains lanthanum (La), there may be a reduction in work function of the first gate electrode GE1. For example, the dipole element (e.g., La) may increase a threshold voltage of PMOS transistor. For example, the dipole element (e.g., La) may decrease a threshold voltage of NMOS transistor.

FIG. 4 depicts a concentration profile of the dipole element contained in the first gate dielectric layer GI1. A concentration of the dipole element may increase to a maximum value in a direction toward the interface layer INL from an interface between the first gate electrode GE1 and the first high-k dielectric layer HK1, and then may decrease in a direction toward an interface between the interface layer INL and the first semiconductor pattern SP1.

The dipole element may have a first concentration CN1 at the interface between the first gate electrode GE1 and the first high-k dielectric layer HK1. The dipole element may have a second concentration CN2 in the interface layer INL. The dipole element may have a third concentration CN3 at the interface between the interface layer INL and the first semiconductor pattern SP1. The second concentration CN2 may be a maximum concentration of the dipole element in the first gate dielectric layer GI1. The third concentration CN3 may be greater the first concentration CN1. The fifth thickness TK5 may be greater than the fourth thickness TK4.

As the dipole element is additionally included in the first gate dielectric layer GI1 according to the present embodiment, it may be possible to much easily control a threshold voltage of the EG device. As a result, a semiconductor device may improve in electrical properties.

Figure 3C:
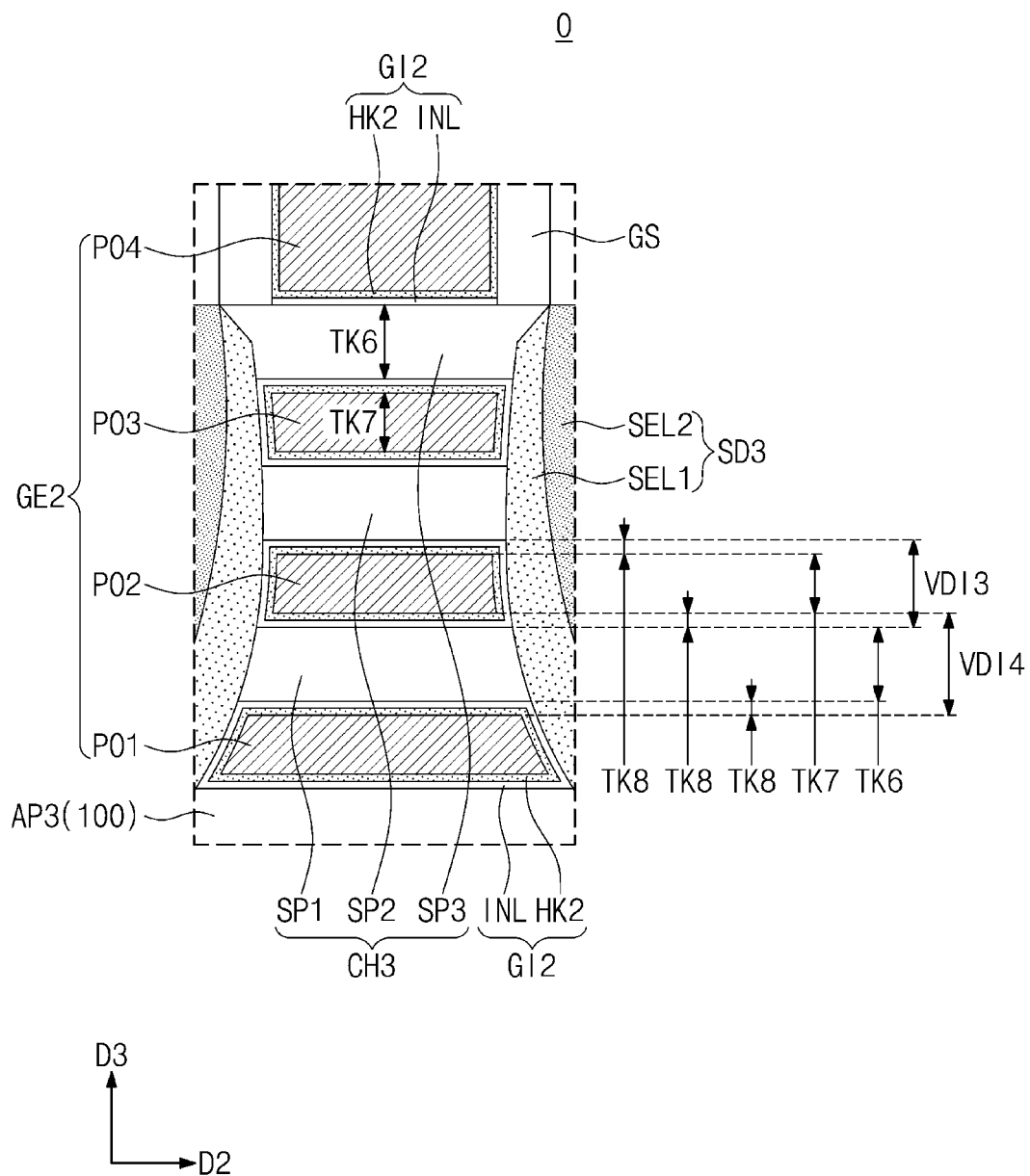
FIG. 3C illustrates an enlarged cross-sectional view showing section O of FIG. 2E.
Figure 3D:
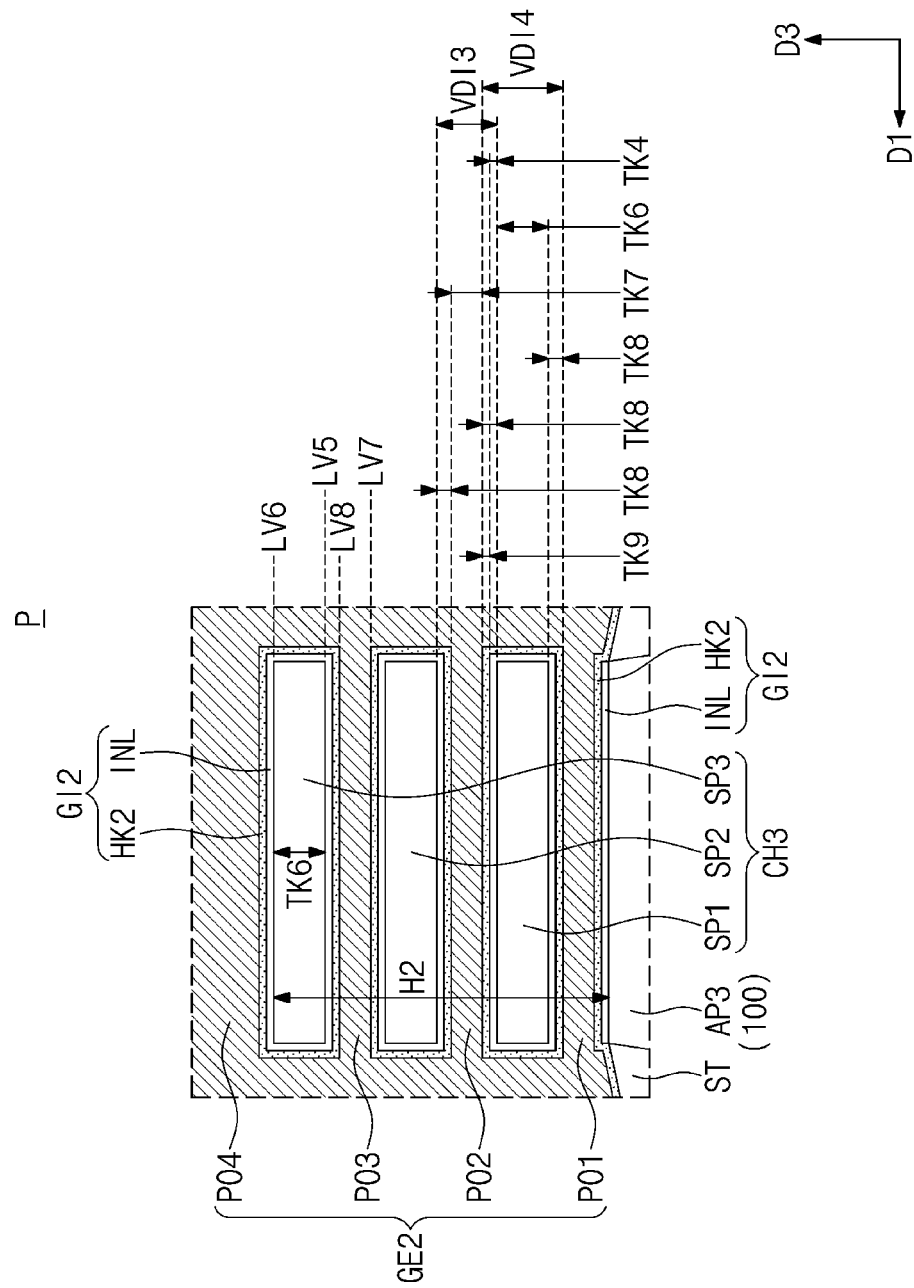
FIG. 3D illustrates an enlarged cross-sectional view showing section P of FIG. 2G.

The following description will focus on the third channel pattern CH3 and the second gate dielectric layer GI2 on the second region RG2. FIG. 3C illustrates an enlarged cross-sectional view showing section O of FIG. 2E. FIG. 3D illustrates an enlarged cross-sectional view showing section P of FIG. 2G.

Referring to FIGS. 3C and 3D, the second gate dielectric layer GI2 may surround each of the first, second and third semiconductor patterns SP1, SP2, and SP3 of the third channel pattern CH3. The second gate dielectric layer GI2 may include an interface layer INL and a second high-k dielectric layer HK2 that are sequentially stacked on a surface of each of the first, second and third semiconductor patterns SP1, SP2 and SP3. The interface layer INL of the second gate dielectric layer GI2 may be substantially the same as the interface layer INL of the first gate dielectric layer GI1 discussed above.

The second high-k dielectric layer HK2 may be in direct contact with the interface layer INL. The second high-k dielectric layer HK2 may include a high-k dielectric material of which a dielectric constant is high. The second high-k dielectric layer HK2 may include a material the same as or similar to that of the first high-k dielectric layer HK1. For example, the second high-k dielectric layer HK2 may include an oxide material such as hafnium oxide.

The second gate dielectric layer GI2 and the second gate electrode GE2 may fill a space between neighboring semiconductor patterns SP1, SP2 and SP3. A third vertical distance VDI3 may be defined to refer to a size of the space between neighboring semiconductor patterns SP1, SP2 and SP3 on the second region RG2, or as a distance in the third direction D3 between neighboring semiconductor patterns SP1, SP2 and SP3.

Each of the first, second and third semiconductor patterns SP1, SP2 and SP3 of the third channel pattern CH3 may have a sixth thickness TK6. The second gate dielectric layer GI2 may have an eighth thickness TK8. The eighth thickness TK8 may be a sum of thicknesses of the interface layer INL and the second high-k dielectric layer HK2. The thickness of the interface layer INL may be a fourth thickness TK4. The thickness of the second high-k dielectric layer HK2 may be a ninth thickness TK9. For example, the eighth thickness TK8 may be a sum of the fourth thickness TK4 and the ninth thickness TK9.

Each of the first, second and third parts PO1, PO2 and PO3 of the second gate electrode GE2 may fill an unoccupied portion of the space that is not fully filled with the second gate dielectric layer GI2. Each of the first, second and third parts PO1, PO2 and PO3 of the second gate electrode GE2 may have a seventh thickness TK7 in the third direction D3. The third vertical distance VDI3 may be given by an expression of 2×TK8+TK7. A fourth vertical distance VDI4 may be defined to refer to a distance in the third direction D3 between neighboring parts PO1, PO2, PO3 and PO4 of the second gate electrode GE2. The fourth vertical distance VDI4 may be given by an expression of 2×TK8+TK6.

The first thickness TK1 may be less than the sixth thickness TK6. For example, each of the first, second and third semiconductor patterns SP1, SP2 and SP3 of the first channel pattern CH1 may have a thickness less than that of each of the first, second and third semiconductor patterns SP1, SP2 and SP3 of the third channel pattern CH3. The second thickness TK2 may be substantially the same as the seventh thickness TK7. For example, a ratio of the seventh thickness TK7 to the second thickness TK2 may range from about 0.9 to about 1.1.

The third thickness TK3 may be greater than the eighth thickness TK8. For example, the first gate dielectric layer GI1 may have a thickness greater than that of the second gate dielectric layer GI2. The fifth thickness TK5 may be greater than the ninth thickness TK9. For example, the first high-k dielectric layer HK1 may have a thickness greater than that of the second high-k dielectric layer HK2. The first gate dielectric layer GI1 may include the interface layer INL of which the thickness is the same as that of the interface layer INL of the second gate dielectric layer GI2, and may include the first high-k dielectric layer HK1 of which the thickness is greater than that of the second high-k dielectric layer HK2.

As described above, the interface layers INL of the first and second gate dielectric layers GI1 and GI2 both may be formed of the same oxide material such as silicon oxide, and the first and second high-k dielectric layers HK1 and HK2 of the first gate dielectric layer of the first and second gate dielectric layers GI1 and GI2 both may be formed of another same oxide material such as hafnium oxide. Thus, it is noted that the EG device (or EG transistor) formed in the first region RG1 may have a thicker oxide layer to better prevent gate oxide breakdown than the SG device at least because the first high-k dielectric layer HK1 may be thicker than the second high-k dielectric layer.

The first vertical distance VDI1 may be greater than the third vertical distance VDI3. The second vertical distance VDI2 may be substantially the same as the fourth vertical distance VDI4. For example, a ratio of the fourth vertical distance VDI4 to the second vertical distance VDI2 may range from about 0.9 to about 1.1.

The third semiconductor pattern SP3 of the third channel pattern CH3 may have a bottom surface located at a fifth level LV5. The third semiconductor pattern SP3 of the third channel pattern CH3 may have a top surface located at a sixth level LV6. The third part PO3 of the second gate electrode GE2 may have a bottom surface located at a seventh level LV7. The third part PO3 of the second gate electrode GE2 may have a top surface located at an eighth level LV8. A second distance H2 may be given as a distance between the third active pattern AP3 and the top surface of the third semiconductor pattern SP3 included in the third channel pattern CH3. The second distance H2 may be defined to refer to a height of the third channel pattern CH3.

The first level LV1 may be positioned higher than the fifth level LV5. The second level LV2 may be positioned lower than the sixth level LV6. The third level LV3 may be positioned substantially the same as the seventh level LV7. The fourth level LV4 may be positioned substantially the same as the eighth level LV8. The description of the levels may be identically applicable to the first and second semiconductor patterns SP1 and SP2 of the first channel pattern CH1 and to the first and second semiconductor patterns SP1 and SP2 of the third channel pattern CH3. In addition, the description of the levels may also be identically applicable to the first and second parts PO1 and PO2 of the first gate electrode GE1 and to the first and second parts PO1 and PO2 of the second gate electrode GE2. The first distance H1 may be less than the second distance H2.

An EG device may be required to have a relatively thick first gate dielectric layer GI1, and thus, the first gate electrode GE1 may have difficulty in filling a space between the semiconductor patterns SP1, SP2 and SP3 under the limitation of the first vertical distance VDI1. When a height of the first channel pattern CH1 is increased to address the problem mentioned above, there may be a problem of increase in parasitic capacitance between the active contact AC and the first gate electrode GE1, and when a thickness of the first gate electrode GE1 between the semiconductor patterns SP1, SP2 and SP3 is reduced to address the problem mentioned above, there may be a difficulty in controlling a threshold voltage.

According to embodiments, each of the first, second and third semiconductor patterns SP1, SP2 and SP3 on the first region RG1 may have a thickness less than that of each of the first, second and third semiconductor patterns SP1, SP2 and SP3 on the second region RG2. For example, the first vertical distance VDI1 may be greater than the third vertical distance VDI3. Therefore, the first gate dielectric layer GI1 of the extra gate device may be formed thicker than the second gate dielectric layer GI2 of the single gate device, and thus a high breakdown voltage may be achieved and at the same time the first, second and third parts PO1, PO2 and PO3 of the first gate electrode GE1 may be formed to each have a thickness substantially the same as that of each of the first, second and third parts PO1, PO2 and PO3 of the second gate electrode GE2. A threshold voltage may be adjusted because a work-function metal is used to form the first, second and third parts PO1, PO2 and PO3 of each of the first and second gate electrodes GE1 and GE2. Therefore, it may be possible to easily control a threshold voltage of the EG device and a threshold voltage of the SG device. In addition, each of the first, second and third semiconductor patterns SP1, SP2 and SP3 on the first region RG1 may be formed to have a small thickness, and thus the first channel pattern CH1 may be formed to have a small height. Accordingly, there may be a reduction in parasitic capacitance between the active contact AC and the first gate electrode GE1. As a result, a semiconductor device may improve in reliability and electrical properties.

The second gate dielectric layer GI2 may include the dipole element discussed above. The second gate dielectric layer GI2 may include a dipole-interface formed between the second high-k dielectric layer HK2 and the interface layer INL. A concentration of the dipole-element in the second gate dielectric layer GI2 may have a maximum value in the interface layer INL.

Figure 10A:
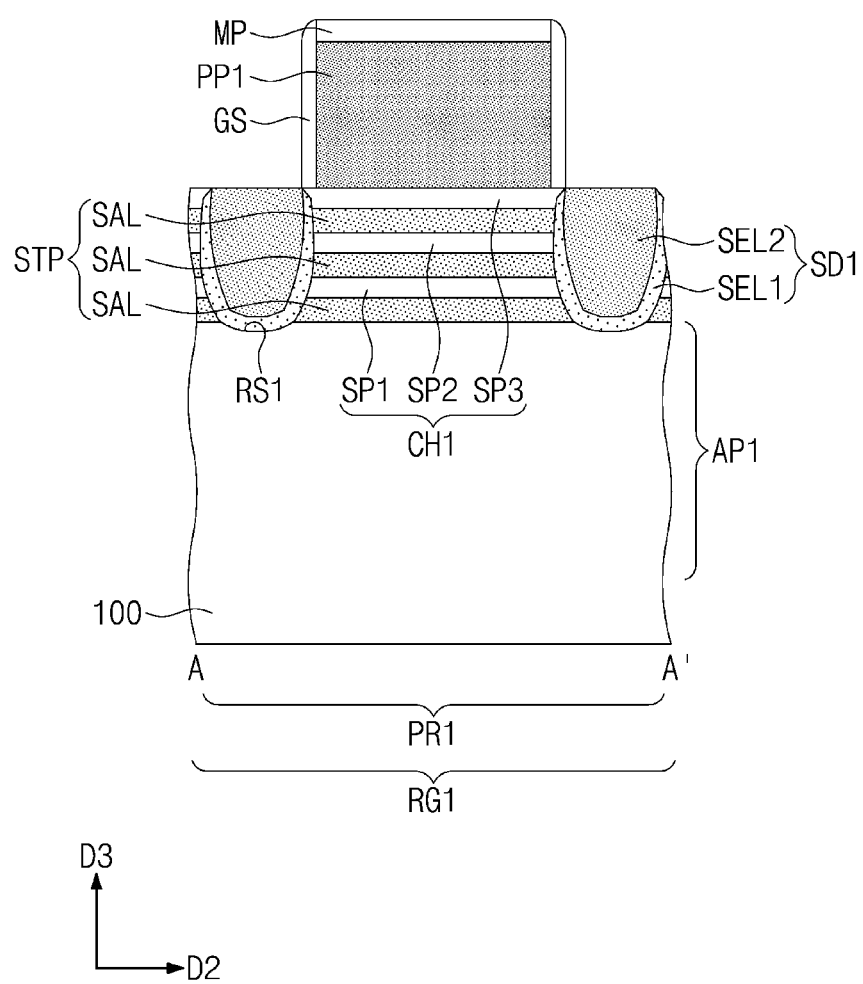
Figure 10B:
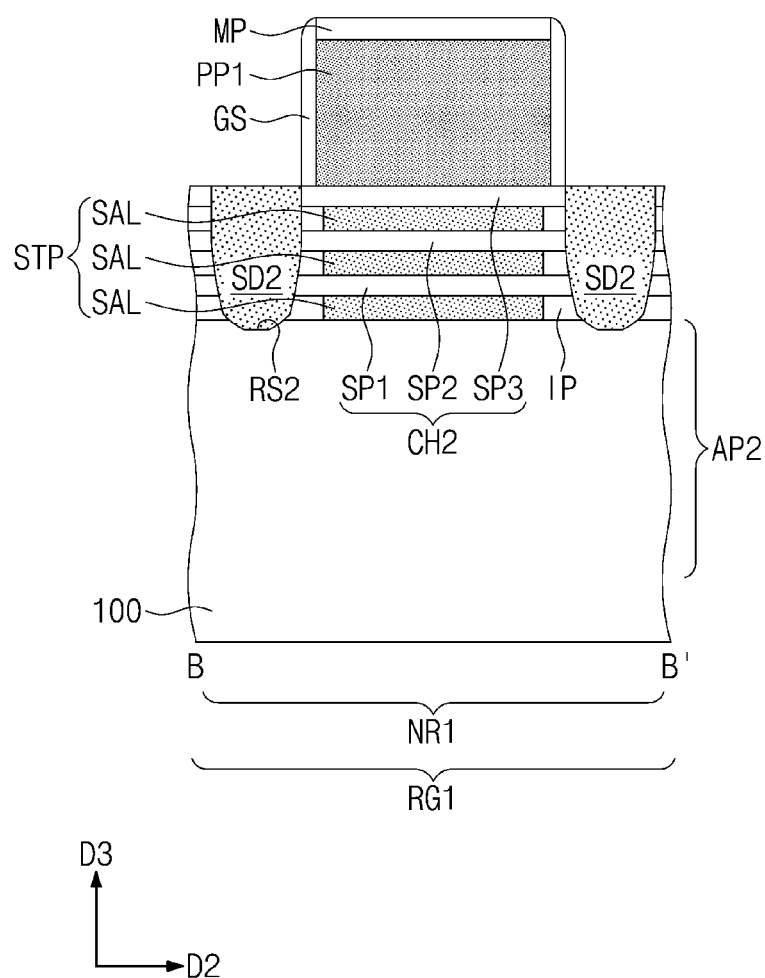
Figure 10C:
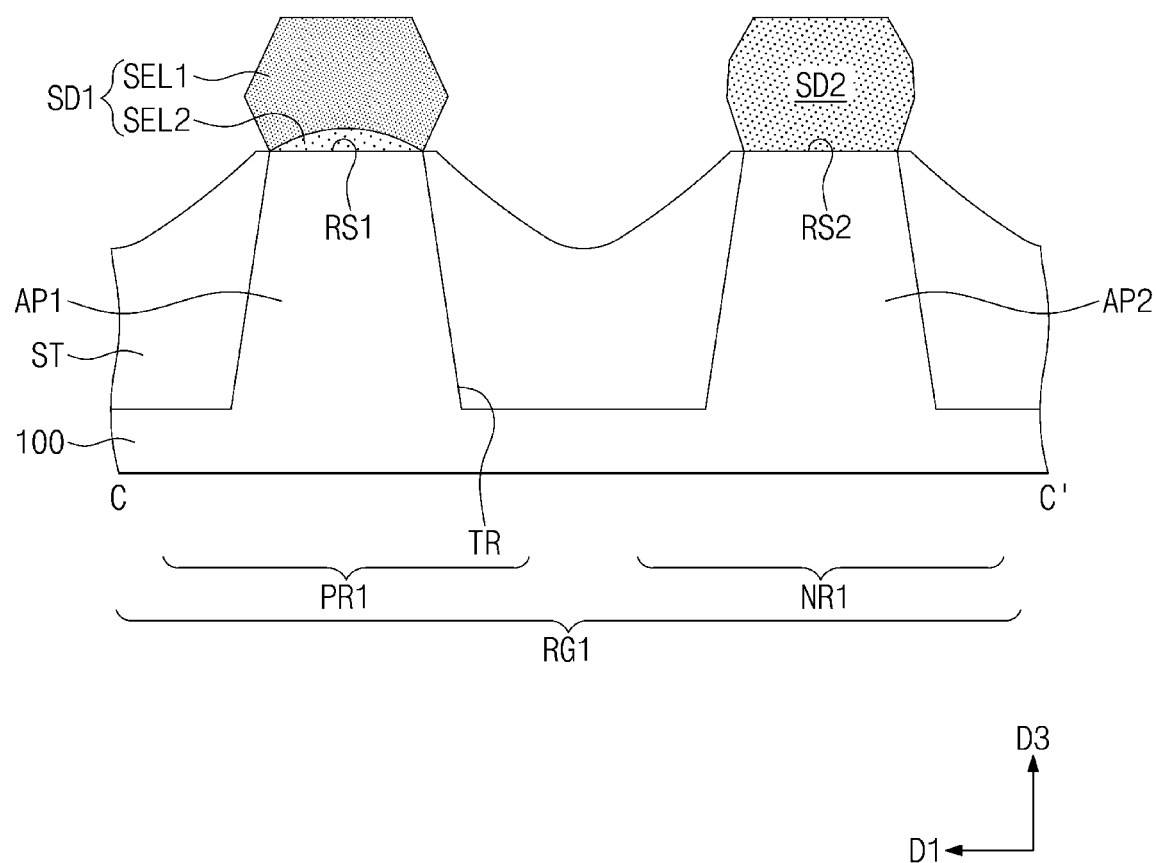
Figure 10D:
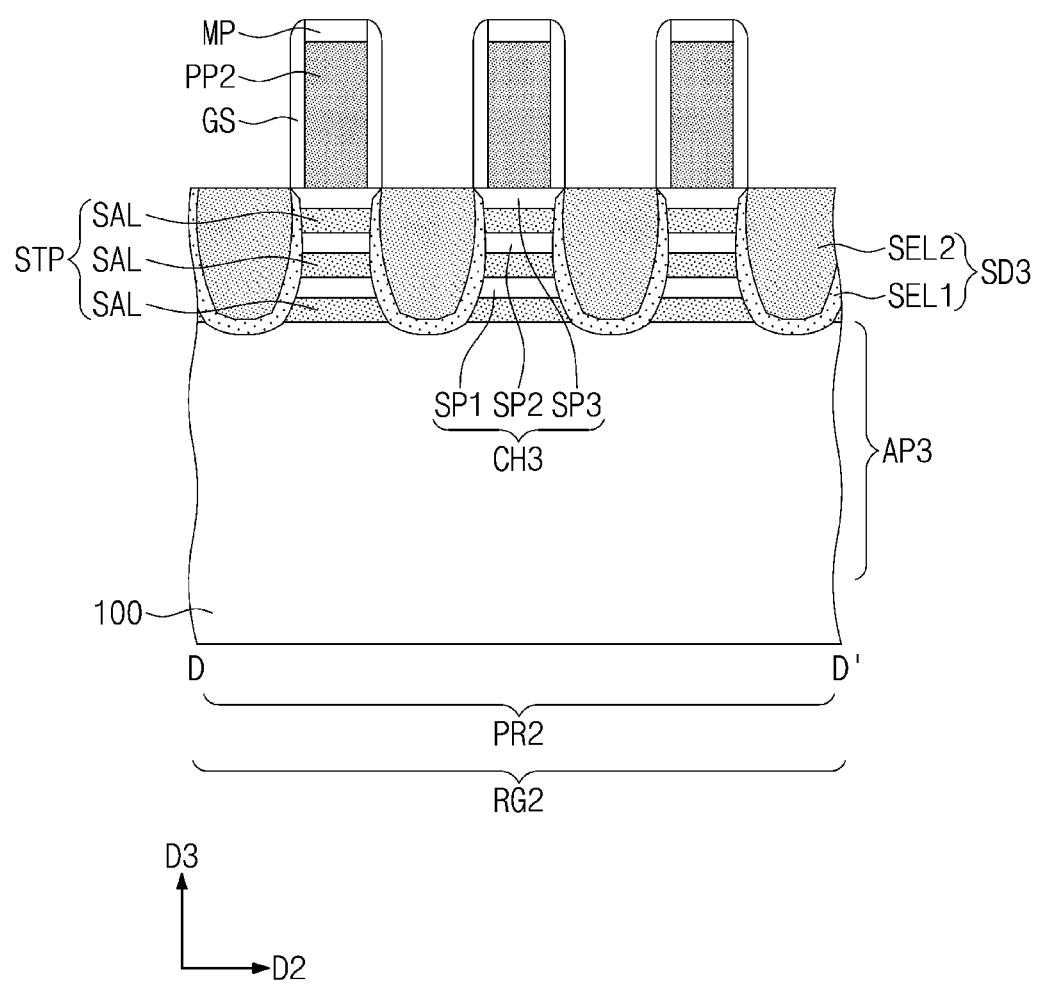
Figure 10E:
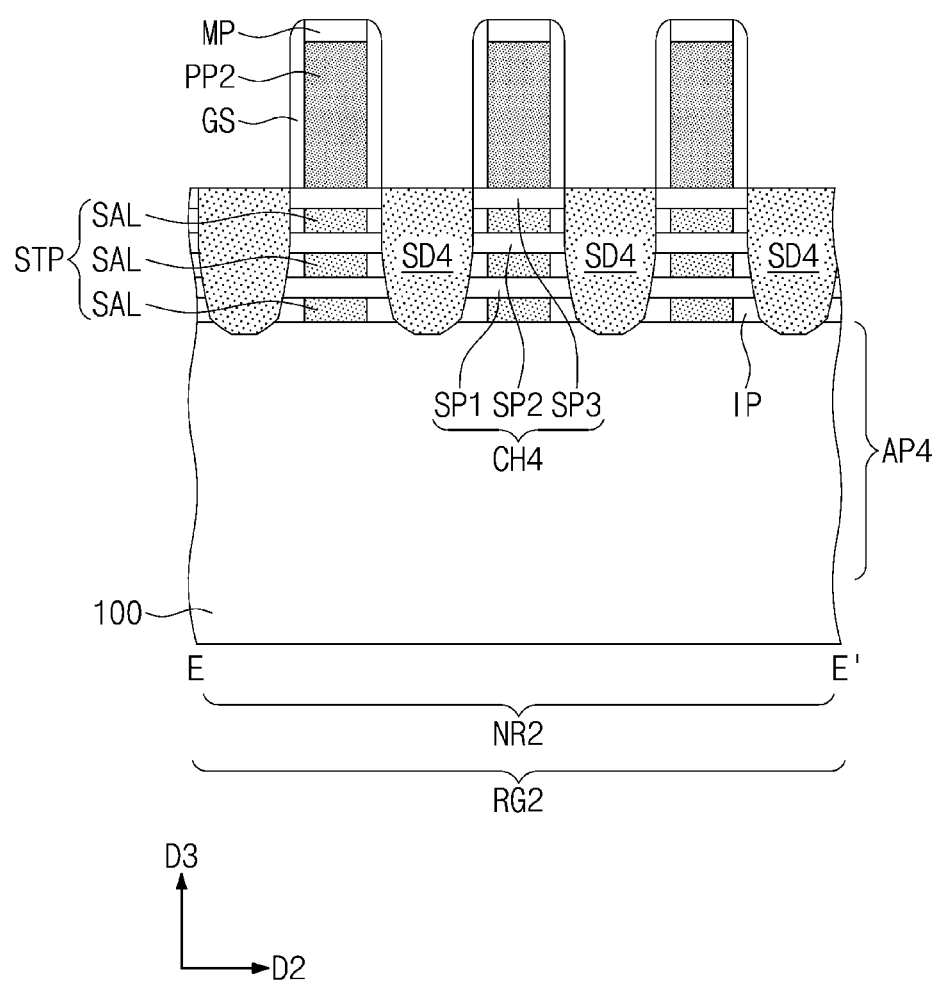
FIGS. 10E, 12E, and 15E illustrate cross-sectional views taken along line E-E' of FIGS. 9, 11, and 14, respectively.
Figure 10F:
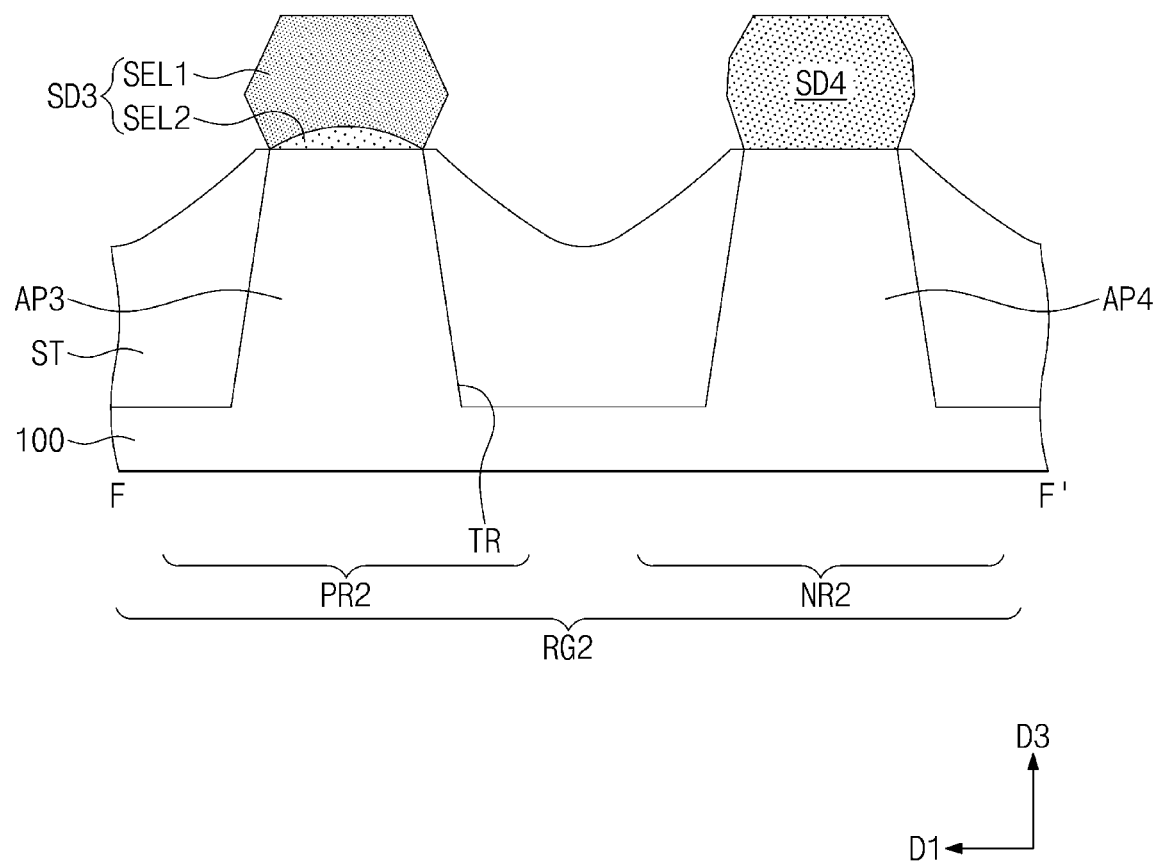
FIGS. 10F, 12F, and 15F illustrate cross-sectional views taken along line F-F' of FIGS. 9, 11, and 14, respectively.
Figure 11:
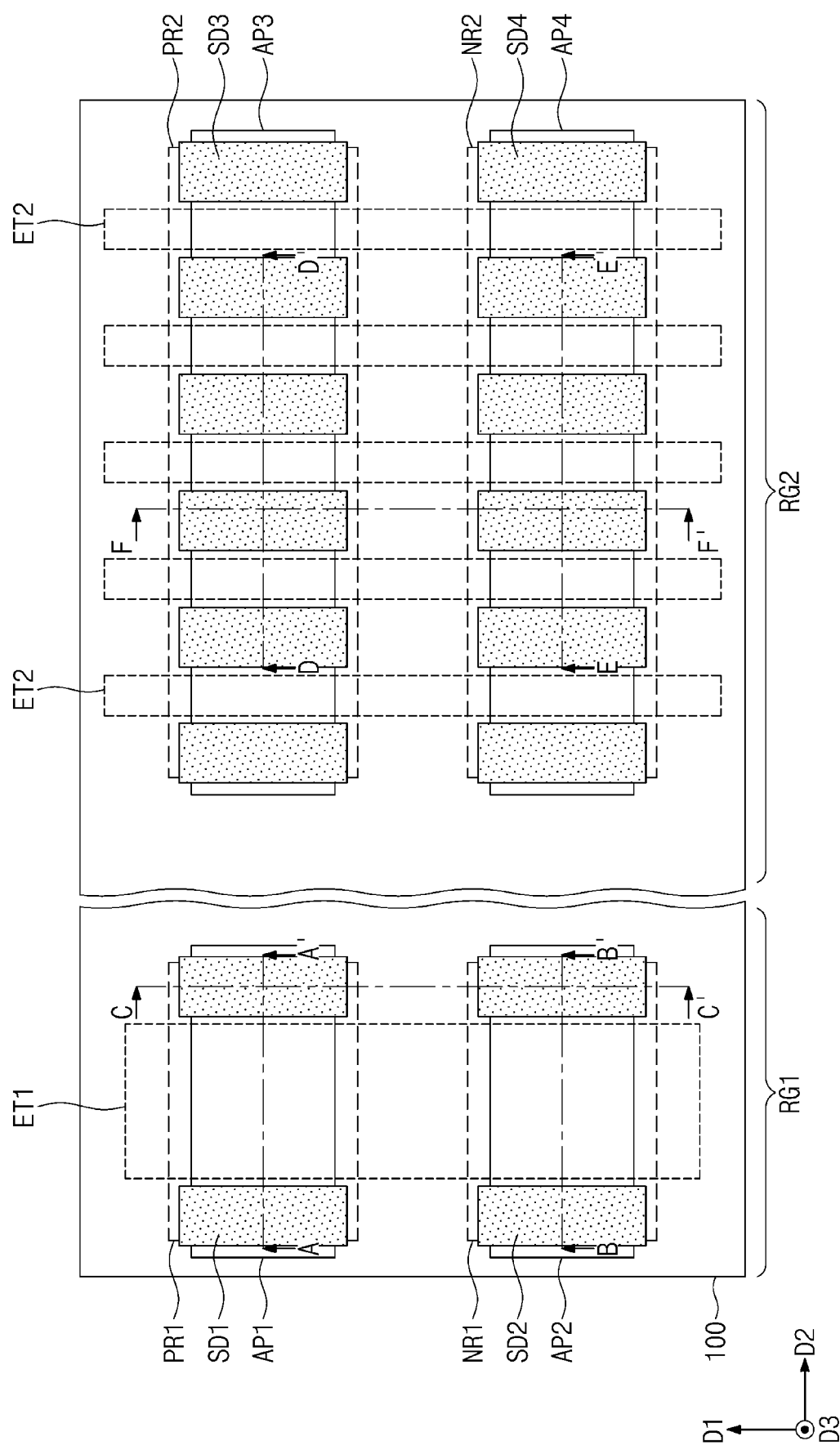
Figure 12A:
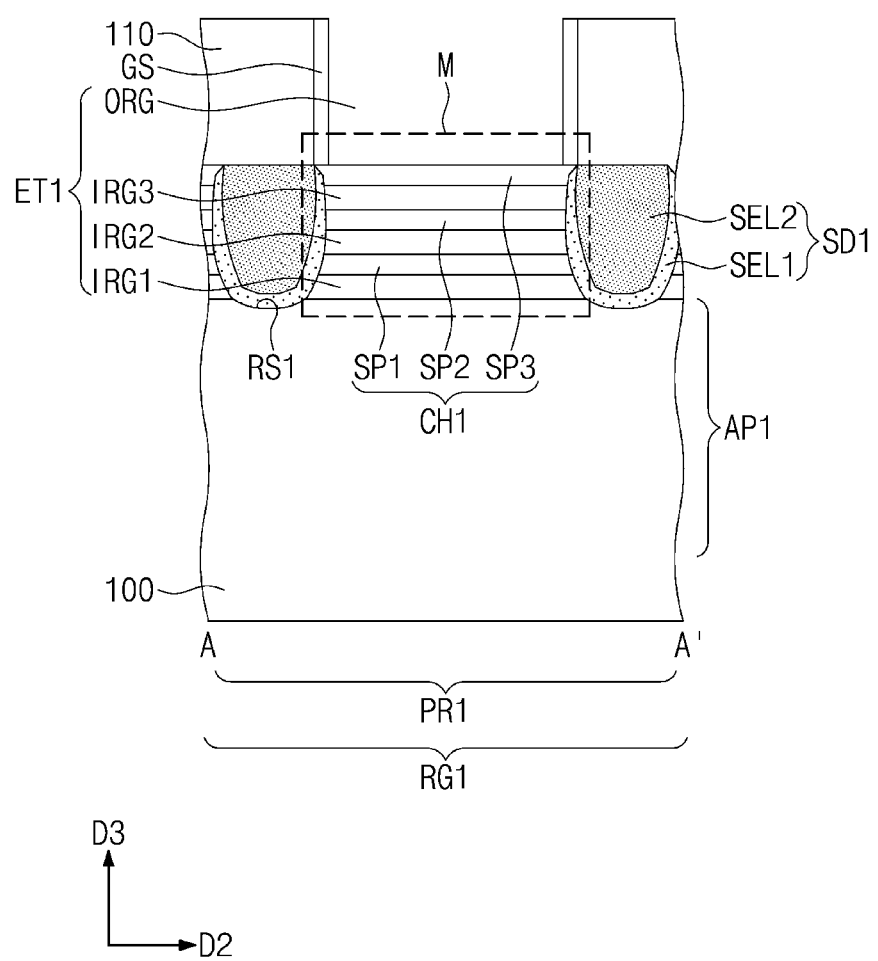
Figure 12B:
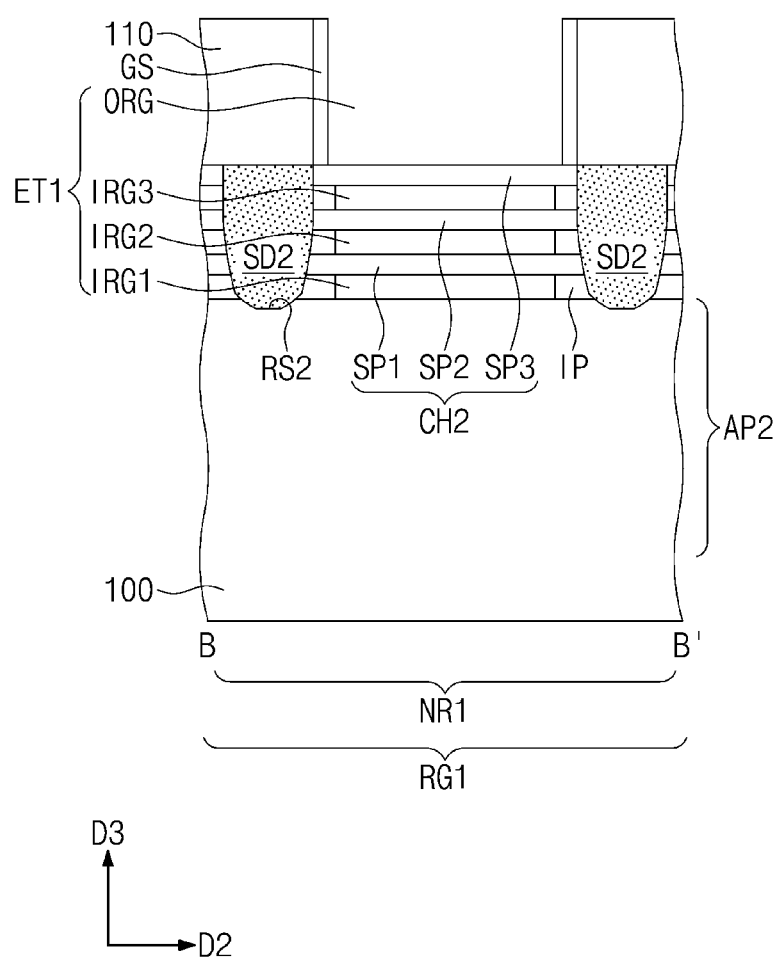
Figure 12C:
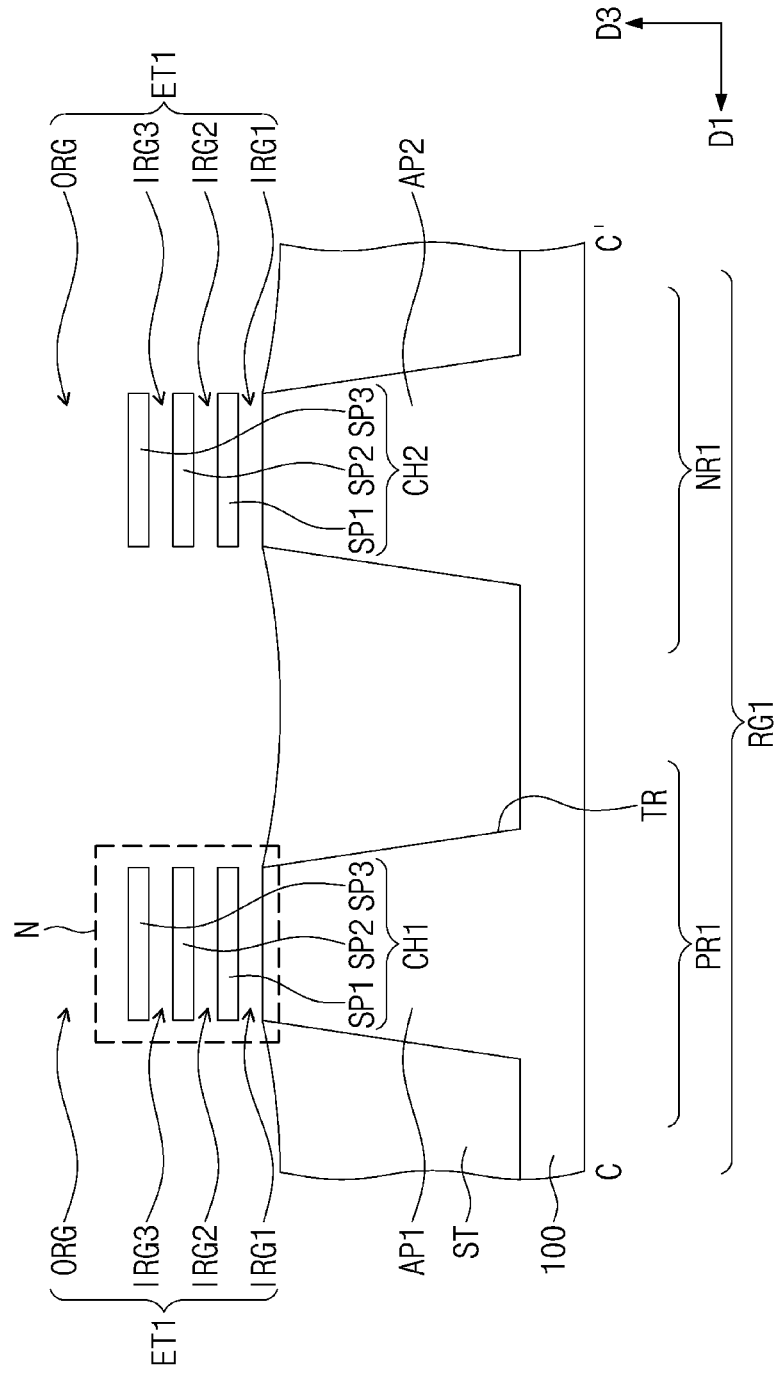
Figure 12D:
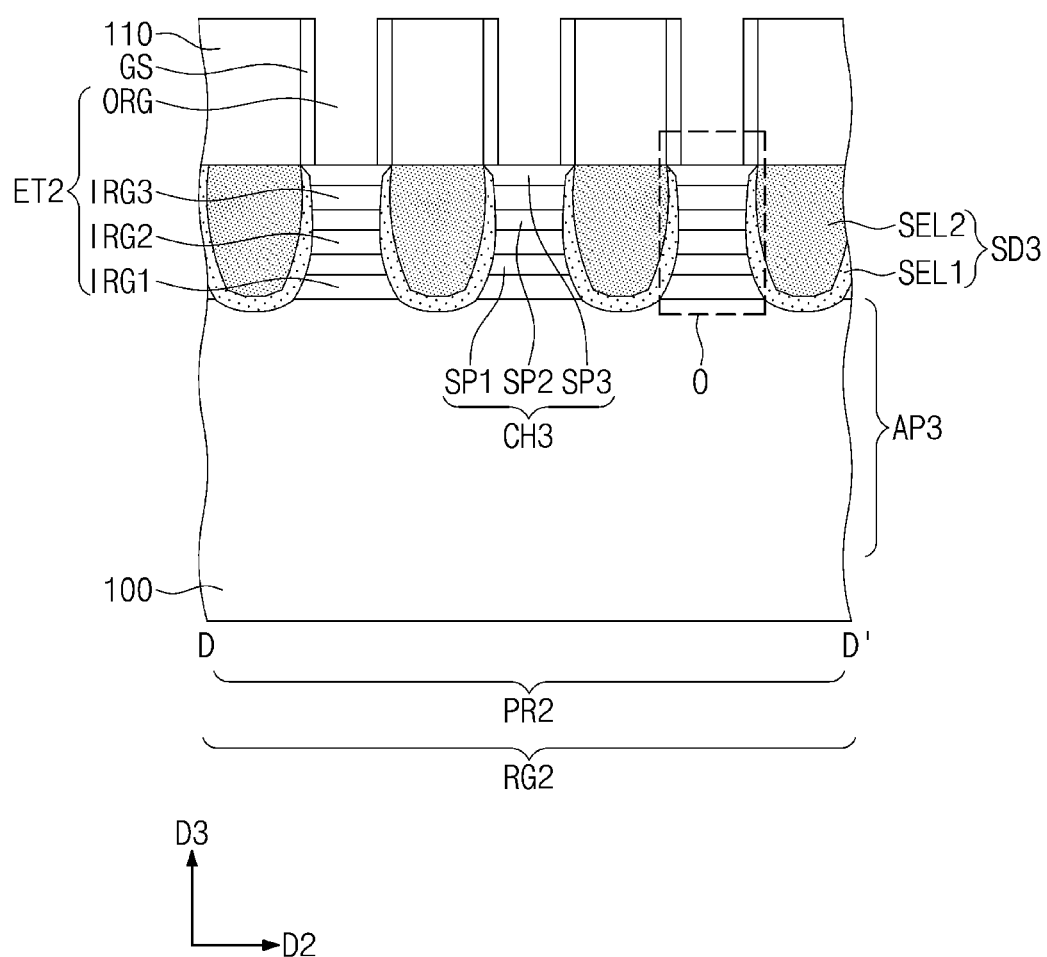
Figure 12E:
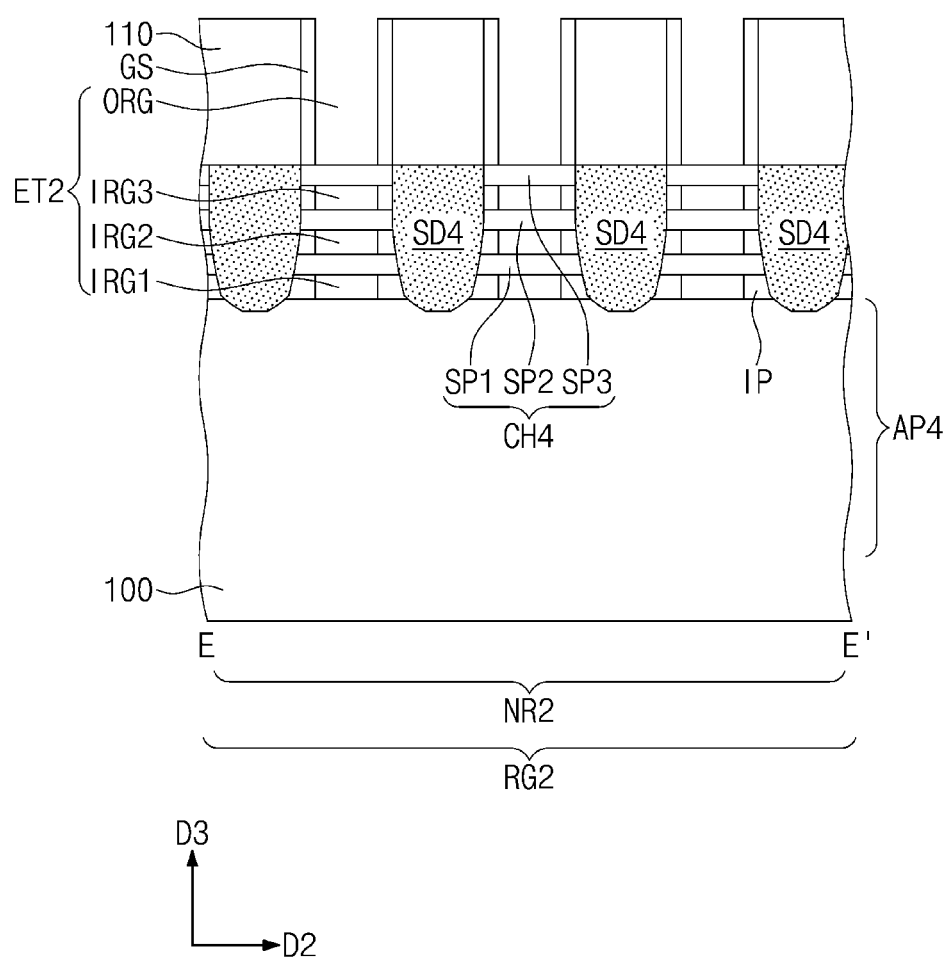
Figure 12F:
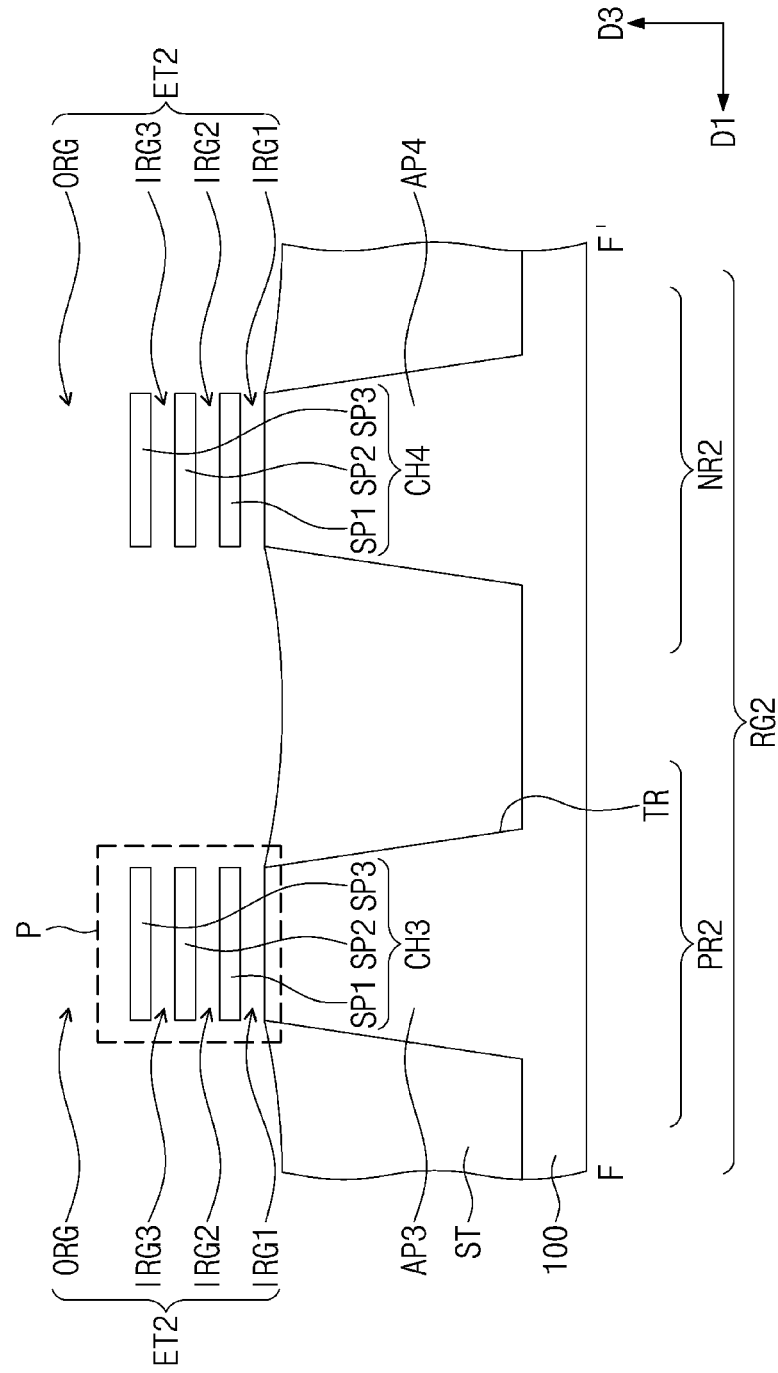
Figure 15A:
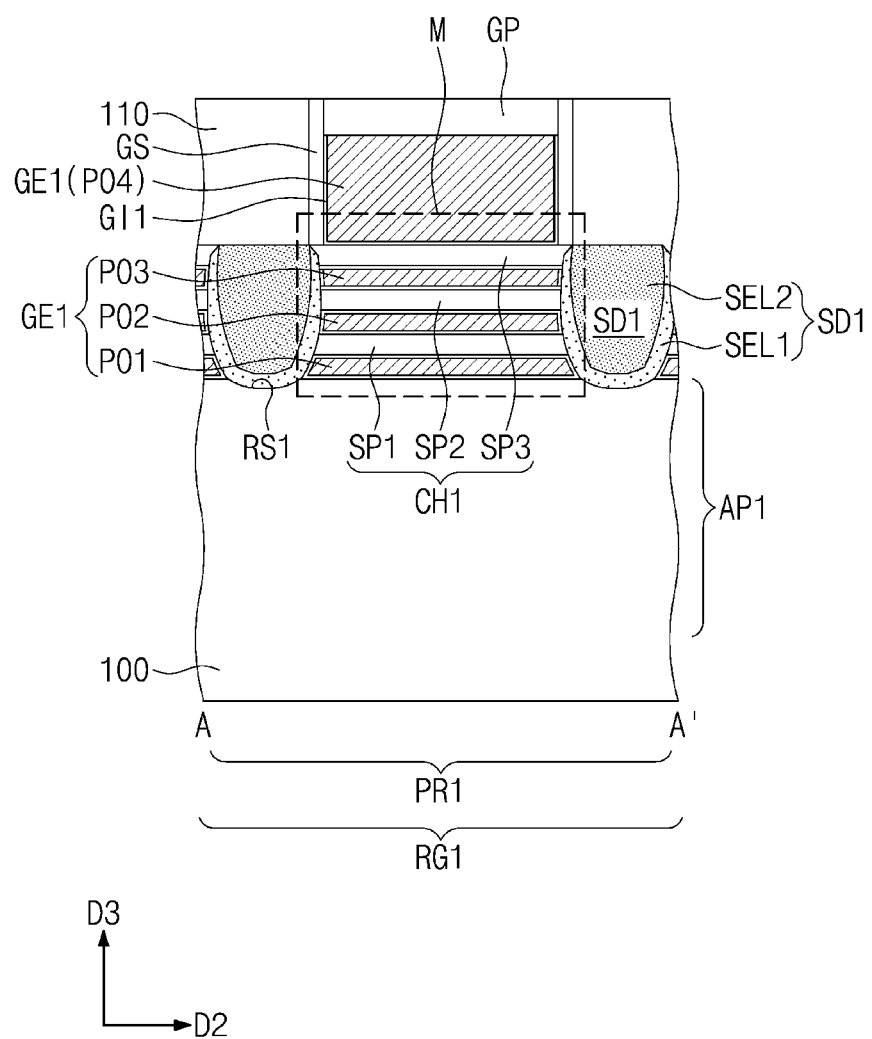
Figure 15B:
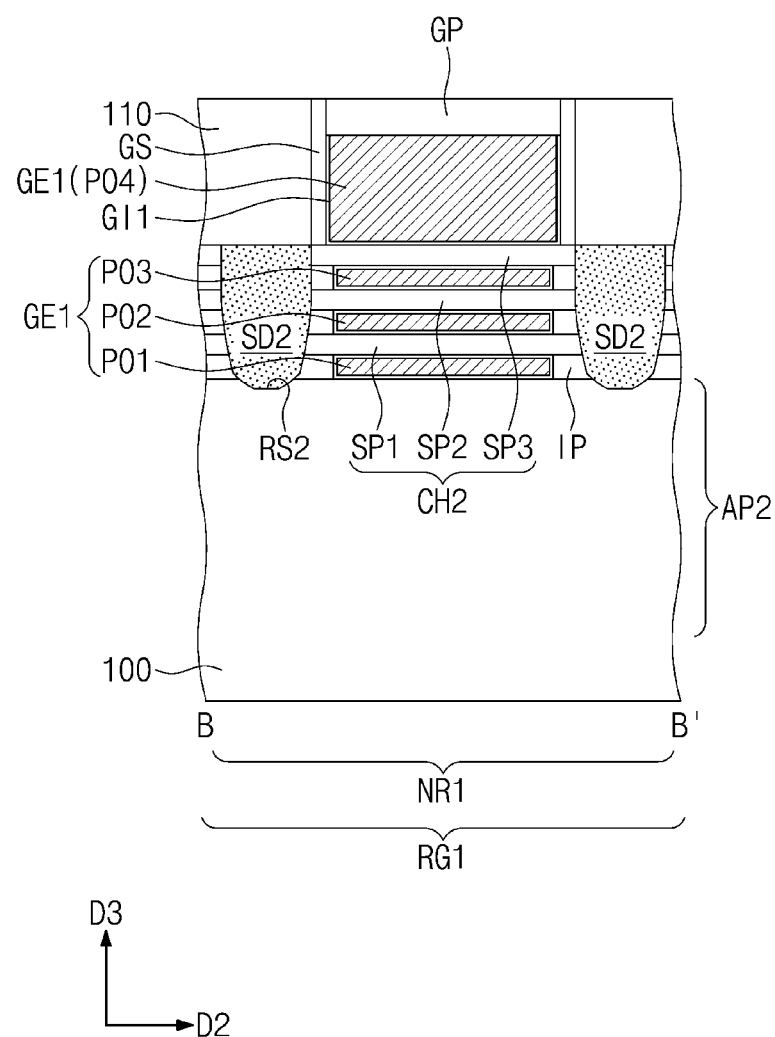
Figure 15C:
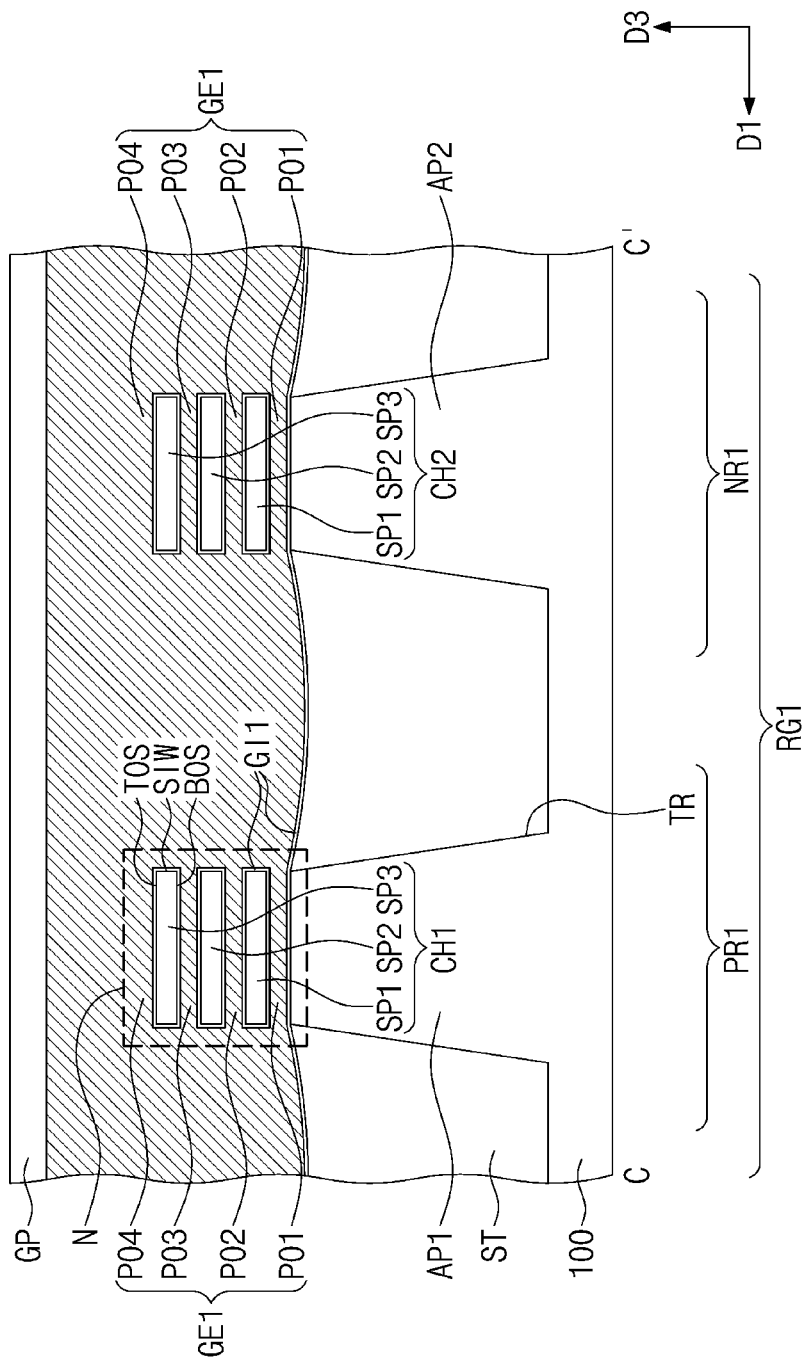
Figure 15D:
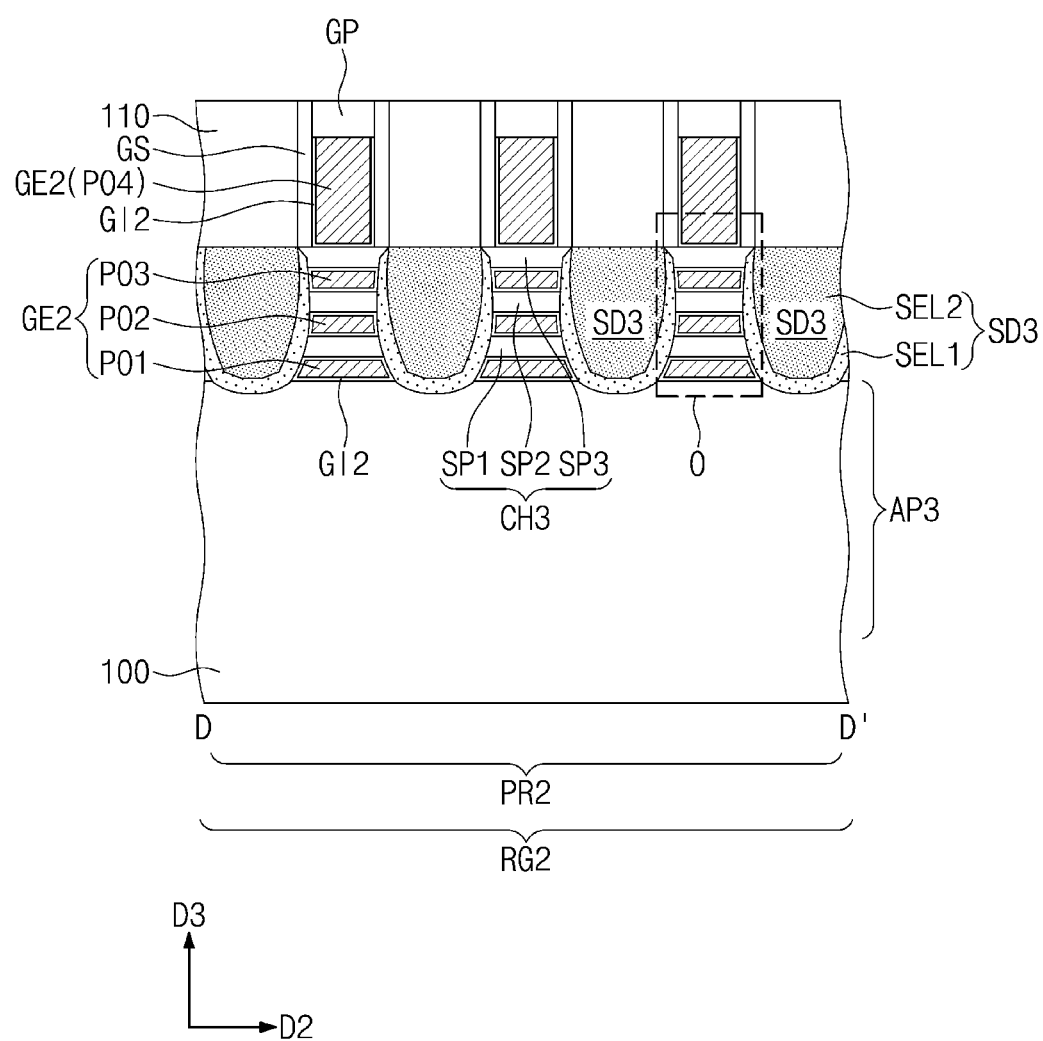
Figure 15E:
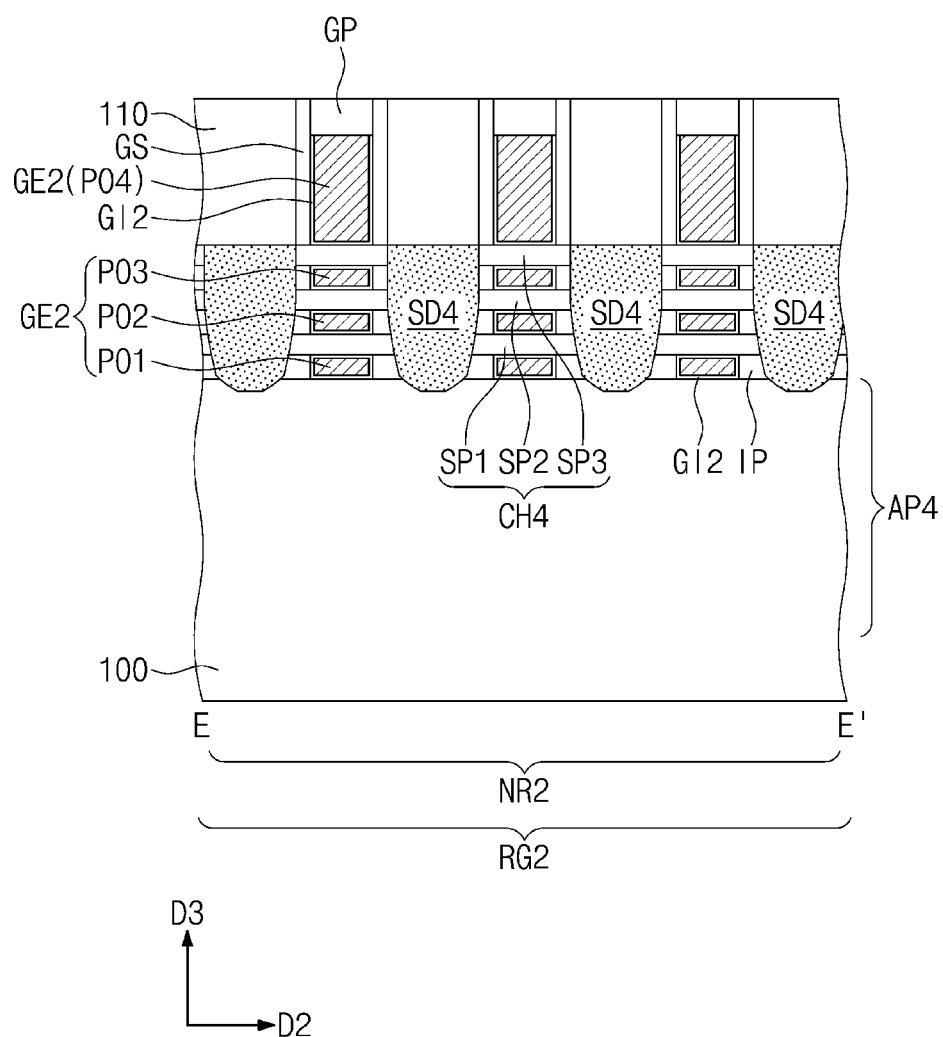
Figure 15F:
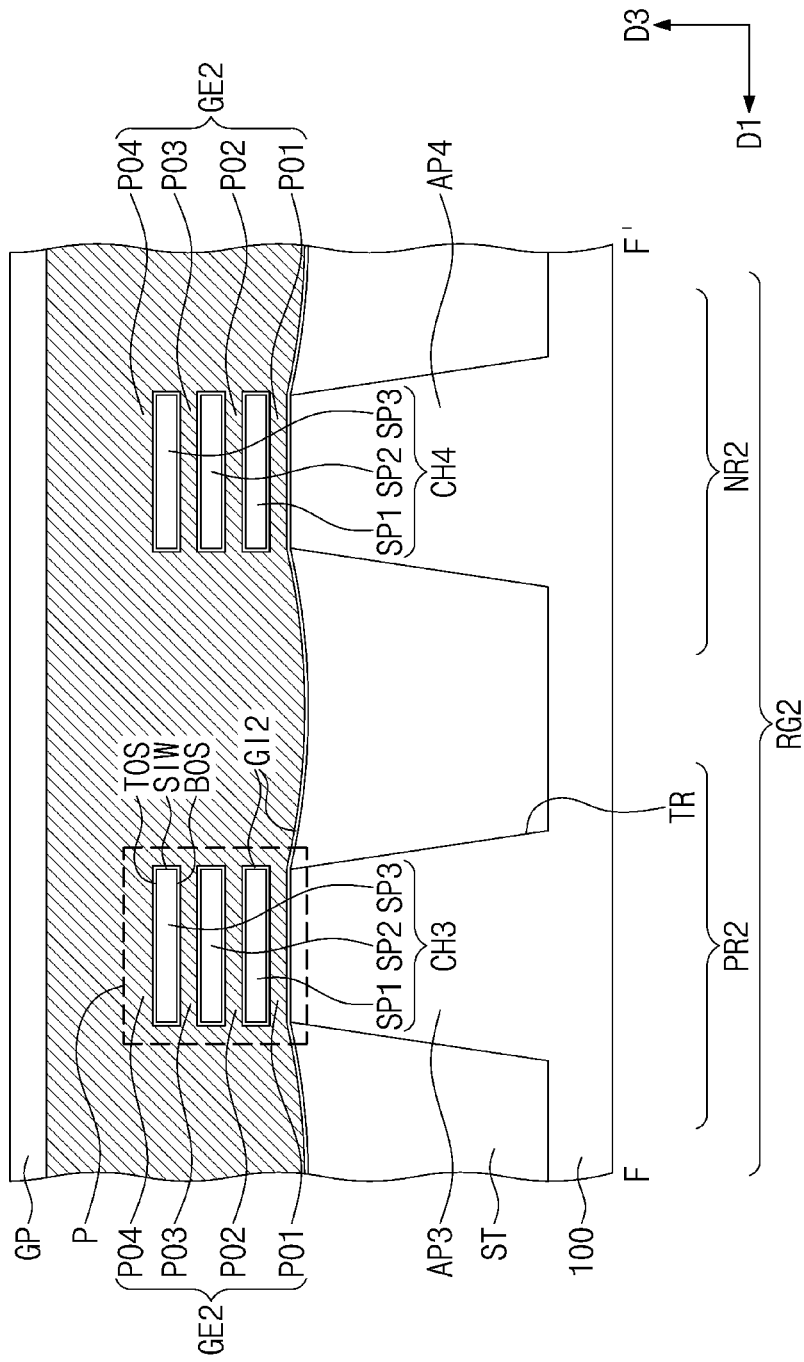

FIGS. 5, 7, 9, 11, and 14 illustrate plan views showing a method of manufacturing a semiconductor device, according to embodiments. FIGS. 6A, 8A, 10A, 12A, and 15A illustrate cross-sectional views taken along line A-A' of FIGS. 5, 7, 9, 11, and 14, respectively. FIGS. 6B, 8B, 10B, 12B, and 15B illustrate cross-sectional views taken along line B-B' of FIGS. 5, 7, 9, 11, and 14, respectively. FIGS. 6C, 8C, 10C, 12C, and 15C illustrate cross-sectional views taken along line C-C' of FIGS. 5, 7, 9, 11, and 14, respectively. FIGS. 6D, 8D, 10D, 12D, and 15D illustrate cross-sectional views taken along line D-D' of FIGS. 5, 7, 9, 11, and 14, respectively. FIGS. 10E, 12E, and 15E illustrate cross-sectional views taken along line E-E' of FIGS. 9, 11, and 14, respectively. FIGS. 10F, 12F, and 15F illustrate cross-sectional views taken along line F-F' of FIGS. 9, 11, and 14, respectively.

Referring to FIGS. 5 and 6A to 6D, a substrate 100 may be provided which includes a first region RG1 and a second region RG2. Sacrificial layers SAL and active layers ACL may be alternately formed and stacked on the substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe).

For example, the sacrificial layers SAL may include silicon-germanium (SiGe), and the active layers ACL may include silicon (Si). Each of the sacrificial layers SAL may have a germanium concentration of about 10 at % to about 30 at %.

A patterning process may be performed in which the first and second regions RG1 and RG2 of the substrate 100 are patterned to form trenches TR that define first to fourth active patterns AP1 to AP4. The first and second active patterns AP1 and AP2 may be formed on each of a first PMOS region PR1 and a first NMOS region NR1 on the first region RG1. The third and fourth active patterns AP3 and AP4 may be formed on each of a second PMOS region PR2 and a second NMOS region NR2 on the second region RG2.

A stack pattern STP may be formed on each of the first to fourth active patterns AP1 to AP4. The stack pattern STP may include the sacrificial layers SAL and the active layers ACL that are alternately stacked. During the patterning process, the stack pattern STP may be formed together with the first to fourth active patterns AP1 to AP4.

A device isolation layer ST may be formed to fill the trench TR. For example, a dielectric layer may be formed on an entire surface of the substrate 100, surrounding the first to fourth active patterns AP1 to AP4 and the stack patterns STP. The dielectric layer may be recessed until the stack patterns STP are exposed, and thus the device isolation layer ST may be formed.

The device isolation layer ST may include a dielectric material, such as a silicon oxide layer. The stack patterns STP may be exposed from the device isolation layer ST. For example, the stack patterns STP may vertically protrude upwards from the device isolation layer ST.

Referring to FIGS. 7 and 8A to 8D, on the first region RG1, a first sacrificial pattern PP1 may be formed to run across the stack patterns STP on the first and second active patterns AP1 and AP2. On the second region RG2, second sacrificial patterns PP2 may be formed to run across the stack patterns STP on the third and fourth active patterns AP3 and AP4. The first sacrificial pattern PP1 and the second sacrificial patterns PP2 may be formed to have their linear or bar shapes that extend in a first direction D1. The first sacrificial pattern PP1 may be formed to have a width greater than that of the second sacrificial pattern PP2. These sacrificial patterns may be referred to as dummy gate structures.

For example, the formation of the first and second sacrificial patterns PP1 and PP2 may include forming a sacrificial layer on an entire surface of the substrate 100, forming hardmask patterns MP on the sacrificial layer, and using the hardmask patterns MP as an etching mask to pattern the sacrificial layer. The sacrificial layer may include polysilicon.

According to embodiments, the patterning process for forming the first and second sacrificial patterns PP1 and PP2 may include a lithography process that uses an extreme ultraviolet (EUV) radiation. In this description, the EUV may mean an ultraviolet ray having a wavelength of about 4 nm to about 124 nm, narrowly about 4 nm to about 20 nm, and more narrowly about 13.5 nm. The EUV may denote light whose energy is in the range of about 6.21 eV to about 124 eV, for example, about 90 eV to about 95 eV.

The lithography process using the EUV may include exposure and development processes in which the EUV is irradiated onto a photoresist layer. For example, the photoresist layer may be an organic photoresist that contains an organic polymer such as polyhydroxystyrene. The organic photoresist may further include a photosensitive compound sensitive to the EUV. The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns. In a plan view, the photoresist patterns may have a linear shape that extends in one direction, an island shape, a zigzag shape, a honeycomb shape, or a circular shape, but the present inventive concepts are not limited to a particular example.

The photoresist patterns may be used as an etching mask to pattern one or more mask layers that are stacked thereunder, and thus the mask patterns MP may be formed as discussed above. The hardmask patterns MP may be used as an etching mask to pattern a target layer or the sacrificial layer to form on a wafer a plurality of patterns or the first and second sacrificial patterns PP1 and PP2.

As a comparative example, a multi-patterning technique (MPT) conventionally used requires the use of two or more photomasks to form fine-pitched patterns on a wafer. In contrast, when EUV lithography is performed according to embodiments, even a single photo-mask may form the first and second sacrificial patterns PP1 and PP2 having fine pitches.

For example, a value equal to or less than about 45 nm may be given as a minimum pitch between the first and second sacrificial patterns PP1 and PP2 that are formed by the EUV lithography process according to the present embodiment. The EUV lithography process may be performed to form the first and second sacrificial patterns PP1 and PP2 that are sophisticated and fine, even without the multi-patterning process.

According to embodiments, the EUV lithography process may be used to perform not only the patterning process for forming the first and second sacrificial patterns PP1 and PP2, but the patterning process for forming the first to fourth active patterns AP1 to AP4, and no limitation is imposed on the EUV lithography process.

A pair of gate spacers GS may be formed on opposite sidewalls of each of the first and second sacrificial patterns PP1 and PP2. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

Referring to FIGS. 9 and 10A to 10F, first to fourth source/drain patterns SD1 to SD4 may be respectively formed on the first to fourth active patterns AP1 to AP4. For example, the first source/drain patterns SD1 may be formed on an upper portion of the first active pattern AP1. A pair of first source/drain patterns SD1 may be formed on opposite sides of the first sacrificial pattern PP1.

For example, the hardmask patterns MP and the gate spacers GS may be used as an etching mask to etch the stack pattern STP on the first active pattern AP1 to form first recessions RS1. While the stack pattern STP is etched, the device isolation layer ST may be recessed (see FIG. 10C). The active layers ACL of the stack pattern STP may be formed into first, second and third semiconductor patterns SP1, SP2 and SP3 that are sequentially stacked between neighboring first recessions RS1. A first channel pattern CH1 may be formed by the first, second and third semiconductor patterns SP1, SP2 and SP3 between neighboring first recessions RS1.

A first selective epitaxial growth (SEG) process may be performed in which an inner wall of the first recession RS1 of the stack pattern STP is used as a seed layer to form a first semiconductor layer SEL1. The first semiconductor layer SEL1 may be grown from seeds, or the substrate 100 and the first, second and third semiconductor patterns SP1, SP2 and SP3 exposed to the first recession RS1. For example, the first SEG process may include chemical vapor deposition (CVD) or molecular beam epitaxy (MBE).

The first semiconductor layer SEL1 may include a semiconductor element (e.g., SiGe) of which a lattice constant is greater than that of a semiconductor element of the substrate 100. The first semiconductor layer SEL1 may contain germanium (Ge) of which concentration is relatively low. In embodiments, the first semiconductor layer SEL1 may include silicon (Si) without germanium (Ge). The first semiconductor layer SEL1 may have a germanium concentration of about 0 at % to about 10 at %.

The first semiconductor layer SEL1 may undergo a second selective epitaxial growth (SEG) process to form a second semiconductor layer SEL2. The second semiconductor layer SEL2 may be formed to completely fill the first recession RS1. The second semiconductor layer SEL2 may contain germanium (Ge) of which concentration is relatively high. For example, the second semiconductor layer SEL2 may have a germanium concentration of about 30 at % to about 70 at %.

The first semiconductor layer SEL1 and the second semiconductor layer SEL2 may form the first source/drain pattern SD1. Impurities may be in-situ implanted during the first and second SEG processes. Alternatively, after the first source/drain pattern SD1 is formed, impurities may be implanted into the first source/drain pattern SD1. The first source/drain pattern SD1 may be doped have a first conductivity type (e.g., p-type).

The second source/drain patterns SD2 may be formed on an upper portion of the second active pattern AP2. A pair of second source/drain patterns SD2 may be formed on opposite sides of the first sacrificial pattern PP1. The formation of the second source/drain patterns SD2 may define a second channel pattern CH2 that includes first, second and third semiconductor patterns SP1, SP2 and SP3 between the pair of second source/drain patterns SD2.

For example, the hardmask patterns MP and the gate spacers GS may be used as an etching mask to etch the stack pattern STP on the second active pattern AP2 to form second recessions RS2. A selective epitaxial growth process may be performed such that an inner wall of the second recession RS2 of the stack pattern STP may be used as a seed layer to form the second source/drain pattern SD2. For example, the second source/drain patterns SD2 may include the same semiconductor element (e.g., Si) as that of the substrate 100. The second source/drain patterns SD2 may be doped to have a second conductivity type (e.g., n-type).

Before the formation of the second source/drain pattern SD2, the sacrificial layers SAL exposed through the second recession RS2 may be partially removed. A dielectric material may fill areas where the sacrificial layers SAL are partially removed, thereby forming an inner spacer IP.

The formation of the third source/drain patterns SD3 in the stack pattern STP on the third active pattern AP3 may be substantially the same as the formation of the first source/drain patterns SD1 discussed above. The first source/drain patterns SD1 and the third source/drain patterns SD3 may be formed at the same time. The formation of the third source/drain patterns SD3 may define a third channel pattern CH3 that includes first, second and third semiconductor patterns SP1, SP2 and SP3 between a pair of third source/drain patterns SD3.

The formation of the fourth source/drain patterns SD4 in the stack pattern STP on the fourth active pattern AP4 may be substantially the same as the formation of the second source/drain patterns SD2 discussed above. The second source/drain patterns SD2 and the fourth source/drain patterns SD4 may be formed at the same time. The formation of the fourth source/drain patterns SD4 may define a fourth channel pattern CH4 that includes first, second and third semiconductor patterns SP1, SP2 and SP3 between a pair of fourth source/drain patterns SD4. Before the formation of the fourth source/drain patterns SD4, an inner spacer IP may be formed.

Referring to FIGS. 11 and 12A to 12F, a first interlayer dielectric layer 110 may be formed on the first to fourth source/drain patterns SD1 to SD4, the hardmask patterns MP, and the gate spacers GS. For example, the first interlayer dielectric layer 110 may include a silicon oxide layer.

The first interlayer dielectric layer 110 may be planarized until top surfaces of the first and second sacrificial patterns PP1 and PP2 are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the first and second sacrificial patterns PP1 and PP2 and those of the gate spacers GS.

The first and second sacrificial patterns PP1 and PP2 may be selectively removed. The removal of the first sacrificial pattern PP1 may form an outer region ORG that exposes the first and second channel patterns CH1 and CH2. The removal of the second sacrificial patterns PP2 may form an outer region ORG that exposes the third and fourth channel patterns CH3 and CH4. The removal of the first and second sacrificial patterns PP1 and PP2 may include performing a wet etching process that uses an etchant capable of selectively etching polysilicon.

The sacrificial layers SAL exposed to the outer region ORG may be selectively removed to form first to third inner regions IRG1 to IRG3. For example, an etching process that selectively etches the sacrificial layers SAL may be performed such that only the sacrificial layers SAL may be removed, and such that the first, second and third semiconductor patterns SP1, SP2 and SP3 may remain. The etching process may have a higher etch rate with respect to silicon-germanium of which germanium concentration is relatively high. For example, the etching process may have a high etch rate with respect to silicon-germanium whose germanium concentration is greater than about 10 at %.

During the etching process, the sacrificial layers SAL may be removed from the first and second regions RG1 and RG2. The etching process may be a wet etching process. The etching material used for the etching process may promptly etch the sacrificial layer SAL of which germanium concentrate is relatively high. During the etching process, each of the first and third source/drain patterns SD1 and SD3 may be protected by the first semiconductor layer SEL1 whose germanium concentration is relatively low.

As the sacrificial layers SAL are selectively removed, the first, second and third semiconductor patterns SP1, SP2 and SP3 may remain stacked on each of the first to fourth active patterns AP1 to AP4. The removal of the sacrificial layers SAL may form the first, second and third inner regions IRG1, IRG2, and IRG3. For example, the first inner region IRG1 may be formed between the first semiconductor pattern SP1 and one of the active patterns AP1 to AP4, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

A first empty space ET1 may be formed by the outer region ORG and the first, second and third inner regions IRG1, IRG2, and IRG3 on the first region RG1. The first empty space ET1 may expose the first, second and third semiconductor patterns SP1, SP2 and SP3 of each of the first and second channel patterns CH1 and CH2. A second empty space ET2 may be formed by the outer region ORG and the first, second and third inner regions IRG1, IRG2, and IRG3 on the second region RG2. The second empty space ET2 may expose the first, second and third semiconductor patterns SP1, SP2 and SP3 of each of the third and fourth channel patterns CH3 and CH4.

Figure 13A:
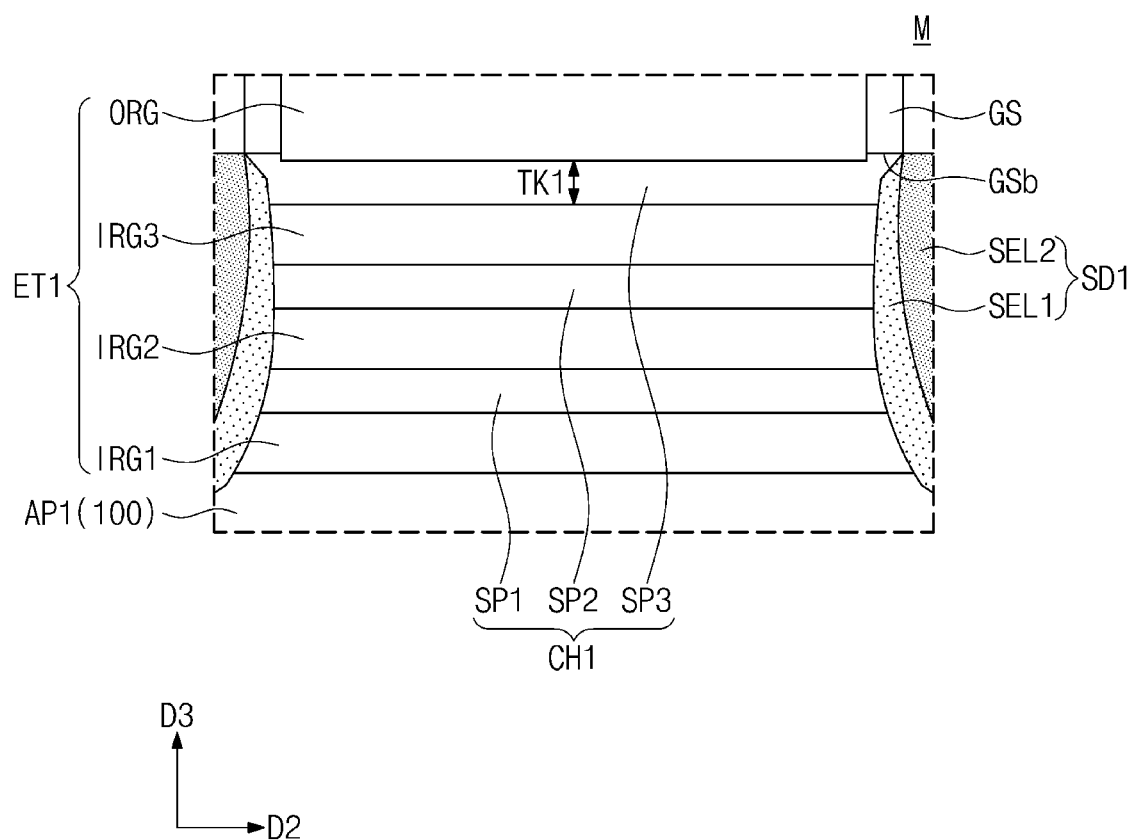
FIGS. 13A to 13D illustrate cross-sectional views showing a method of forming first to third semiconductor patterns according to embodiments.
Figure 13B:
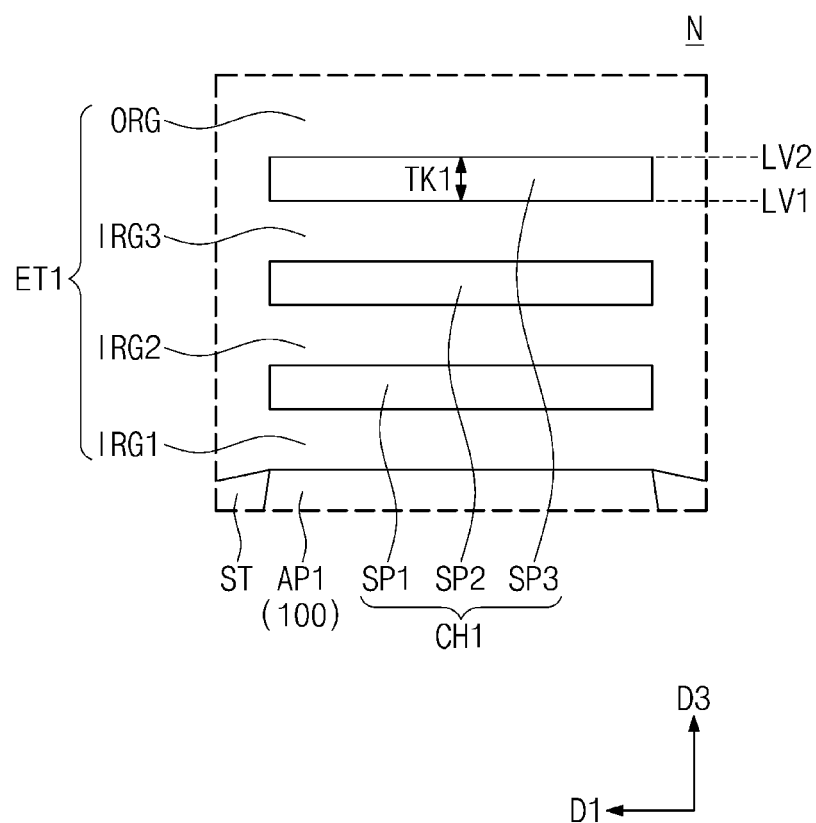
Figure 13C:
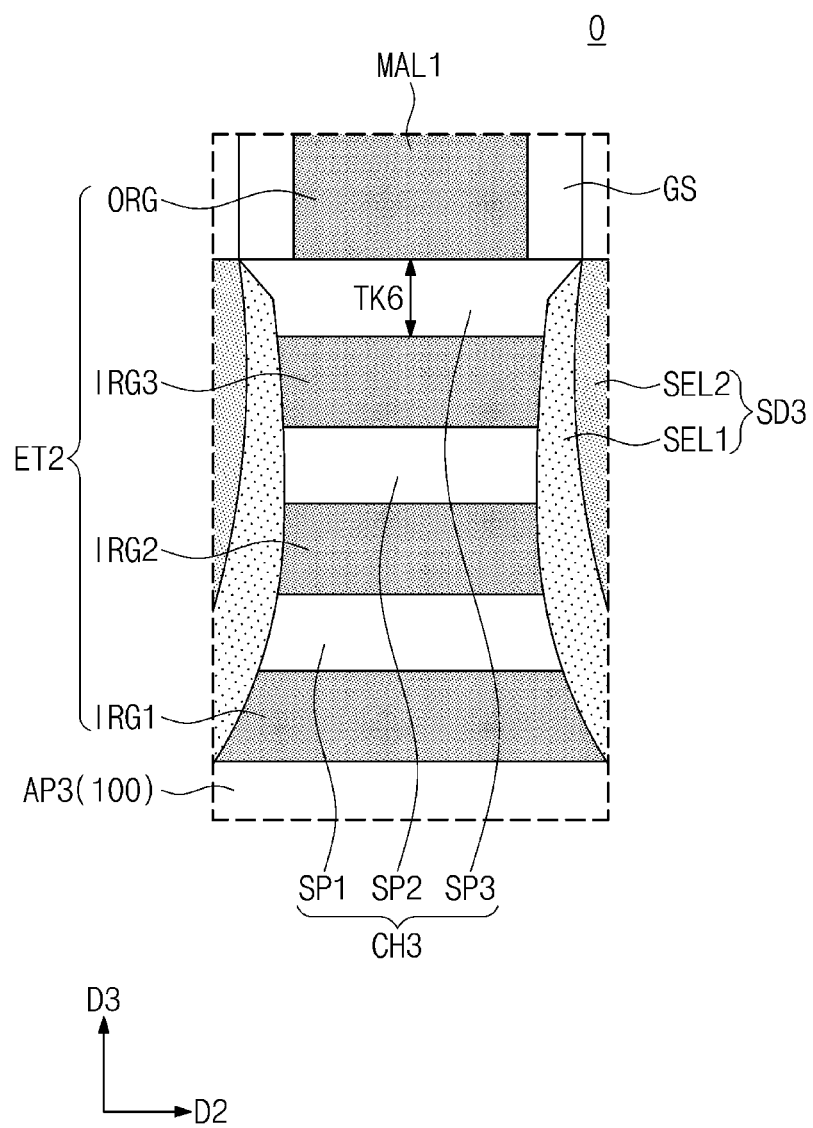
Figure 13D:
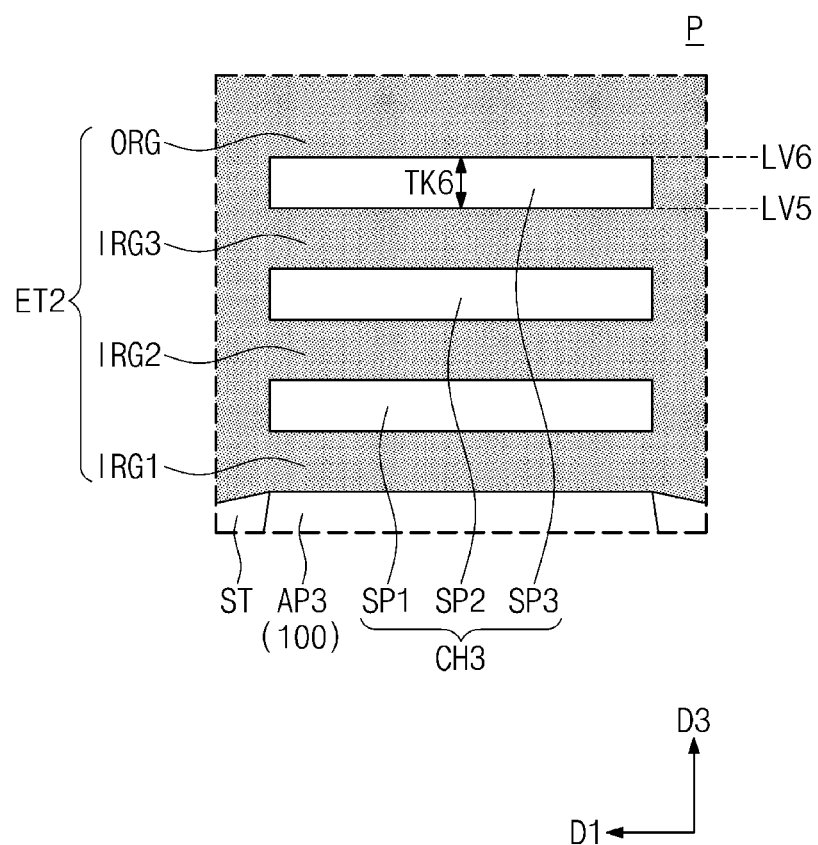
Figure 14:
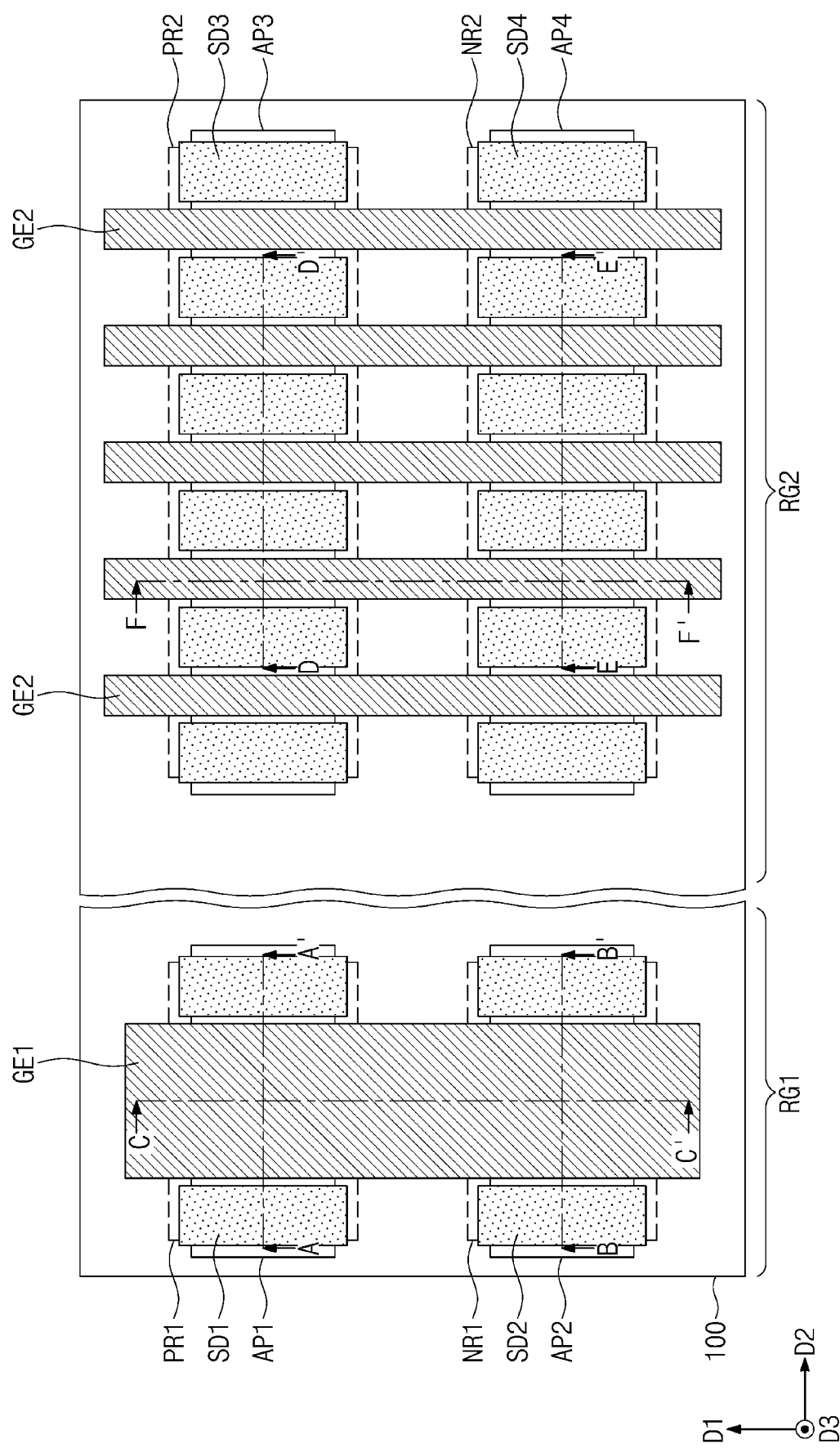

FIGS. 13A to 13D illustrate cross-sectional views showing a method of forming first to third semiconductor patterns according to embodiments. In detail, FIG. 13A illustrates an enlarged cross-sectional view showing section M of FIG. 12A. FIG. 13B illustrates an enlarged cross-sectional view showing section N of FIG. 12C. FIG. 13C illustrates an enlarged cross-sectional view showing section O of FIG. 12D. FIG. 13D illustrates an enlarged cross-sectional view showing section P of FIG. 12F.

Referring to FIGS. 13A to 13D, a first mask layer MAL1 may be formed on a resultant structure of FIGS. 11 and 12A to 12F. The first mask layer MAL1 may be formed in the second empty space ET2 on the second region RG2. For example, the first mask layer MAL1 may be formed on the second region RG2 and expose the first region RG1. The first, second and third semiconductor patterns SP1, SP2 and SP3 on the first region RG1 may be exposed through the first empty space ET1.

A trimming process may be performed on the first, second and third semiconductor patterns SP1, SP2 and SP3 on the exposed first region RG1. The trimming process may be an etching process that selectively etches the first, second and third semiconductor patterns SP1, SP2 and SP3. The trimming process may partially remove upper and lower portions of each of the first, second and third semiconductor patterns SP1, SP2 and SP3. A first thickness TK1 may be given as a thickness of each of the first, second and third semiconductor patterns SP1, SP2 and SP3 included in the first channel pattern CH1. A sixth thickness TK6 may be given as a thickness of each of the first, second and third semiconductor patterns SP1, SP2 and SP3 included in the third channel pattern CH3. The first thickness TK1 may be less than the sixth thickness TK6.

The third semiconductor pattern SP3 of the first channel pattern CH1 may have a bottom surface at a first level LV1. The third semiconductor pattern SP3 of the first channel pattern CH1 may have a top surface at a second level LV2. The third semiconductor pattern SP3 of the third channel pattern CH3 may have a bottom surface at a fifth level LV5. The third semiconductor pattern SP3 of the third channel pattern CH3 may have a top surface at a sixth level LV6. The first level LV1 may be positioned higher than the fifth level LV5. The second level LV2 may be positioned lower than the sixth level LV6. The trimming process may cause the outer region ORG on the first region RG1 to have a bottom surface located at a lower level than that of a bottom surface GSb of the gate spacer GS.

Referring to FIGS. 14 and 15A to 15F, first and second gate dielectric layers GI1 and GI2 may be formed respectively in the first and second empty spaces ET1 and ET2. The first gate dielectric layer GI1 may be formed in the first empty space ET1, and may surround the first, second and third semiconductor patterns SP1, SP2 and SP3. The second gate dielectric layer GI2 may be formed in the second empty space ET2, and may surround the first, second and third semiconductor patterns SP1, SP2, and SP3.

First and second gate electrodes GE1 and GE2 may be formed respectively in the first and second empty spaces ET1 and ET2. The first gate electrode GE1 may include first, second and third parts PO1, PO2 and PO3 that fill the first, second and third inner regions IRG1, IRG2, and IRG3 of the first empty space ET1, and may also include a fourth part PO4 that fills the outer region ORG of the first empty space ET1. The second gate electrode GE2 may include first, second and third parts PO1, PO2 and PO3 that fill the first, second and third inner regions IRG1, IRG2, and IRG3 of the second empty space ET2, and may also include a fourth part PO4 that fills the outer region ORG of the second empty space ET2. A gate capping pattern GP may be formed on each of the first and second gate electrodes GE1 and GE2.

Referring back to FIGS. 1 and 2A to 2H, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first, second, third, and fourth source/drain patterns SD1, SD2, SD3, and SD4. Gate contacts GC may be formed to penetrate the second interlayer dielectric layer 120 and the gate capping pattern GP and to have electrical connection with the first and second gate electrodes GE1 and GE2.

A third interlayer dielectric layer 130 may be formed on the second interlayer dielectric layer 120. A first metal layer M1 may be formed in the third interlayer dielectric layer 130. The formation of the first metal layer M1 may include forming first lines IL1. A fourth interlayer dielectric layer 140 may be formed on the first metal layer M1. A second metal layer M2 may be formed in the fourth interlayer dielectric layer 140. The formation of the second metal layer M2 may include forming second lines IL2.

According to embodiments, an EUV lithography process may be employed to form the first lines IL1 and/or the second lines IL2 in the first metal layer M1 and/or the second metal layer M2. A detailed description of the EUV lithography process used in back-end-of-line (BEOL) processes may be substantially the same as that used for forming the first and second sacrificial patterns PP1 and PP2. For example, a distance equal to or less than about 45 nm may be given as a minimum pitch between the first lines IL1 formed by the EUV lithography process of the present embodiment.

Figure 16A:
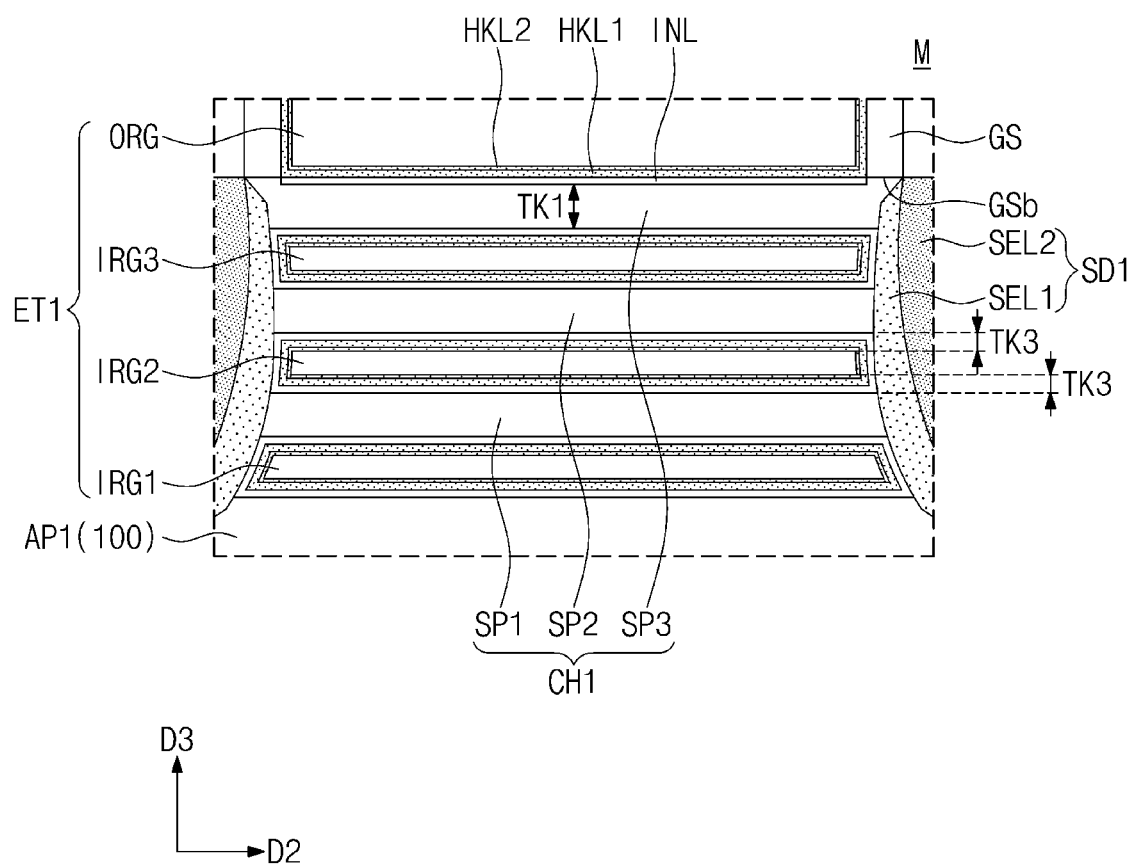
FIGS. 16A to 17D illustrate cross-sectional views showing a method of forming first and second gate dielectric layers according to embodiments.
Figure 16B:
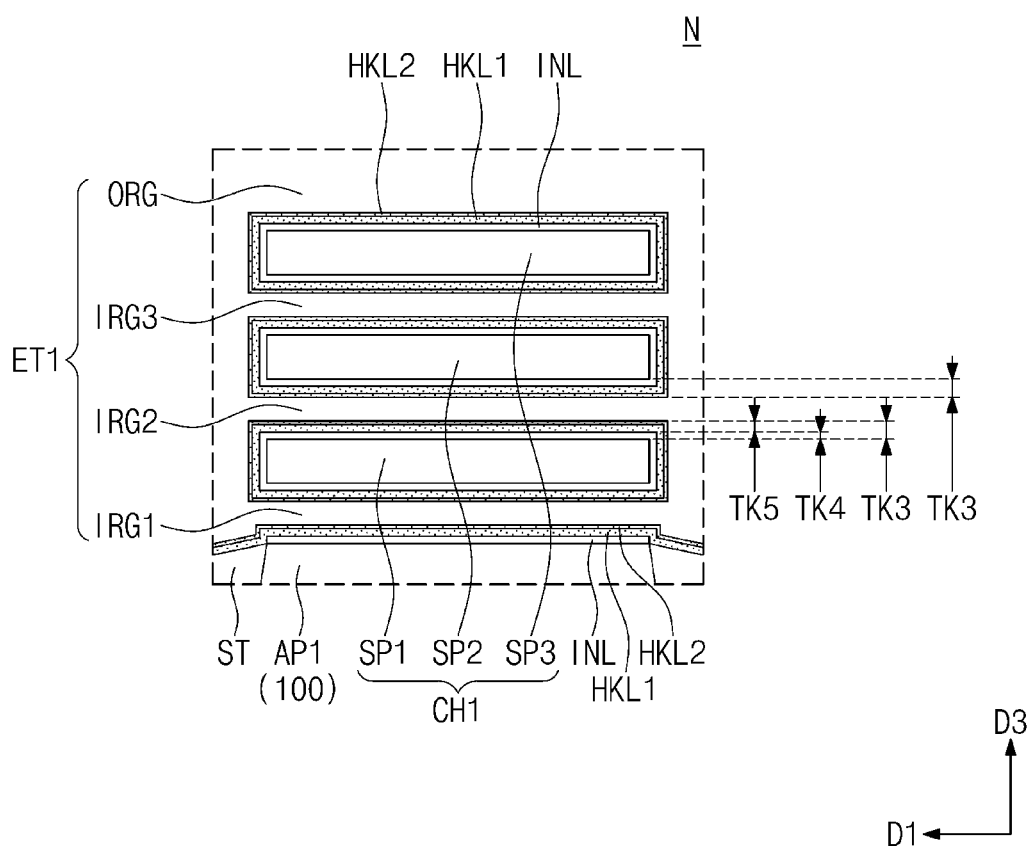
Figure 16C:
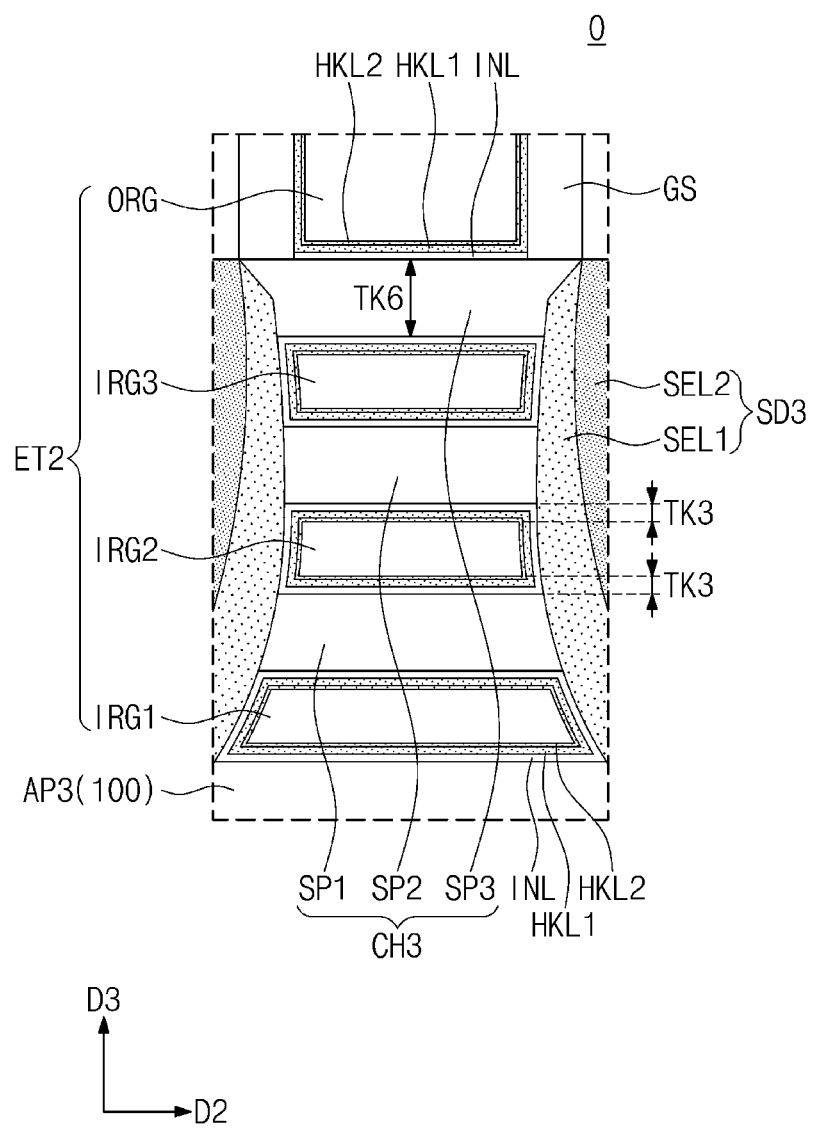
Figure 16D:
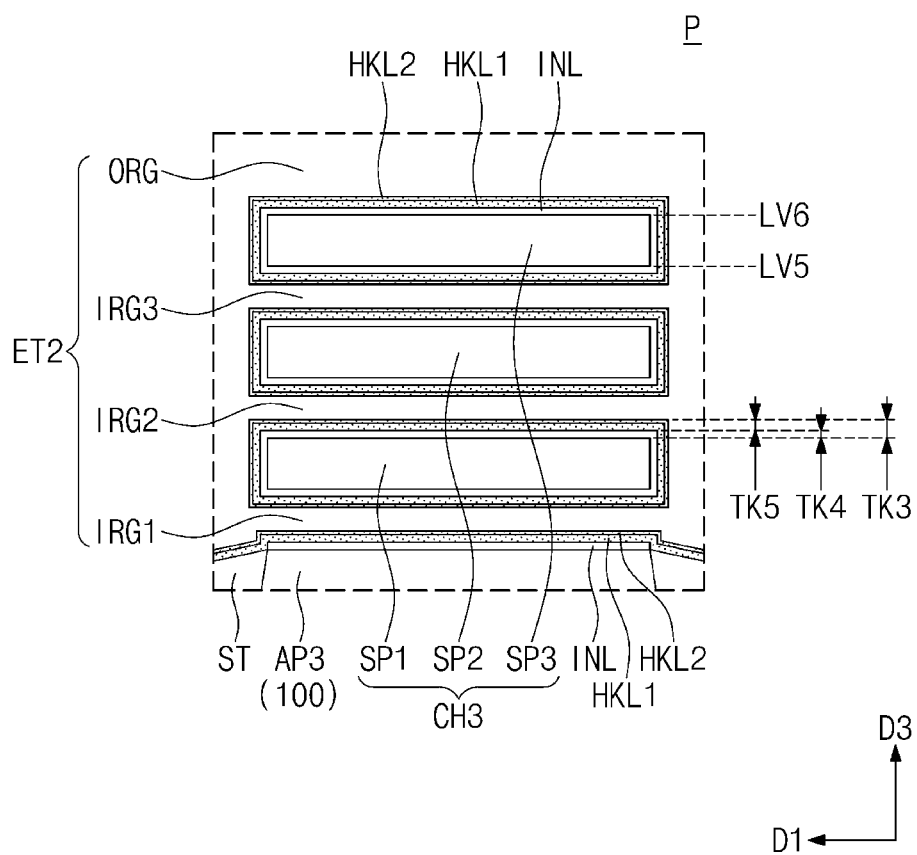
Figure 17A:
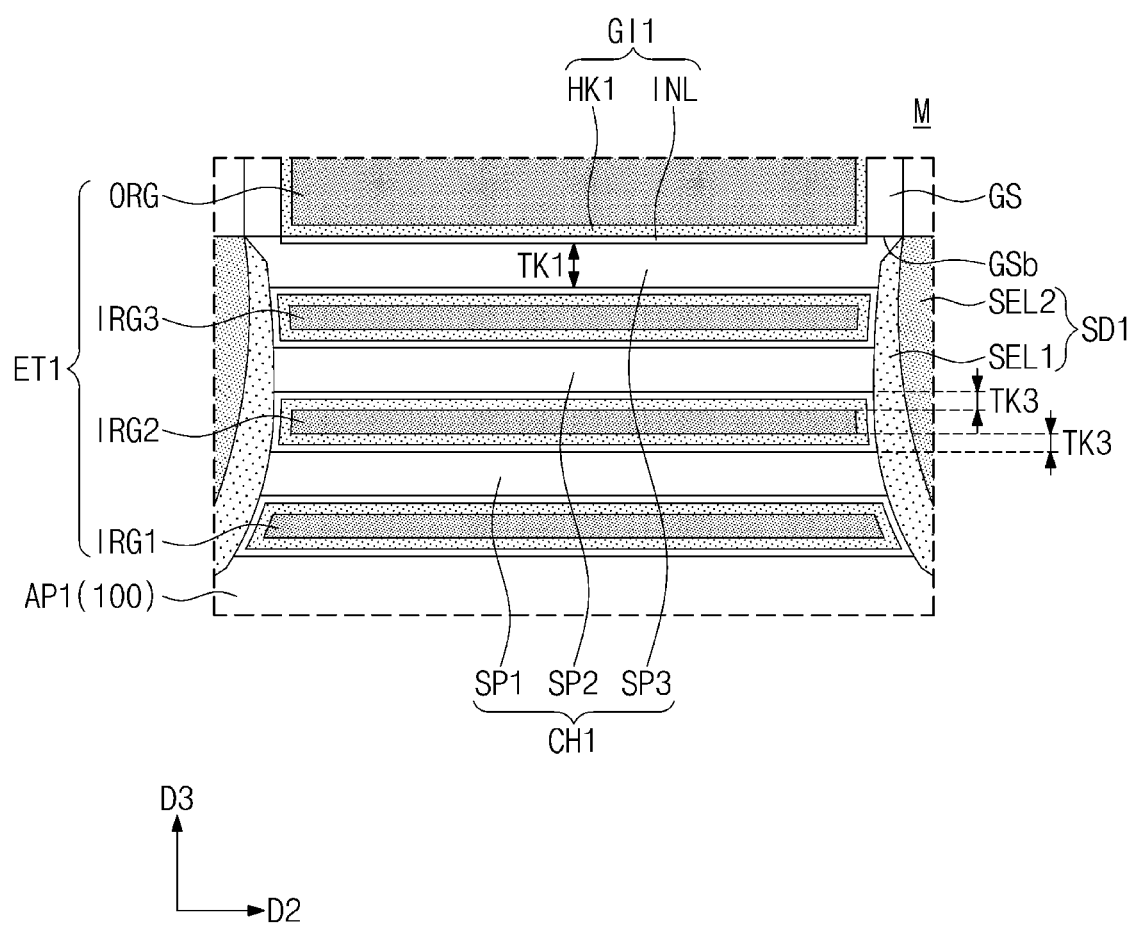
Figure 17B:
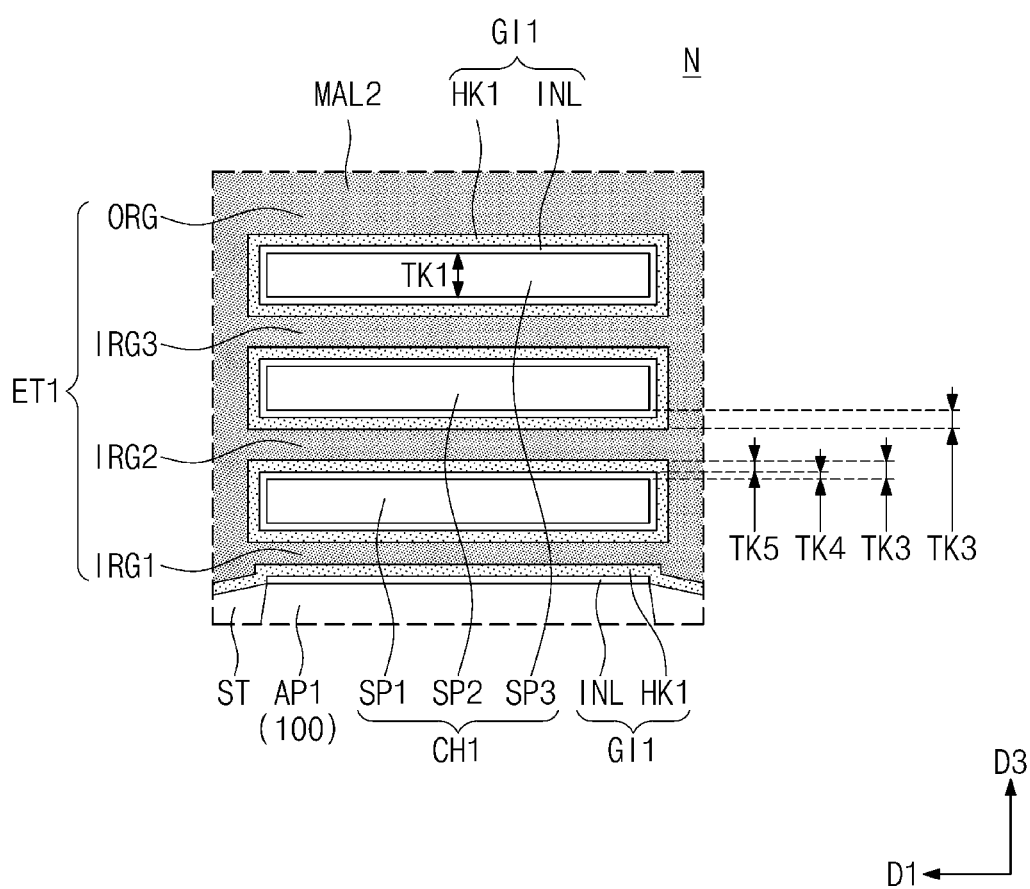
Figure 17C:
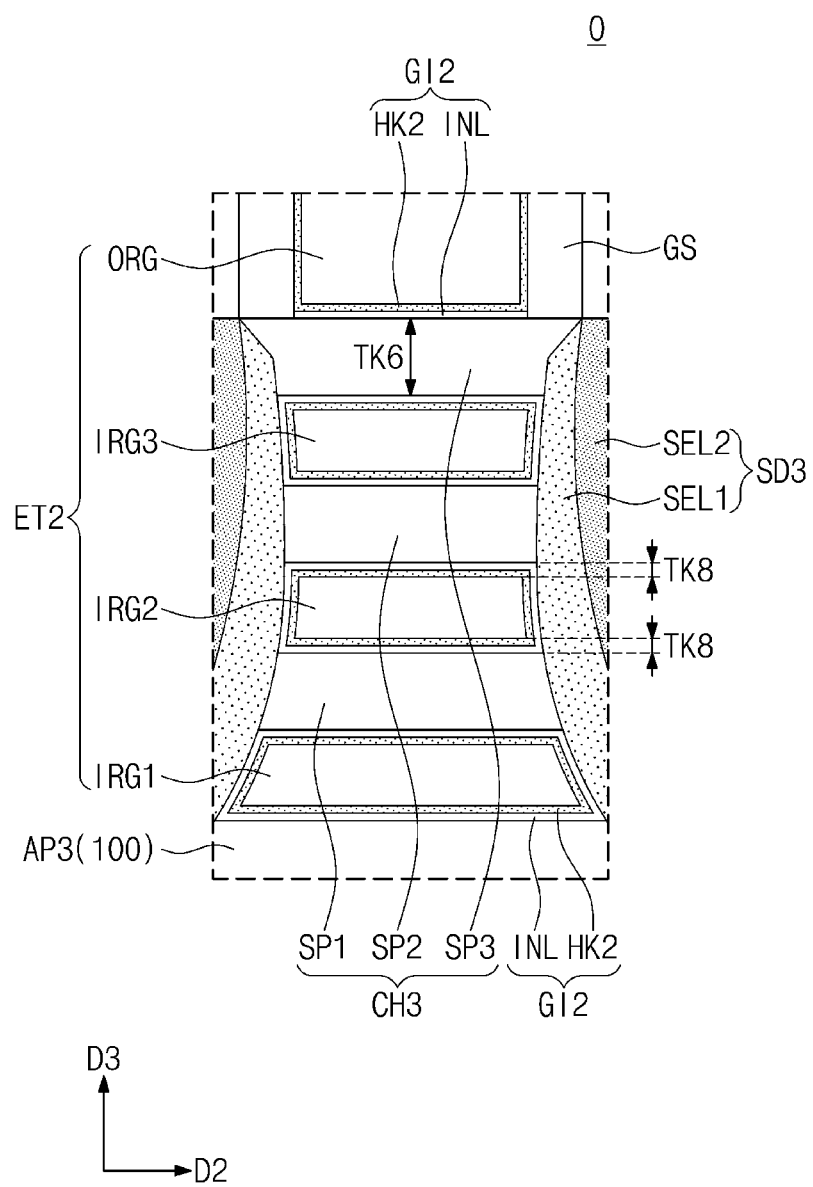
Figure 17D:
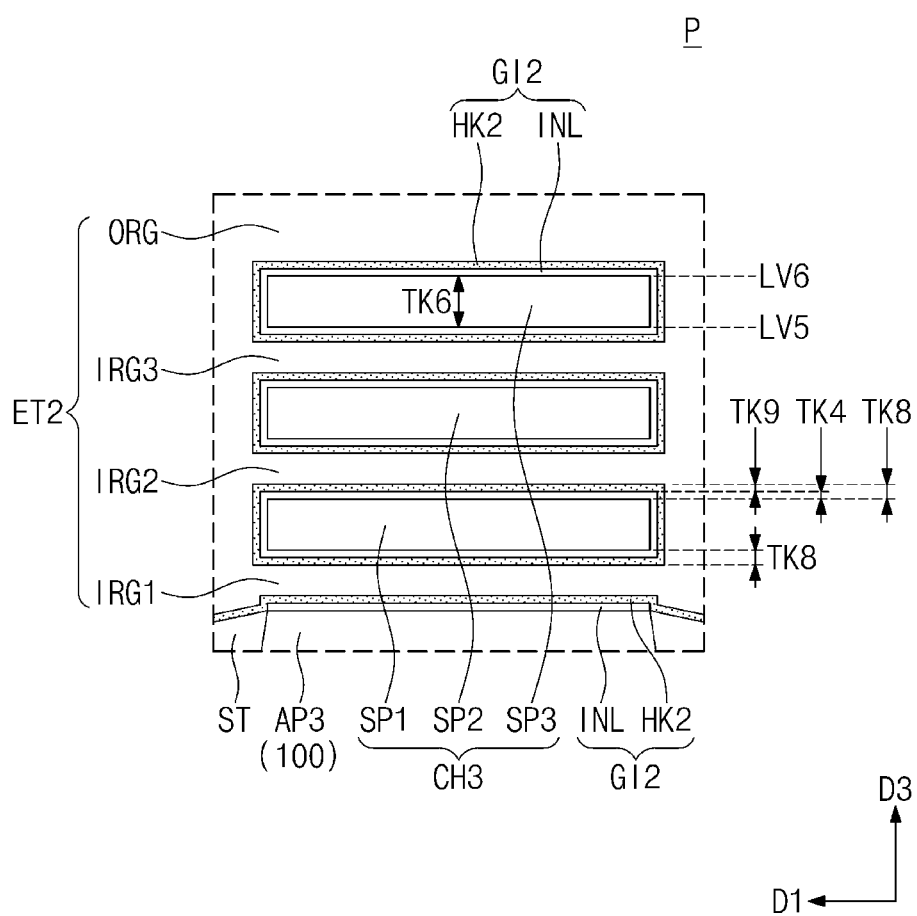

FIGS. 16A to 17D illustrate cross-sectional views showing a method of forming first and second gate dielectric layers, according to embodiments. In detail, FIGS. 16A and 17A illustrate cross-sectional views showing a method of forming section M of FIG. 15A. FIGS. 16B and 17B illustrate cross-sectional views showing a method of forming section N of FIG. 15C. FIGS. 16C and 17C illustrate cross-sectional views showing a method of forming section O of FIG. 15D. FIGS. 16D and 17D illustrate cross-sectional views showing a method of forming section P of FIG. 15F.

Referring to FIGS. 16A to 16D, an interface layer INL, a first high-k dielectric part HKL1, and a second high-k dielectric part HKL2 may be sequentially formed on a resultant structure of FIGS. 13A to 13D. For example, the interface layer INL, the first high-k dielectric part HKL1, and the second high-k dielectric part HKL2 may be formed on all of the first and second regions RG1 and RG2.

The interface layer INL may be formed by performing an oxidation or deposition process on exposed semiconductor materials (e.g., the first to third semiconductor patterns SP1 to SP3 and the first to fourth source/drain patterns SD1 to SD4). The formation of the interface layer INL may include performing one of chemical oxidation, $O_3$ oxidation, millisecond oxidation, and atomic layer deposition (ALD). The interface layer INL may include a silicon oxide layer.

The first high-k dielectric part HKL1 may be formed on the interface layer INL. The first high-k dielectric part HKL1 may be conformally formed by using a deposition process, such as atomic layer deposition (ALD) or chemical vapor deposition (CVD). The first high-k dielectric part HKL1 may include a high-k dielectric material. For example, the first high-k dielectric part HKL1 may include hafnium oxide.

Although not shown, a dipole-containing layer may be formed on the first high-k dielectric part HKL1. The dipole-containing layer may be formed having an extremely small thickness less than of about 1 nm on the first high-k dielectric part HKL1. The dipole-containing layer may be annealed to allow a dipole element to diffuse from the dipole-containing layer into the interface layer INL and the first high-k dielectric part HKL1. The dipole-containing layer may be formed as needed and may be omitted.

The second high-k dielectric part HKL2 may be formed on the first high-k dielectric part HKL1. The second high-k dielectric part HKL2 may be conformally formed by using a deposition process, such as atomic layer deposition (ALD) or chemical vapor deposition (CVD). The second high-k dielectric part HKL2 may include the same material as that of the first high-k dielectric part HKL1. Therefore, differently from that shown, an invisible interface may be provided between the first high-k dielectric part HKL1 and the second high-k dielectric part HKL2. Alternatively, the second high-k dielectric part HKL2 may include a high-k dielectric material different from that of the first high-k dielectric part HKL1.

The interface layer INL may have a fourth thickness TK4. A fifth thickness TK5 may be given as a sum of thicknesses of the first high-k dielectric part HKL1 and the second high-k dielectric part HKL2. A third thickness TK3 may be given as a sum of thicknesses of the interface layer INL, the first high-k dielectric part HKL1, and the second high-k dielectric part HKL2. The third thickness TK3 may be a sum of the fourth thickness TK4 and the fifth thickness TK5.

The interface layer INL, the first high-k dielectric part HKL1, and the second high-k dielectric part HKL2 may partially fill the outer region ORG and the first to third inner regions IRG1 to IRG3 of each of the first and second empty spaces ET1 and ET2.

Referring to FIGS. 17A to 17D, a second mask layer MAL2 may be formed in the first empty space ET1 on the first region RG1. The second mask layer MAL2 may be formed on the first region RG1 and expose the second region RG2. Therefore, the second high-k dielectric part HKL2 formed on the second region RG2 may be exposed through the second empty space ET2 even after the formation of the second mask layer MAL2.

An etching process may be performed on the second high-k dielectric part HKL2 of FIGS. 16C and 16D on the exposed second region RG2. For example, the etching process may be a wet etching process that selectively etches the second high-k dielectric part HKL2 of FIGS. 16C and 16D. After the etching process is terminated, the second mask layer MAL2 of FIGS. 17A and 17B may be removed.

The first gate dielectric layer GI1 and the second gate dielectric layer GI2 may be eventually formed in the etching process. The first gate dielectric layer GI1 of FIGS. 17A and 17B may include an interface layer INL and a first high-k dielectric layer HK1. The first high-k dielectric part HKL1 and the second high-k dielectric part HKL2 of FIGS. 16A and 16B may form the first high-k dielectric layer HK1 of FIGS. 17A and 17B.

The second gate dielectric layer GI2 of FIGS. 17C and 17D may include an interface layer INL and a second high-k dielectric layer HK2. The first high-k dielectric part HKL1 of FIGS. 16C and 16D may form a second high-k dielectric layer HK2 of FIGS. 17C and 17D. Alternatively, the first high-k dielectric part HKL1 and a portion of the second high-k dielectric part HKL2 may form the second high-k dielectric layer HK2 of FIGS. 17C and 17D.

The first gate dielectric layer GI1 may have a third thickness TK3. The interface layer INL may have a fourth thickness TK4, and the first high-k dielectric layer HK1 may have a fifth thickness TK5. The third thickness TK3 may be a sum of the fourth thickness TK4 and the fifth thickness TK5. The second gate dielectric layer GI2 may have an eighth thickness TK8. The second high-k dielectric layer HK2 may be a ninth thickness TK9. The eighth thickness TK8 may be a sum of the fourth thickness TK4 and the ninth thickness TK9. The fifth thickness TK5 may be greater than the ninth thickness TK9. The third thickness TK3 may be greater than the eighth thickness TK8.

Figure 18A:
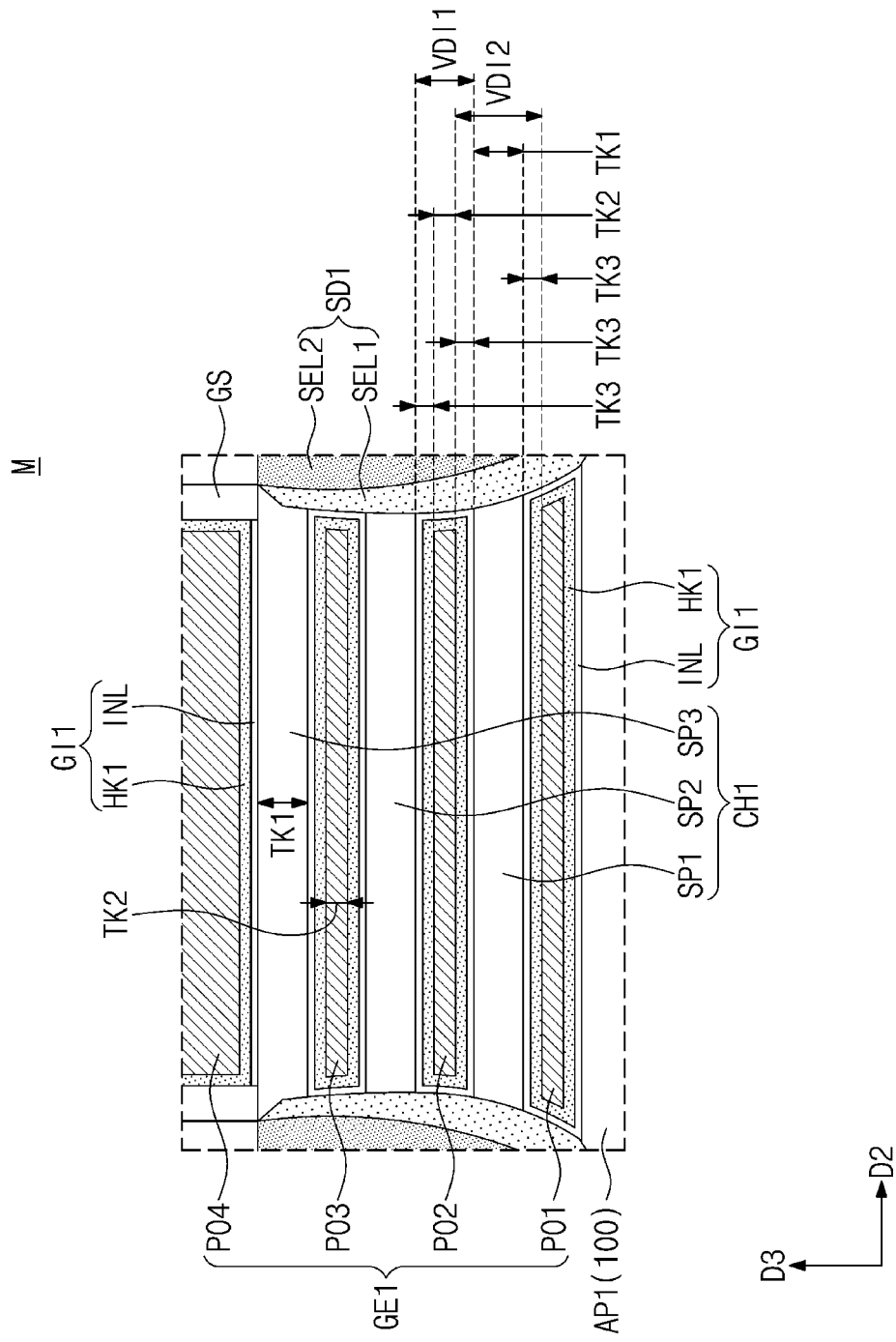
FIGS. 18A to 18D illustrate cross-sectional views showing a semiconductor device according to embodiments.
Figure 18B:
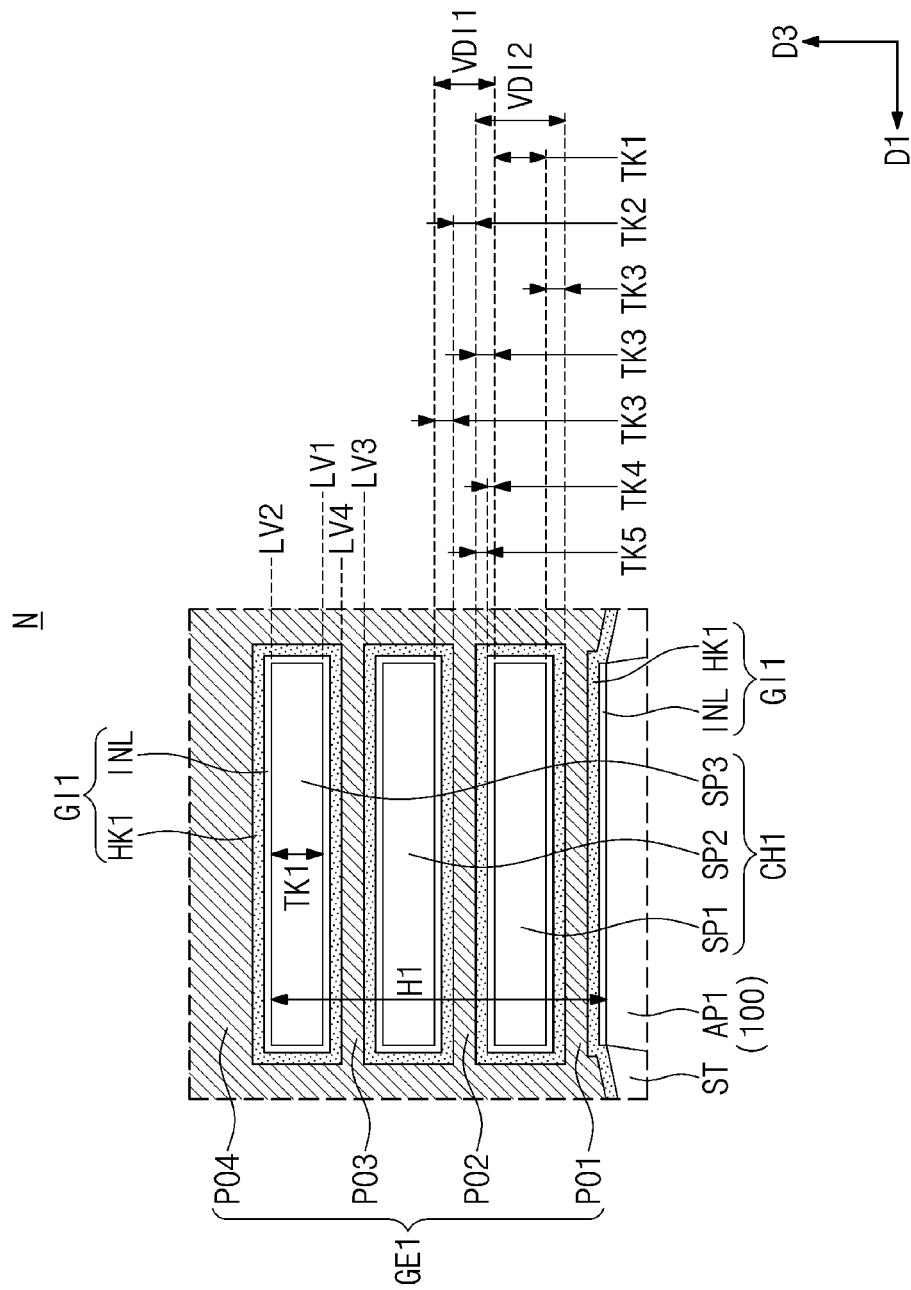
Figure 18C:
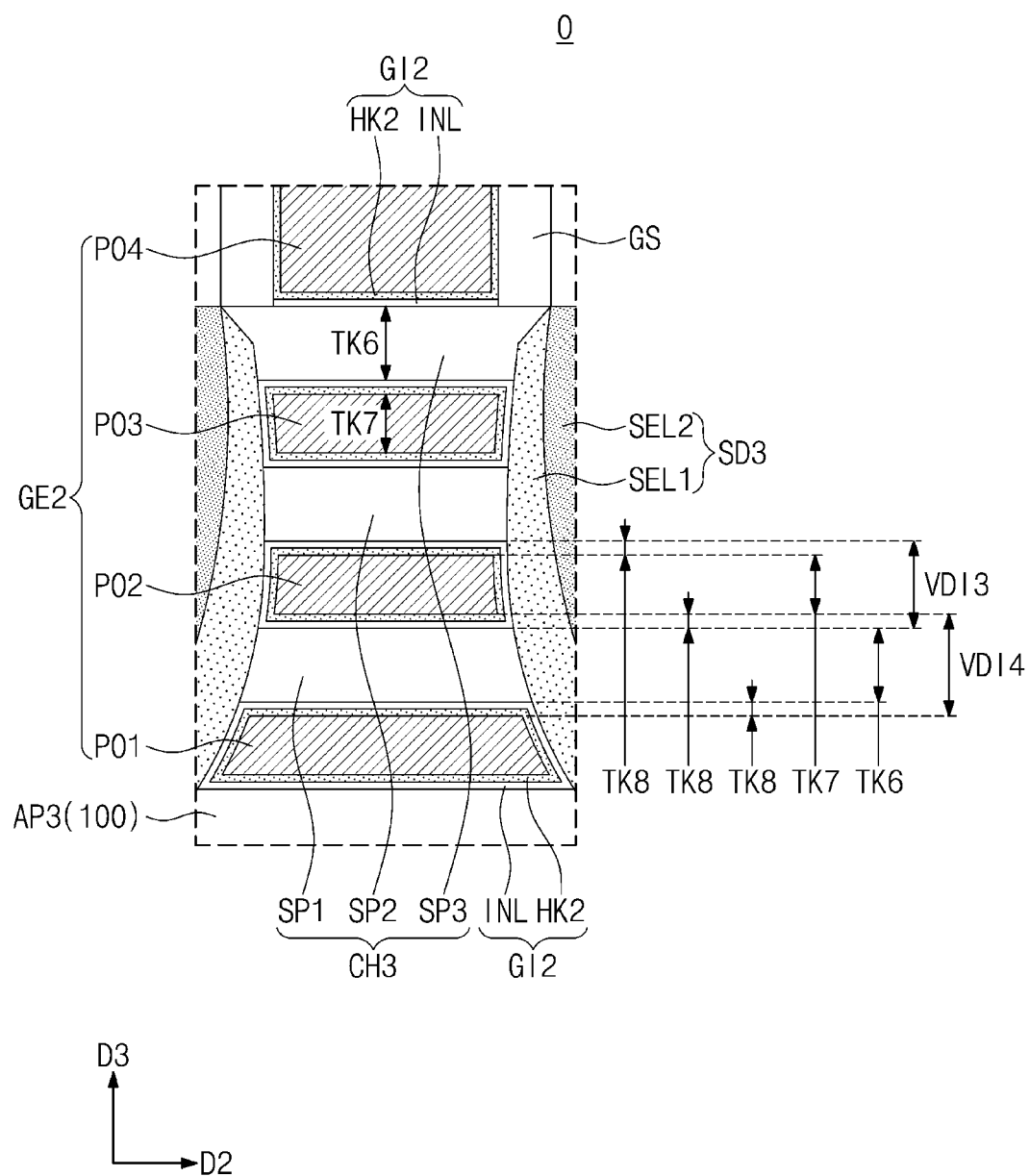
Figure 18D:
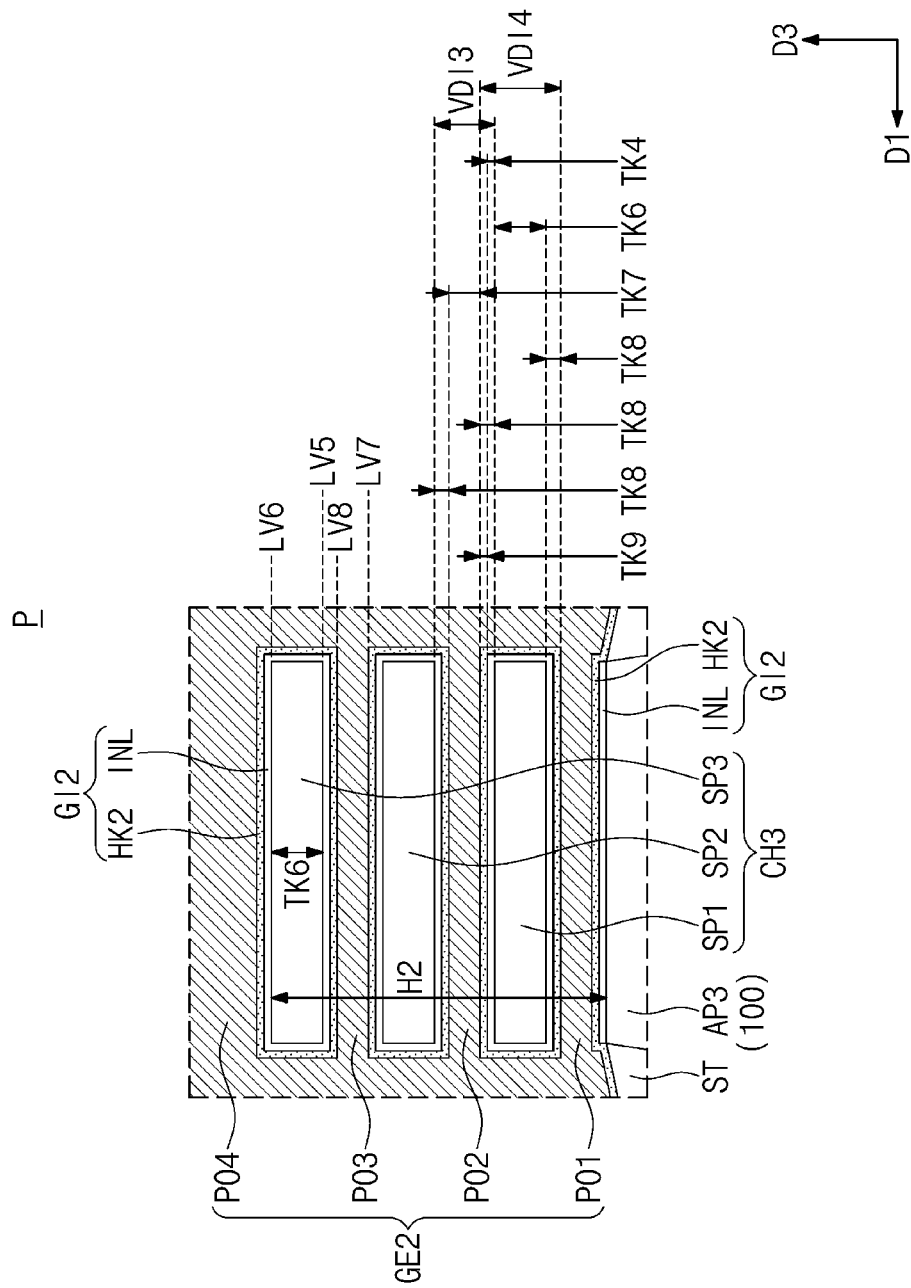

FIGS. 18A to 18D illustrate cross-sectional views showing a semiconductor device, according to embodiments. FIG. 18A illustrates an enlarged cross-sectional view showing section M of FIG. 2A. FIG. 18B illustrates an enlarged cross-sectional view showing section N of FIG. 2C. FIG. 18C illustrates an enlarged cross-sectional view showing section O of FIG. 2E. FIG. 18D illustrates an enlarged cross-sectional view showing section P of FIG. 2G. In the embodiment that follows, a discussion of features repetitive to those of FIGS. 1, 2A to 2H, and 3A to 3D is omitted, and a difference thereof will be explained in detail.

Referring to FIGS. 18A to 18D, the first thickness TK1 and the sixth thickness TK6 may be substantially the same as each other. For example, a ratio of the sixth thickness TK6 to the first thickness TK1 may range from about 0.9 to about 1.1. The second thickness TK2 may be less than the seventh thickness TK7.

The first vertical distance VDI1 and the third vertical distance VDI3 may be substantially the same as each other. For example, a ratio of the third vertical distance VDI3 to the first vertical distance VDI1 may range from about 0.9 to about 1.1. The second vertical distance VDI2 may be greater than the fourth vertical distance VDI4.

The first level LV1 may be positioned substantially the same as the fifth level LV5. The second level LV2 may be positioned substantially the same as the sixth level LV6. The third level LV3 may be positioned higher than the seventh level LV7. The fourth level LV4 may be positioned lower than the eighth level LV8. The description of the levels may also be identically applicable to the first and second semiconductor patterns SP1 and SP2 of the first channel pattern CH1 and to the first and second semiconductor patterns SP1 and SP2 of the third channel pattern CH3. In addition, the description of the levels may also be identically applicable to the first and second parts PO1 and PO2 of the first gate electrode GE1 and to the first and second parts PO1 and PO2 of the second gate electrode GE2. The first distance H1 may be substantially the same as the second distance H2.

According to embodiments, the first vertical distance VDI1 and the third vertical distance VDI3 may be formed to be the same without performing the trimming process. The first gate dielectric layer GI1 of the extra gate device may be formed thicker than the second gate dielectric layer GI2 of the single gate device, and thus a high breakdown voltage may be achieved and at the same time the first, second and third parts PO1, PO2 and PO3 of the first gate electrode GE1 may be formed to each have a thickness less than that of each of the first, second and third parts PO1, PO2 and PO3 of the second gate electrode GE2. Therefore, even though the first gate dielectric layer GI1 has an increased thickness, it may not be required to increase a height of the first channel pattern CH1. Accordingly, there may be a reduction in parasitic capacitance between the active contact AC and the first gate electrode GE1. As a result, a semiconductor device may improve in reliability and electrical properties.

A semiconductor device according to the present inventive concepts may be configured such that first to third semiconductor patterns on a first region may each have a thickness less than that of each of first to third semiconductor patterns on a second region. Therefore, a first gate dielectric layer of an EG device may be formed thicker than a second gate dielectric layer of an SG device, and thus a high breakdown voltage may be achieved and at the same time first to third parts of a first gate electrode may be formed to each have a thickness substantially the same as that of each of first to third parts of a second gate electrode. It may thus be possible to easily control a threshold voltage of the extra gate device and a threshold voltage of the single gate device. In addition, each of the first, second and third semiconductor patterns on the first region may be formed to have a small thickness, and thus the first channel pattern may also be formed to have a small height. Accordingly, there may be a reduction in parasitic capacitance between an active contact and the first gate electrode. As a result, a semiconductor device may improve in reliability and electrical properties.

Although the present inventive concepts have been described in connection with the some example embodiments illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device comprising:
   a substrate that comprises a first region and a second region;
   a first active pattern in the first region, and a second active pattern in the second region;
   first source/drain patterns on the first active pattern, and a first channel pattern between the first source/drain patterns, the first channel pattern comprising a plurality of first semiconductor patterns that are stacked and spaced apart from each other;
   second source/drain patterns on the second active pattern, and a second channel pattern between the second source/drain patterns, the second channel pattern comprising a plurality of second semiconductor patterns that are stacked and spaced apart from each other;
   a first gate electrode on the first channel pattern, and a second gate electrode on the second channel pattern; and
   a first gate dielectric layer between the first channel pattern and the first gate electrode, and a second gate dielectric layer between the second channel pattern and the second gate electrode,
   wherein the first gate dielectric layer comprises a first interface layer and a first high-k dielectric layer,
   wherein the second gate dielectric layer comprises a second interface layer and a second high-k dielectric layer,
   wherein a thickness of the first high-k dielectric layer is greater than a thickness of the second high-k dielectric layer,
   wherein the first interface layer comprises a dielectric material and the second interface layer comprises a dielectric material, and
   wherein an entire thickness of each of the first semiconductor patterns is less than an entire thickness of each of the second semiconductor patterns.

2. The semiconductor device of claim 1, wherein a width of the first gate electrode is greater than a width of the second gate electrode in a channel length direction.

3. The semiconductor device of claim 1, wherein a thickness of the first interface layer is substantially the same as a thickness of the second interface layer.

4. The semiconductor device of claim 1, wherein the first gate electrode comprises a plurality of first parts between the first semiconductor patterns that are vertically adjacent to each other,
   wherein the second gate electrode comprises a plurality of second parts between the second semiconductor patterns that are vertically adjacent to each other, and
   wherein a thickness of each of the first parts is substantially the same as a thickness of each of the second parts.

5. The semiconductor device of claim 4, wherein a top surface of an uppermost one of the first parts is at a level substantially the same as a level of a top surface of an uppermost one of the second parts.

6. The semiconductor device of claim 4, wherein a vertical distance between the first parts that are adjacent to each other is substantially the same as a vertical distance between the second parts that are adjacent to each other.

7. The semiconductor device of claim 1, wherein a top surface of an uppermost one of the first semiconductor patterns is at a level lower than a level of a top surface of an uppermost one of the second semiconductor patterns.

8. The semiconductor device of claim 1, wherein a bottom surface of an uppermost one of the first semiconductor patterns is at a level higher than a level of a bottom surface of an uppermost one of the second semiconductor patterns.

9. The semiconductor device of claim 1, wherein a vertical distance between the first semiconductor patterns that are adjacent to each other is greater than a vertical distance between the second semiconductor patterns that are adjacent to each other.

10. The semiconductor device of claim 1, wherein the thickness of the first high-k dielectric layer is greater than a thickness of the first interface layer.

11. A semiconductor device, comprising:
    a substrate that includes a first region and a second region;
    a first active pattern in the first region, and a second active pattern in the second region;
    first source/drain patterns on the first active pattern, and a first channel pattern between the first source/drain patterns, the first channel pattern comprising a plurality of first semiconductor patterns that are stacked and spaced apart from each other;
    a pair of second source/drain patterns on the second active pattern, and a second channel pattern between the pair of second source/drain patterns, the second channel pattern comprising a plurality of second semiconductor patterns that are stacked and spaced apart from each other; and
    a first gate electrode on the first channel pattern, and a second gate electrode on the second channel pattern,
    wherein a width of the first gate electrode is greater than a width of the second gate electrode in a channel length direction, and
    wherein an entire thickness of each of the first semiconductor patterns is less than an entire thickness of each of the second semiconductor patterns,
    wherein the first gate electrode comprises a plurality of first parts between the first semiconductor patterns that are vertically adjacent to each other,
    wherein the second gate electrode comprises a plurality of second parts between the second semiconductor patterns that are vertically adjacent to each other, and
    wherein a ratio of a thickness of each of the second parts to a thickness of each of the first parts is in a range of 0.9 to 1.1.

12. The semiconductor device of claim 11, further comprising:
    a first gate dielectric layer between the first channel pattern and the first gate electrode; and a second gate dielectric layer between the second channel pattern and the second gate electrode, wherein the first gate dielectric layer comprises a first interface layer and a first high-k dielectric layer that are sequentially stacked, wherein the second gate dielectric layer comprises a second interface layer and a second high-k dielectric layer that are sequentially stacked, and wherein a thickness of the first high-k dielectric layer is greater than a thickness of the second high-k dielectric layer.

13. The semiconductor device of claim 12, wherein a thickness of the first interface layer is substantially the same as a thickness of the second interface layer.

14. The semiconductor device of claim 11, wherein a distance between the first active pattern and a top surface of an uppermost one of the first semiconductor patterns is less than a distance between the second active pattern and a top surface of an uppermost one of the second semiconductor patterns.

15. The semiconductor device of claim 11, wherein a vertical distance between the first parts that are adjacent to each other is substantially the same as a vertical distance between the second parts that are adjacent to each other.

16. A semiconductor device, comprising:
a substrate that includes a first region and a second region;
a first active pattern in the first region, and a second active pattern in the second region;
first source/drain patterns on the first active pattern, and a first channel pattern between the first source/drain patterns, the first channel pattern comprising a plurality of first semiconductor patterns that are stacked and spaced apart from each other;
second source/drain patterns on the second active pattern, and a second channel pattern between the second source/drain patterns, the second channel pattern comprising a plurality of second semiconductor patterns that are stacked and spaced apart from each other;
a first gate electrode on the first channel pattern, and a second gate electrode on the second channel pattern, a width of the first gate electrode being greater than a width of the second gate electrode in a channel length direction;
a first gate dielectric layer between the first channel pattern and the first gate electrode, and a second gate dielectric layer between the second channel pattern and the second gate electrode,
wherein the first gate dielectric layer surrounds each of the first semiconductor patterns of the first channel pattern, and the second gate dielectric layer surrounds each of the second semiconductor patterns of the second channel pattern;
a plurality of gate spacers on opposite sides of each of the first and second gate electrodes;
a gate capping pattern on each of the first and second gate electrodes;
an active contact coupled to one of the first and second source/drain patterns;
a gate contact coupled to one of the first and second gate electrodes;
a first metal layer on the active contact and the gate contact, the first metal layer including a plurality of first lines that are electrically connected to the active contact and the gate contact; and
a second metal layer on the first metal layer,
wherein the first gate dielectric layer comprises a first interface layer and a first high-k dielectric layer,
wherein the second gate dielectric layer comprises a second interface layer and a second high-k dielectric layer,
wherein the first interface layer comprises a dielectric material and the second interface layer comprises a dielectric material,
wherein a thickness of the first high-k dielectric layer is greater than a thickness of the second high-k dielectric layer, and
wherein an entire thickness of each of the first semiconductor patterns is less than an entire thickness of each of the second semiconductor patterns.

17. The semiconductor device of claim 16, wherein the first gate electrode comprises a plurality of first parts between the first semiconductor patterns that are vertically adjacent to each other, wherein the second gate electrode comprises a plurality of second parts between the second semiconductor patterns that are vertically adjacent to each other, and wherein a thickness of each of the first parts is substantially the same as a thickness of each of the second parts.

18. The semiconductor device of claim 16, wherein a top surface of an uppermost one of the first semiconductor patterns is at a level lower than a level of a top surface of an uppermost one of the second semiconductor patterns, and wherein a bottom surface of the uppermost one of the first semiconductor patterns is at a level higher than a level of a bottom surface of the uppermost of the second semiconductor patterns.

19. The semiconductor device of claim 16, wherein a thickness of the first interface layer is substantially the same as a thickness of the second interface layer.

20. The semiconductor device of claim 16, wherein the first region is an area where an extra gate device is provided, and wherein the second region is an area where a single gate device is provided.

* * * * *